United States Patent
Oliver et al.

(10) Patent No.: US 10,134,972 B2
(45) Date of Patent: Nov. 20, 2018

(54) QUBIT AND COUPLER CIRCUIT STRUCTURES AND COUPLING TECHNIQUES

(71) Applicant: Massachusetts Institute of Technology, Cambridge, MA (US)

(72) Inventors: William D. Oliver, Arlington, MA (US); Andrew J. Kerman, Arlington, MA (US); Rabindra N. Das, Lexington, MA (US); Donna-Ruth W. Yost, Acton, MA (US); Danna Rosenberg, Arlington, MA (US); Mark A. Gouker, Belmont, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 53 days.

(21) Appl. No.: 15/342,589

(22) Filed: Nov. 3, 2016

(65) Prior Publication Data
US 2018/0013052 A1    Jan. 11, 2018

Related U.S. Application Data

(63) Continuation-in-part of application No. PCT/US2016/043266, filed on Jul. 21, 2016.
(Continued)

(51) Int. Cl.
*H01L 39/22* (2006.01)
*G06N 99/00* (2010.01)
(Continued)

(52) U.S. Cl.
CPC ......... *H01L 39/223* (2013.01); *G06N 99/002* (2013.01); *H01L 25/0657* (2013.01);
(Continued)

(58) Field of Classification Search
CPC ....... H01L 39/02; H01L 39/025; H01L 39/04; H01L 39/045; H01L 39/06; H01L 39/10;
(Continued)

(56) References Cited

U.S. PATENT DOCUMENTS

| 4,316,200 A | 2/1982 | Ames et al. |
| 4,612,083 A | 9/1986 | Yasumoto et al. |

(Continued)

FOREIGN PATENT DOCUMENTS

| WO | WO 2016/025451 A1 | 2/2016 |
| WO | WO 2016/025478 A1 | 2/2016 |

(Continued)

OTHER PUBLICATIONS

Ohya, et al.; "Room Temperature Deposition of Sputtered TiN Films for Superconducting Coplanar Waveguide Resonators;" IOP Publishing—Superconductor Science and Technology; vol. 27; Mar. 26, 2014; 10 pages.
(Continued)

*Primary Examiner* — Scott B Geyer
(74) *Attorney, Agent, or Firm* — Daly, Crowley, Mofford & Durkee, LLP

(57) ABSTRACT

A cryogenic quantum bit package with multiple qubit circuits facilitates inter-qubit signal propagation using a multi-chip module (MCM). Multiple qubits are grouped within the package into one or more qubit integrated circuits (ICs). The qubit ICs themselves are electrically coupled to each other via a structure including a superconducting MCM and superconducting interconnects. Coupling of quantum electrical signals between a qubit and other qubits, a substrate, or the MCM uses a coupler circuit, such as a Josephson junction, capacitor, inductor, or resonator.

21 Claims, 34 Drawing Sheets

Related U.S. Application Data

(60) Provisional application No. 62/251,248, filed on Nov. 5, 2015, provisional application No. 62/195,852, filed on Jul. 23, 2015.

(51) Int. Cl.
  *H01L 39/02* (2006.01)
  *H01L 25/065* (2006.01)
  *H01L 27/18* (2006.01)

(52) U.S. Cl.
  CPC ............ *H01L 27/18* (2013.01); *H01L 39/025* (2013.01); *H01L 2224/16225* (2013.01); *H01L 2924/15192* (2013.01)

(58) Field of Classification Search
  CPC ......... H01L 39/16; H01L 39/18; H01L 39/22; H01L 39/221; H01L 39/223; G06N 99/002
  See application file for complete search history.

(56) References Cited

U.S. PATENT DOCUMENTS

| | | |
|---|---|---|
| 5,057,877 A | 10/1991 | Briley et al. |
| 5,156,997 A | 10/1992 | Kumar et al. |
| 5,371,328 A | 12/1994 | Gutierrez et al. |
| 5,650,353 A | 7/1997 | Yoshizawa et al. |
| 5,773,875 A | 6/1998 | Chan |
| 6,108,214 A | 8/2000 | Fuse |
| 6,297,551 B1 | 10/2001 | Dudderar et al. |
| 6,324,755 B1 | 12/2001 | Borkowski et al. |
| 6,346,469 B1 | 2/2002 | Greer |
| 6,355,501 B1 | 3/2002 | Fung et al. |
| 6,396,371 B2 | 5/2002 | Streeter et al. |
| 6,436,740 B1 | 8/2002 | Jen et al. |
| 6,485,565 B1 | 11/2002 | Springer |
| 6,819,000 B2 | 11/2004 | Magerlein et al. |
| 6,825,534 B2 | 11/2004 | Chen et al. |
| 6,838,774 B2 | 1/2005 | Patti |
| 7,427,803 B2 | 9/2008 | Chao et al. |
| 7,589,390 B2 | 9/2009 | Yao |
| 7,624,088 B2 | 11/2009 | Johnson et al. |
| 7,932,515 B2 | 4/2011 | Bunyk |
| 7,939,926 B2 | 5/2011 | Kaskoun et al. |
| 8,202,785 B2 | 6/2012 | Castex et al. |
| 8,354,746 B2 | 1/2013 | Huang et al. |
| 8,466,036 B2 | 6/2013 | Brindle et al. |
| 8,487,444 B2 | 7/2013 | Law et al. |
| 8,492,911 B2 | 7/2013 | Bachman et al. |
| 8,519,543 B1 | 8/2013 | Song et al. |
| 8,546,188 B2 | 10/2013 | Liu et al. |
| 8,564,955 B2 | 10/2013 | Schmidt et al. |
| 8,736,068 B2 | 5/2014 | Bartley et al. |
| 8,754,321 B2 | 6/2014 | Schroeder et al. |
| 8,828,860 B2 | 9/2014 | Gruber et al. |
| 8,928,128 B2 | 1/2015 | Karikalan et al. |
| 8,954,125 B2 | 2/2015 | Corcoles Gonzalez et al. |
| 9,076,658 B1 | 7/2015 | Brown et al. |
| 9,171,792 B2 | 10/2015 | Sun et al. |
| 2001/0016383 A1 | 8/2001 | Chen et al. |
| 2002/0094661 A1 | 7/2002 | Enquist et al. |
| 2003/0067073 A1 | 4/2003 | Akram et al. |
| 2004/0124538 A1 | 7/2004 | Reif et al. |
| 2004/0188845 A1 | 9/2004 | Iguchi et al. |
| 2006/0191640 A1 | 8/2006 | Johnson |
| 2007/0087544 A1 | 4/2007 | Chang et al. |
| 2007/0119812 A1 | 5/2007 | Kerdiles et al. |
| 2007/0207592 A1 | 9/2007 | Lu et al. |
| 2008/0093747 A1 | 4/2008 | Enquist et al. |
| 2008/0122115 A1 | 5/2008 | Popa et al. |
| 2008/0169559 A1 | 7/2008 | Yang |
| 2008/0230916 A1 | 9/2008 | Saito et al. |
| 2008/0290790 A1 | 11/2008 | Jin |
| 2008/0316714 A1 | 12/2008 | Eichelberger et al. |
| 2009/0078966 A1 | 3/2009 | Asai et al. |
| 2009/0173936 A1 | 7/2009 | Bunyk |
| 2009/0186446 A1 | 7/2009 | Kwon et al. |
| 2009/0233436 A1 | 9/2009 | Kim et al. |
| 2010/0001399 A1 | 1/2010 | Topacio |
| 2010/0026447 A1* | 2/2010 | Keefe .............. B82Y 10/00 338/32 S |
| 2010/0122762 A1 | 5/2010 | George |
| 2010/0130016 A1 | 5/2010 | DeVilliers |
| 2010/0148371 A1 | 6/2010 | Kaskoun et al. |
| 2010/0171093 A1 | 7/2010 | Kabir |
| 2011/0049675 A1 | 3/2011 | Nagai et al. |
| 2011/0140271 A1 | 6/2011 | Daubenspeck et al. |
| 2011/0189820 A1 | 8/2011 | Sasaki et al. |
| 2011/0204505 A1 | 8/2011 | Pagaila et al. |
| 2011/0237069 A1 | 9/2011 | Miyazaki |
| 2011/0248396 A1 | 10/2011 | Liu et al. |
| 2012/0032340 A1 | 2/2012 | Choi et al. |
| 2012/0074585 A1 | 3/2012 | Koo et al. |
| 2012/0217642 A1 | 8/2012 | Sun et al. |
| 2012/0228011 A1 | 9/2012 | Chang et al. |
| 2012/0231621 A1 | 9/2012 | Chang et al. |
| 2012/0252189 A1 | 10/2012 | Sadaka et al. |
| 2012/0292602 A1 | 11/2012 | Guo et al. |
| 2013/0029848 A1 | 1/2013 | Gonzalez et al. |
| 2013/0093104 A1 | 4/2013 | Wu et al. |
| 2013/0099235 A1 | 4/2013 | Han |
| 2013/0147036 A1 | 6/2013 | Choi et al. |
| 2013/0153888 A1 | 6/2013 | Inoue et al. |
| 2013/0187265 A1 | 7/2013 | Shih et al. |
| 2013/0244417 A1 | 9/2013 | Markunas et al. |
| 2014/0001604 A1 | 1/2014 | Sadaka |
| 2014/0065771 A1 | 3/2014 | Gruber et al. |
| 2014/0113828 A1 | 4/2014 | Gilbert et al. |
| 2014/0246763 A1 | 9/2014 | Bunyk |
| 2014/0264890 A1 | 9/2014 | Breuer et al. |
| 2015/0041977 A1 | 2/2015 | Daubenspeck et al. |
| 2015/0054151 A1 | 2/2015 | Choi et al. |
| 2015/0054167 A1 | 2/2015 | Pendse |
| 2015/0054175 A1 | 2/2015 | Meinhold et al. |
| 2016/0364653 A1* | 12/2016 | Chow .................. G06N 99/002 |

FOREIGN PATENT DOCUMENTS

| | | |
|---|---|---|
| WO | WO 2016/073049 A1 | 5/2016 |
| WO | WO 2016/118209 A2 | 7/2016 |
| WO | WO 2016/118210 A2 | 7/2016 |
| WO | WO 2017/015432 A1 | 1/2017 |

OTHER PUBLICATIONS

Tarniowy, et al.; "The Effect of Thermal Treatment on the Structure, Optical and Electrical Properties of Amorphous Titanium Nitride Thin Films;" Thin Solid Films 311; 1997; 8 pages.

PCT Search Report of the ISA for PCT/US2016/052824 dated Feb. 3, 2017; 6 pages.

PCT Written Opinion of the ISA for PCT/US2016/052824 dated Feb. 3, 2017; 6 pages.

PCT Search Report of the ISA for PCT/US2016/043266 dated Dec. 5, 2016; 5 pages.

PCT Written Opinion of the ISA for PCT/US2016/043266 dated Dec. 5, 2016; 9 pages.

Office Action dated Mar. 3, 2017 for U.S. Appl. No. 14/694,540; dated 16 pages.

International Preliminary Report dated Feb. 23, 2017 for PCT Application No. PCT/US2015/044608; 9 pages.

International Preliminary Report dated Feb. 23, 2017 for PCT Application No. PCT/US2015/044679; 9 pages.

International Preliminary Report dated Feb. 23, 2017 for PCT Application No. PCT/US2015/044651; 10 pages.

Office Action dated Mar. 24, 2017 for U.S. Appl. No. 15/303,800, 39 pages.

PCT Search Report of the ISA for PCT/US2016/060296 dated Mar. 10, 2017; 5 pages.

PCT Written Opinion of the ISA for PCT/US2016/060296 dated Mar. 10, 2017; 5 pages.

(56) References Cited

OTHER PUBLICATIONS

PCT Search Report of the ISA for PCT/US2016/060309 dated Mar. 24, 2017; 6 pages.
PCT Written Opinion of the ISA for PCT/US2016/060309 dated Mar. 24, 2017; 10 pages.
Restriction Requirement dated Apr. 28, 2017 for U.S. Appl. No. 15/342,444; 9 pages.
Response to Restriction Requirement and Preliminary Amendment dated Apr. 28, 2017 for U.S. Appl. No. 15/342,444 as filed on May 19, 2017; 6 pages.
Restriction Requirement dated May 16, 2017 for U.S. Appl. No. 15/327,249; 6 pages.
PCT International Preliminary Report on Patentability dated May 18, 2017 for PCT Appl. No. PCT/US2015/059181; 11 pages.
PCT International Preliminary Report on Patentability dated May 18, 2017 for PCT Appl. No. PCT/US2015/059200; 11 pages.
Burns, et al.; "3D Circuit Integration Technology for Multiproject Fabrication;" MIT Lincoln Laboratory Presentation; Apr. 7, 2000; 15 pages.
Courtland; "Google Aims for Quantum Computing Supremacy;" Spectrum.IEEE.Org; North America; Jun. 2017; 2 pages.
International Search Report of the ISA for PCT Appl. No. PCT/US2016/060343 dated Jul. 18, 2017; 3 pages.
International Written Opinion of the ISA for PCT Appl. No. PCT/US2016/060343 dated Jul. 18, 2017; 12 pages.
Notice of Allowance for U.S. Appl. No. 15/327,235 dated Jun. 30, 2017; 17 pages.
Notice of Allowance for U.S. Appl. No. 14/694,540 dated Jul. 31, 2017; 9 pages.
Notice of Allowance for U.S. Appl. No. 15/312,063 dated Aug. 2, 2017; 17 pages.
Office Action dated Jul. 7, 2017 for U.S. Appl. No. 15/271,755; 26 pages.
Response to Office Action dated Mar. 7, 2017 for U.S. Appl. No. 14/694,540 as filed on Jun. 1, 2017; 24 pages.
Response to Office Action dated Mar. 24, 2017 for U.S. Appl. No. 15/303,800 as filed on Jun. 26, 2017; 22 pages.
Response to Restriction Requirement dated May 16, 2017 for U.S. Appl. No. 15/327,249 as filed on Jun. 27, 2017; 1 page.
Response to Restriction Requirement dated Jun. 8, 2017 for U.S. Appl. No. 15/271,755 as filed on Jun. 19, 2017; 1 page.
Office Action dated Aug. 11, 2017 for U.S. Appl. No. 15/342,444; 22 pages.
Office Action dated Oct. 20, 2017 for U.S. Appl. No. 15/327,249; 30 pages.
First Office Action dated Dec. 6, 2017 for U.S. Appl. No. 15/342,444; 18 pages.
Final Office Action dated Dec. 20, 2017 for U.S. Appl. No. 15/271,755; 25 pages.
Restriction Requirement dated Oct. 23, 2017 for U.S. Appl. No. 15/342,517; 6 pages.
U.S. Appl. No. 15/684,269, filed Aug. 23, 2017, Das, et al.
U.S. Appl. No. 15/684,337, filed Aug. 23, 2017, Das, et al.
U.S. Appl. No. 15/684,393, filed Aug. 23, 2017, Das, et al.
Notice of Allowance dated Oct. 12, 2017 for U.S. Appl. No. 15/303,800; 16 pages.
Restriction Requirement for U.S. Appl. No. 15/271,765, dated Jun. 8, 2017; 6 pages.
Response to Jul. 7, 2017 Office Action for U.S. Appl. No. 15/271,755 as filed on Oct. 10, 2017; 33 pages.
Response to Aug. 11, 2017 Office Action for U.S. Appl. No. 15/342,444 as filed on Sep. 15, 2017; 20 pages.
PCT International Search Report of the ISA for Appl. No. PCT/US2016/060263 dated Jan. 10, 2017; 3 pages.
PCT Written Opinion of the ISA for Appl. No. PCT/US2016/060263 dated Jan. 10, 2017; 6 pages.
U.S. Appl. No. 15/312,063, filed Nov. 17, 2016, Das, et al.
U.S. Appl. No. 15/342,478, filed Nov. 3, 2016, Oliver, et al.
U.S. Appl. No. 15/342,444, filed Nov. 3, 2016, Oliver, et al.
U.S. Appl. No. 15/342,517, filed Nov. 3, 2016, Oliver, et al.
U.S. Appl. No. 14/694,540, filed Apr. 23, 2015, Das, et al.
U.S. Appl. No. 15/271,755, filed Sep. 21, 2016, Das.
U.S. Appl. No. 15/303,800, filed Oct. 13, 2016, Das, et al.
PCT Search Report of the ISA for PCT Appl. No. PCT/US2015/059181 dated Sep. 7, 2016; 5 pages.
PCT Written Opinion of the ISA for PCT Appl. No. PCT/US2015/059181 dated Sep. 7, 2016; 12 pages.
PCT Search Report of the ISA for PCT Appl. No. PCT/US2015/059200 dated Jul. 21, 2016; 3 pages.
PCT Written Opinion of the ISA for PCT Appl. No. PCT/US2015/059200 dated Jul. 21, 2016; 13 pages.
PCT Search Report of the ISA for PCT Appl. No. PCT/US2015/044608 dated Dec. 31, 2015; 5 pages.
PCT Written Opinion of the ISA for PCT Appl. No. PCT/US2015/044608 dated Dec. 31, 2015; 7 pages.
PCT Search Report of the ISA for PCT Appl. No. PCT/US2015/044679 dated Apr. 13, 2016; 3 pages.
PCT Written Opinion of the ISA for PCT Appl. No. PCT/US2015/044679 dated Apr. 13, 2016; 7 pages.
PCT Search Report of the ISA for PCT Appl. No. PCT/US2015/044651 dated Nov. 4, 2015; 3 pages.
PCT Written Opinion of the ISA for PCT Appl. No. PCT/US2015/044651 dated Nov. 4, 2015; 12 pages.
U.S. Appl. No. 15/745,914, filed Jan. 18, 2018, Oliver, et al.
Office Action dated Jan. 11, 2018 for U.S. Appl. No. 15/327,239; 33 pages.
PCT International Preliminary Report on Patentability dated Feb. 1, 2018 for PCT Appl. No. PCT/US2016/043266; 11 pages.
Response to Final Office Action dated Dec. 6, 2017 for U.S. Appl. No. 15/342,444; Response filed Mar. 2, 2018; 16 pages.
Response to Restriction Requirement dated Oct. 23, 2017 for U.S. Appl. No. 15/342,517 as filed on Dec. 22, 2017; 1 pages.
Restriction Requirement dated Jan. 3, 2018 for U.S. Appl. No. 15/342,478; 6 pages.
Response to Restriction Requirement dated Jan. 3, 2018 for U.S. Appl. No. 15/342,478 as filed on Mar. 2, 2018; 6 pages.
Advisory Action dated Mar. 20, 2018 for U.S. Appl. No. 15/342,444; 3 pages.
PCT International Preliminary Report on Patentability of the ISA for PCT Appl. No. PCT/US2016/060343 dated May 17, 2018; 9 pages.

* cited by examiner

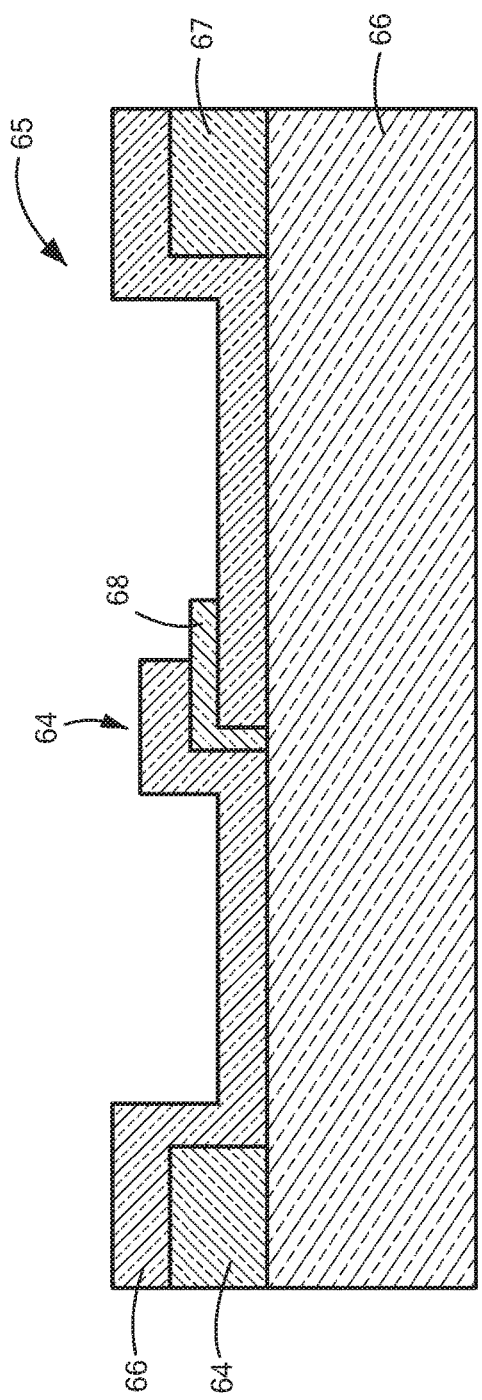
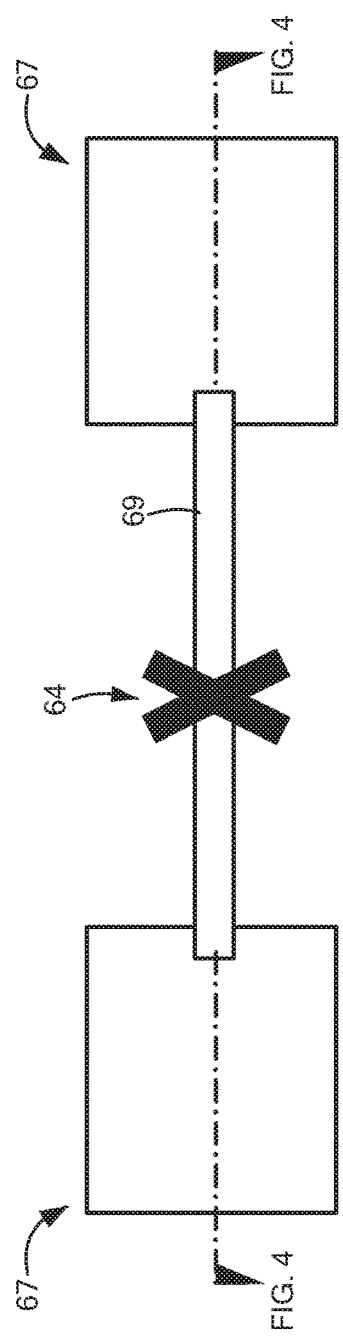
*FIG. 4*
*FIG. 4A*

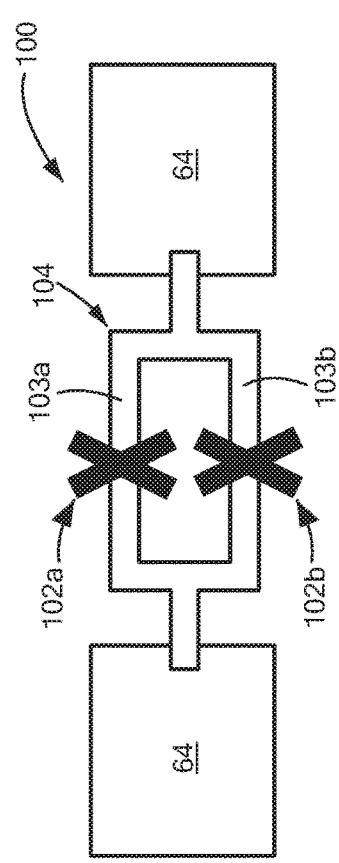
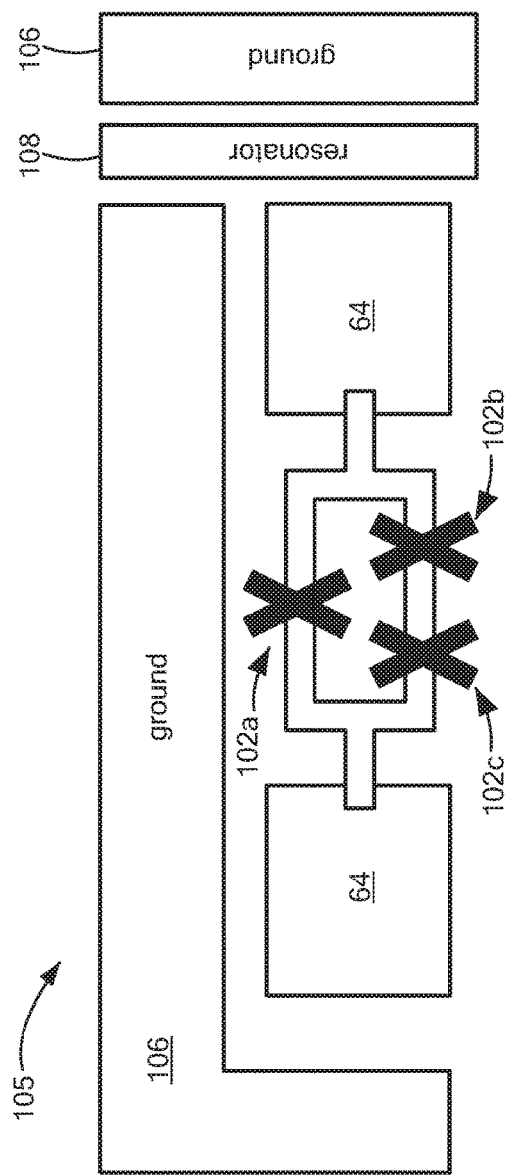
FIG. 7
FIG. 7A

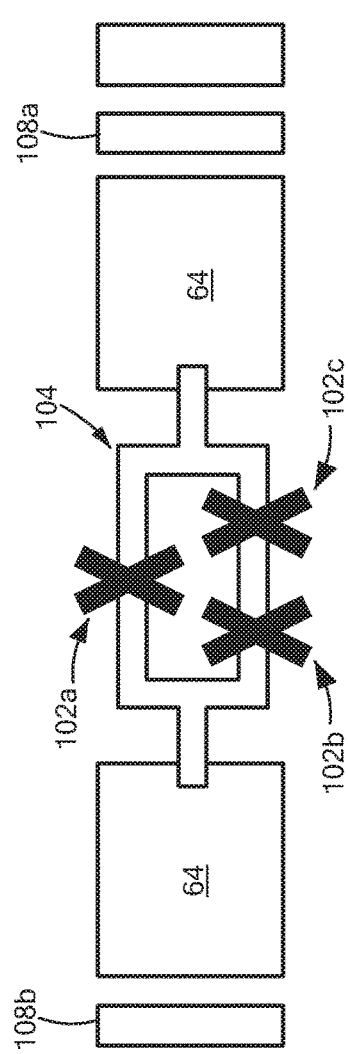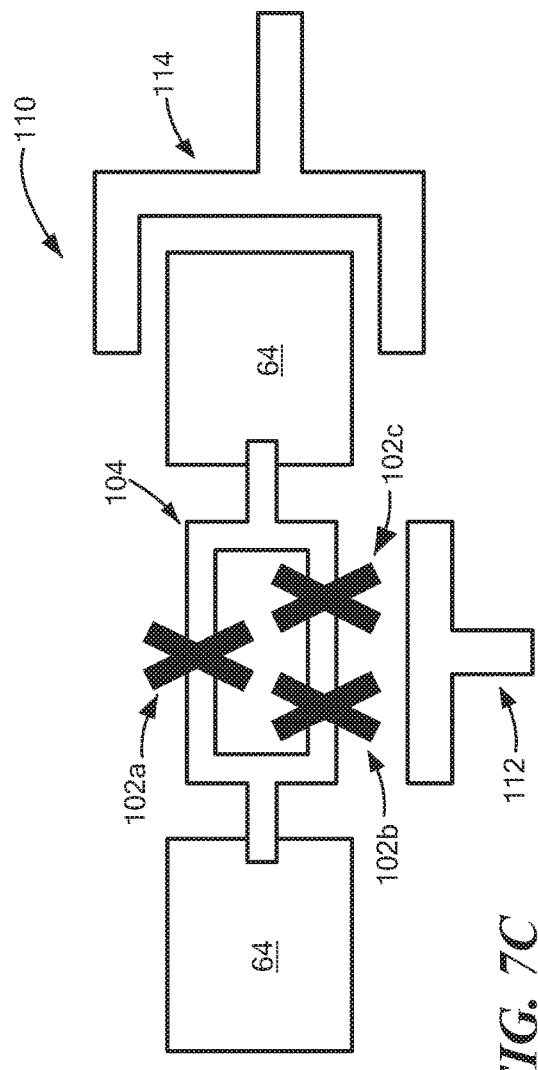
FIG. 7B
FIG. 7C

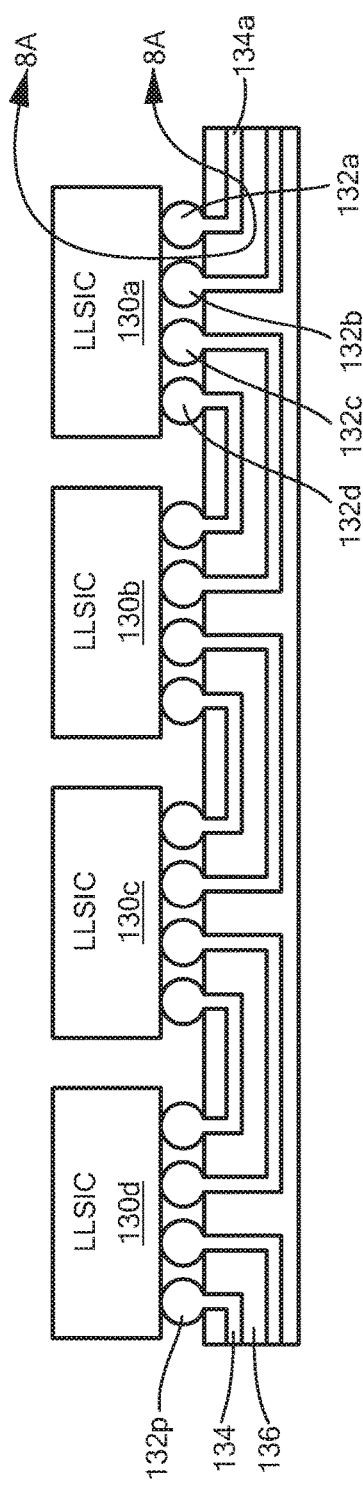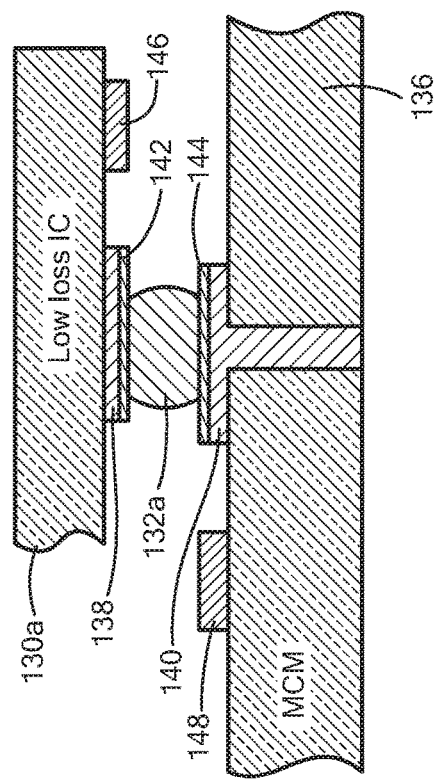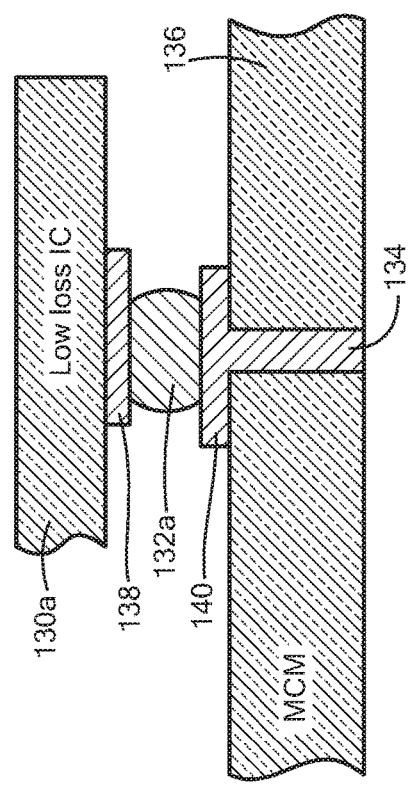

QUBIT AND COUPLER CIRCUIT STRUCTURES AND COUPLING TECHNIQUES

CROSS REFERENCE TO RELATED APPLICATION

This application is a continuation-in-part of PCT Application No. PCT/US2016/043266 filed on Jul. 21, 2016, which claims the benefit of U.S. Provisional Application No. 62/195,852 filed Jul. 23, 2015. This application also claims the benefit of U.S. Provisional Application No. 62/251,248 filed Nov. 5, 2015 under 35 U.S.C. § 119(e). Also, the subject matter of application Ser. Nos. 15/342,478, 15/342, 444 15/342,517, all filed on even date herewith are hereby incorporated herein by reference in their entireties.

GOVERNMENT RIGHTS

This invention was made with government support under Contract No. FA8721-05-C-0002 awarded by the U.S. Air Force. The government has certain rights in the invention.

FIELD

This disclosure relates generally to quantum bit (qubit) circuits, and more particularly, to qubit and coupler circuit structures and coupling techniques.

BACKGROUND

As is known, there is trend toward miniaturization of electronic products such as mobile phones, tablets, digital cameras, and the like. There is also a demand for development of electronic products which have an increased number of functionalities and have increased electronic capabilities (e.g., increased speed, memory, and operational life). These trends have resulted in a demand for integrated circuits which enable these and other increased capabilities (e.g., increased density, computing power and extended operational life).

In particular, the foregoing trends drive a need for integrated circuits which utilize superconducting materials and properties (so-called "superconducting integrated circuits"). Superconductor materials have substantially no electrical resistance below a certain critical temperature, which may provide for increased performance in integrated circuit devices. The foregoing trend and demand also drives a need for low-loss superconducting integrated circuits and interconnect structures which enable assembly of superconducting integrated circuits.

As is also known, superconducting quantum circuits are a leading candidate technology for large-scale quantum computing. Long coherence times compared to logic gate times are necessary for building a fault tolerant quantum computer. In the case of superconducting quantum bits (qubits), coherence time improvements are attributable to a number of design changes for specific superconducting materials.

One indicator of the coherence time of a quantum integrated circuit is intrinsic quality factor $Q_i$. Titanium nitride (TiN) superconducting coplanar waveguide (SCPW) resonators may be provided having high intrinsic quality factors $Q_i$. Although many studies have been done on qubits, a major technical challenge is the lack of existing high performance materials, which meet the stringent requirements of qubit applications. Such requirements include: providing materials having a high intrinsic quality factor, keeping a substantially stoichiometric thin film composition across a wafer, wafer-to-wafer reproducibility, and stability over milli-Kelvin temperature range in addition to the mandatory requirements of scalability.

SUMMARY

Described herein are concepts, systems, circuits and techniques related to low loss superconducting integrated circuits. In one aspect of the concepts described herein, a superconducting integrated circuit includes at least one superconducting resonator. The superconducting resonator is provided from a substrate having a conductive layer disposed over a surface thereof. The conductive layer is provided from a substantially low stress polycrystalline Titanium Nitride (TiN) material having an internal stress between about fifty megapascal (MPa) and about two hundred fifty MPa.

With this particular arrangement, a superconducting integrated circuit resonator having a high quality factor (Q) and low loss is provided. High-Q TiN, where the Q is measured by using, for example, a microwave resonator. The integrated circuits will include microwave resonators and/or quantum bits. Superconducting resonator is provided as any type of microwave resonator, including distributed—e.g., a coplanar waveguide (CPW) resonator, stripline resonator, microstrip resonator, coplanar strip resonator, puck resonator, and related structures, —and lumped element resonators comprising lumped capacitive and inductive elements coupled in parallel and/or in series, the capacitor formed by patterning a conductive layer deposited on a surface of a substrate, and the conductive layer including at least one conductive material, the at least one conductive material including a substantially low stress polycrystalline Titanium Nitride (TiN) material having an internal stress less than about two hundred fifty MPa (magnitude).

The superconducting integrated circuit may include one or more of the following features individually or in combination with other features. The TiN material may be a (200)-oriented polycrystalline, TiN material. The (200)-oriented, TiN material may be a single crystal, plasma etched and or cleaned TiN material having a 4-fold symmetry and in-plane rotational alignment which is an indication of a single crystal having desired characteristics. The substrate may include at least one of a silicon, deposited silicon, high resistive silicon, oxide coated silicon, silicon dioxide, glass, oxide etched silicon, oxide etched annealed silicon, oxide etched recrystallized silicon, aluminum oxide, sapphire, germanium, gallium arsenide, an alloy of silicon and germanium, and an indium phosphide material. The surface of the substrate may have at least one of an oxide, hydroxyl, hydride, nitride, fluoride, silicon nitride, hydrogenated nitride, and a hydrogenated fluoride material disposed thereon.

The conductive layer may have at least one opening provided therein. At least one of first and second opposing surfaces of the conductive layer may be a substantially concave or a substantially convex surface which may both produce very high Q. Concave surface produce tensile stress and convex surface will produce compressive stress. In one embodiment, the substantially concave and or convex surface may have an X-ray radius of curvature of about one hundred meters. The conductive layer may be annealed at a predetermined rate and temperature during fabrication of the conductive layer. The annealing process may provide for the at least one conductive material of the conductive layer changing from a first form of the conductive material to a second, different form of the conductive material to increase the quality factor of the at least one superconducting resonator.

In one embodiment, the TiN material provides the at least one superconducting resonator having an internal quality factor which is greater than about ten to the power of seven ($10^7$) at high powers (e.g. for circulating power in the resonator corresponding to an average photon number exceeding 10,000). The TiN material may provide the at least one superconducting resonator having an internal quality factor $Q_i$ which is greater than about ten to the power of six ($10^6$) at a low power single photon regime (i.e., for circulating power in the resonator corresponding to an average photon number of unity).

The at least one superconducting resonator may be provided as a coplanar waveguide (CPW) resonator. The CPW resonator may include a lumped element capacitor and inductor element coupled in parallel. The capacitor may be formed by patterning a conductive layer deposited on a surface of a substrate. The conductive layer may include at least one conductive material. The at least one conductive material may include a substantially low stress polycrystalline Titanium Nitride (TiN) material having an internal stress between about fifty megapascal (MPa) and about two hundred fifty MPa. The at least one superconducting resonator may be designed to operate in at least one of a radio frequency (RF) region and a microwave frequency region. The superconducting integrating circuit may include: at least one Aluminum or Nobium based inductor. The superconducting integrating circuit may include a buffer layer disposed between the second surface of the substrate and the first surface of the conductive layer.

In another aspect of the concepts described herein, a method for fabricating a superconducting resonator includes disposing a conductive layer over a surface of a substrate. The conductive layer includes at least one conductive material. The at least one conductive material includes a substantially low stress polycrystalline Titanium Nitride (TiN) material having an internal stress between about fifty megapascal (MPa) and about two hundred fifty MPa.

The method additionally includes forming a resist layer on a surface of the conductive layer, patterning the resist layer, and forming an opening in a select portion of the resist layer and the conductive layer such that the opening extends to the surface of the substrate having a conductive layer disposed over a surface thereof. In an embodiment, the opening has a depth of between about ten nanometers and about ten micron in the substrate. The method also includes cleaning the opening formed in the conductive layer, and removing residual resist from the conductive layer surface.

The method may include one or more of the following features either individually or in combination with other features. The opening may be formed, for example, through a dry plasma etching process using at least one of a chloride etchant and a fluoride etchant. The residual resist may be removed using, for example, a wet etching process. Providing the substrate may include providing a substrate having a highly resistive surface such as providing an entire highly resistive silicon substrate. High resistive silicon will behave like an insulator during operation.

Providing the conductive layer may include providing a conductive layer having first and second opposing surfaces and an X-ray radius of curvature of greater than about one hundred meters. The conductive layer may include at least one conductive material. The at least one conductive material may include a substantially low stress (200)-oriented polycrystalline, TiN material having an internal stress between about fifty MPa and about two hundred fifty MPa.

Also, described herein are low-loss superconducting integrated circuits comprising titanium nitride (TiN) superconducting coplanar waveguide resonators having internal quality factors above $10^7$ at high powers and over $10^6$ at low power single photon regime.

Also described are superconducting interconnect structures for low-loss superconducting integrated circuits for flip chip assemblies. The superconducting interconnect structures described herein enable combining of multiple qubit die into a single package, while also enabling replacement, repair and upgrade of each qubit die if necessary. The superconducting interconnect technology described herein also enables assembling of multiple qubit die in two-dimensional (2D), two and one-half dimensional (2.5D) and three-dimensional (3D) packaging constructions.

In accordance with one aspect of the concepts described herein, a low-loss superconducting integrated circuits include at least one superconducting resonator device formed with a low stress, (200)-oriented polycrystalline, trenched titanium nitride (TiN) layer deposited on a silicon (Si) substrate having a high resistivity characteristic to provide high Q, low loss resonator structures suited for operation in the radio frequency (RF) and/or microwave frequency ranges. In preferred embodiments, the polycrystalline layer is provided from a (200)-oriented polycrystalline material having surfaces with an X-ray radius of curvature over 100 meters.

In one embodiment, the low-loss superconducting integrated circuit includes at least one coplanar waveguide (CPW) resonator device comprising a capacitor element and an inductor element connected in parallel. The capacitor element may be formed or otherwise provided on the low stress, (200)-oriented polycrystalline, trenched titanium nitride (TiN) layer by patterning or other techniques.

In one aspect of the concepts described herein, a low-loss superconducting integrated circuit includes at least one quantum bit (or more simply "qubit") and/or associated local bias devices. The qubit contains at least one integrated capacitor formed by patterning a low stress, (200)-oriented polycrystalline, trenched titanium nitride (TiN) layer deposited on a high resistive surface of an $S_i$ substrate wherein the TiN layer produces internal quality factors above $10^7$ at high powers and over $10^6$ at low power single photon regime. The qubits may, for example, be provided as any of: a flux qubit, a 2D transmon, a 3D transmon, a C-shunt flux qubit, or an L-shunt qubit.

In accordance with a still further aspect of the concepts described herein, an electronic package includes a superconducting and/or non-superconducting and/or partially superconducting substrate, and one or more superconducting integrated circuits coupled to the substrate either by superconducting and/or partially superconducting interconnects. In some embodiments at least one, some or all of the superconducting integrated circuits includes at least one superconducting resonator device formed from a low stress, (200)-oriented polycrystalline, trenched titanium nitride (TiN) layer deposited on an Si surface having a high resistivity characteristic to provide a high Q, low loss resonator structure suitable for operation in the radio frequency (RF) and/or microwave frequency ranges. Furthermore, one or more such a superconducting resonator devices may also be coupled to the substrate. Thus, in some embodiments both the substrate and the one or more superconducting ICs may have at least one or portion of superconducting resonator device coupled thereto.

In embodiments, each substrate includes at least two circuit layers and at least one set of vias. At least one circuit layer and/or via contains a superconducting and/or non-superconducting layer provided from a low stress, (200)-oriented polycrystalline material and/or an amorphous, titanium nitride (TiN) layer deposited on Si and/or oxide coated Si and/or metal/oxide coated Si surface.

In accordance with a further aspect of the concepts described herein, an electronic package includes a superconducting and/or non-superconducting substrate, and one or more superconducting integrated circuits coupled to the substrate by superconducting interconnects. The superconducting Interconnect comprises a superconducting bump and superconducting under bump metallurgy (UBM) where the bump reacts with at least part of the UBM at an interface thereof to provide a lower temperature melt superconducting interface. In one case, interface material melts at a lower temperature than that at which the bump and UBM melt. In some embodiments, a superconducting concentration gradient is provided at the interface which melts at lower temperature than bump materials.

Each superconducting integrated circuits include at least one superconducting resonator devices provided from a low stress, (200)-oriented polycrystalline, trenched titanium nitride (TiN) layer deposited on a surface of an Si substrate having a high resistivity characteristic so as to provide high Q, low loss resonator structures suitable for operation in the RF and/or microwave frequency ranges.

In accordance with a still further aspect of the concepts described herein, a cryogenic electronic package includes a superconducting and/or non-superconducting and/or partially superconducting module, and one or more superconducting integrated circuits comprising at least one qubit coupled to the module by superconducting and/or partially superconducting interconnects one, some or all of the superconducting integrated circuits may include at least one superconducting resonator device formed with a low stress, polycrystalline preferably (200)-oriented, trenched titanium nitride (TiN) layer deposited on high resistive Si surface to provide high Q, low loss resonator structures preferably operated at radio frequency (RF) and/or microwave frequency region.

In accordance with yet, a still further aspect of the concepts described herein, a method of providing superconducting and/or partially superconducting interconnects, wherein the module and/or integrated circuits includes at least one superconducting and/or nonsuperconducting UBM connected to the superconducting trace, includes forming an opening (within the UBM) to the resist layer, depositing superconducting materials to fill the opening in the resist; remove resist in such a way that the method provides a superconducting bump having a height greater than resist thickness. The superconductors interconnects may be used to electrically/and or mechanically coupling the superconducting integrated circuits to substrates via the superconducting bumps to form a testing assembly to measure Qubit coherence and/or coupling.

In accordance with a yet further aspect of the concepts described herein, a cryogenic electronic package includes a superconducting and/or non-superconducting and/or partially superconducting module, and one or more superconducting integrated circuits contain at least one qubit coupled to the module by superconducting and/or partially superconducting interconnects. Each superconducting integrated circuits includes at least one superconducting resonator devices formed with a low stress, (200)-oriented polycrystalline, trenched titanium nitride (TiN) layer deposited on high resistive Si surface to provide high Q, low loss resonator structures preferably operated at radio frequency (RF) and/or microwave frequency region.

In accordance with yet a further aspect of the concepts described herein, a method of providing superconducting and/or partially superconducting interconnects in substrates and/or integrated circuits including at least one superconducting/and or nonsuperconducting UBM connected to a superconducting trace, comprises: forming a first resist layer, baked and adding second resist layer; forming an opening (within the UBM) to the first and second resist layer, depositing superconducting materials to fill the opening in the resist; removing resist in such a way that the method produces superconducting bumps having a height which is similar and/or taller than a resist thickness; electrically/and or mechanically coupling the superconducting integrated circuits to substrates via the superconducting bumps to form a testing assembly to measure qubit coherence and/or coupling.

In accordance with yet a further aspect of the concepts described herein, a low-loss superconducting integrated circuit includes one or more superconducting resonator devices formed with a concave and or convex surface topology having an X-ray radius of curvature preferably less than 100 meters, a (200)-oriented polycrystalline, trenched titanium nitride (TiN) layer deposited on high resistive Si surface having saturated and/or unsaturated silicon nitride to provide high Q, low loss resonator structures. In one embodiment, the resonator structures are suitable for use in the RF and/or microwave frequency ranges. By appropriate rapid thermal annealing, the TiN crystal structure may be changed to a TiN (200) crystal structure from a TiN(111) crystal structure which may enhance a Q characteristic of the low-loss superconducting integrated circuit.

At least some of the superconducting resonator devices may be formed having a concave and or convex surface having X-ray radius of curvature preferably less than 100 meters formed from a (200)-oriented single crystal, trenched and plasma etched titanium nitride (TiN) layer, deposited on a Si(100) substrate. Such a structure may show a four (4) fold symmetry and in-plane rotational alignment to provide high Q, low loss resonator structures suitable for operation in the RF and/or microwave frequency ranges.

In accordance with yet a further aspect of the concepts described herein, a superconducting integrated circuit, comprising at least one or part of a superconducting resonator, includes a substrate having first and second opposing surfaces; a conductive layer having first and second opposing surfaces, wherein the first surface of the conductive layer is disposed over the second surface of the substrate, and the conductive layer includes at least one conductive material that includes a low stress (e.g., 50-250 MPa) and or high stress (400 Mpa-4 GPa) polycrystalline material, preferably a (200)-oriented titanium nitride (TiN) material or another material having a high quality factor, to provide a high Q, low loss superconducting resonator. The integrated circuit wherein the substrate is a Silicon, high resistive silicon, oxide coated silicon, silicon dioxide, aluminum oxide (AlOx), sapphire, germanium (Ge), gallium arsenide (GaAs), an alloy of silicon and germanium, indium phosphide (InP), flex, rigid substrate and the second surface of the substrate is oxide, hydroxyl, hydride, nitride, fluoride, hydrogenated nitride, hydrogenated fluoride terminated or a combination of materials. The integrated circuit layer has an opening (e.g., trench) extending between at least a portion of the first and second surfaces of the conductive layer and at least portion of second surface of substrate.

In embodiments, the conductive layer may be disposed using any of a variety of different techniques, including, but not limited to: via PVD and or CVD and or sputtered and or magnetron sputtered and or reactive sputtered and or ALD and or PLD and or plasma enhanced and or plasma cleaned and or IMP PVD TiN. It is further possible that the conductive layer of integrated circuit is single and or multilayer, single crystal and or polycrystal and or amorphous TiN and or another high Q material. It is further possible that the integrated circuit including at least one Josephson junction and or inductor and or capacitor and or bias circuits.

In accordance with yet a further aspect of the concepts described herein, a low-loss superconducting integrated circuits is attached via a superconducting interconnect to a superconducting multi-chip module (SMCM). In embodiments, the superconducting interconnect is provided from under bump metals (UBMs). In embodiments, the low-loss superconducting integrated circuits and/or the SMCM include at least one superconducting resonator devices formed with a low stress having X-ray radius of curvature over 100 meters, polycrystalline preferably (200)-oriented, trenched titanium nitride (TiN) layer deposited on high resistive Si surface to provide high Q, low loss resonator structures preferably operated at radio frequency (RF) and/or microwave frequency region.

Low-loss superconducting integrated circuits and or SMCM further may further include a Josephson junction and/or a capacitor and/or an inductor and or a bias line. It is further possible that an SMCM attached with one or more additional integrated circuits may be used to provide a system in a package. Examples of additional circuits include, but are not limited to: an amplifier, an RF front end, an adder, one or more shift registers, a ring oscillator, a processor, a memory, one or more logic circuits, a field programmable gate array (FPGA), a battery, one or more capacitors, one or more resistors, and one or more inductors. It is further possible that SMCM is multilayer normal conductor based MCM where each normal conductor layer is connected by micro-via. In one example, MCM has strip line routing shielded with ground plane and signal routing.

In accordance with yet a further aspect of the concepts described herein, low-loss superconducting integrated circuits may be coupled to an SMCM through an intermediate substrate with superconducting and/or a UBM interrupted interconnect. Low-loss superconducting integrated circuits and/or intermediate substrate and/or SMCM include at least one superconducting resonator devices formed with a low stress polycrystalline preferably (200)-oriented having X-ray radius of curvature over 100 meters, a trenched titanium nitride (TiN) layer deposited on high resistive Si surface to provide high Q, low loss resonator structures preferably operated at radio frequency (RF) and/or microwave frequency region.

The integrated circuit and/or intermediate substrate and/or SMCM have at least one through via and or micro-via containing low stress titanium nitride (TiN) and or another high Q superconducting and or non-superconducting layer. Low-loss superconducting integrated circuits and or SMCM and or intermediate structure may further include a Josephson junction and/or a capacitor and/or an inductor and/or a bias line. It is further possible that at least part of the low-loss superconducting integrated circuits and/or intermediate substrate use high Q metal shielding.

In accordance with yet a further aspect of the concepts described herein, microbump technology capable of combining multi-die system on a chip (SOC) into a single package by joining a variety of arbitrary structures to produce various shape, size and pitch at the same package level. In embodiments, the microbump technology has a single microbump for finer pitch structure and one or more microbump arrays for larger pitch structures. Thus, such embodiments are capable of including both finer pitch as well as larger pitch structures in the same packaging layers.

Multi-die SOC interconnects may be provided from superconducting microbump and under bump metallurgy (UBM) where a microbump will react with at least part of the UBM at an interface to provide an interface having a higher temperature melting point than prior art interfaces. In one illustrative embodiment, the interface melts at higher temperature than at least one component of the microbump and or UBM. It is also possible to create a concentration gradient at the interface which melts at higher temperature than the microbump and/or UBM.

Multi-die SOC interconnect structures may be used where a superconducting Interconnect and a UBM grow together on a nano-grain low energy surface. This process allows creation of same diameter interconnects and UBMs and rest of the pad will be on the low energy surface which may be provided as a non-wettable surface. Interconnect side walls may contain nano, sub-micro and micro grain/particle structures to help prevent melt flow by reacting/diffusing with the low melt phase. It is possible that the interconnect may be surrounded by polymer matrix capable of reducing as well increasing viscosity at or below curing temperature until a final curing is performed.

In accordance with a still further aspect of the concepts described herein, a multi-qubit die SoC interconnect consists of a superconducting microbump and under bump metallurgy (UBM) where the microbump is provided so as to react with at least part of the UBM at the microbump-UBM interface to create higher temperature melt interface. In one case, the melting point of the interface is at a temperature which is higher than the melting point temperature of at least one of the components (i.e. higher than the melting point temperature of the bump or UBM).

It is also possible to create a concentration gradient at the interface which melts at higher temperature than the microbump and/or the UBM. In embodiments, the multi-qubit die SOC interconnect structure exists where a superconducting Interconnect and a UBM grow together on a nano-grain low energy surface. This technique allows for creation of a substantially same diameter interconnect and UBM and rest of the pad will be provided on a low energy surface, non wettable surface. Superconducting Interconnect side walls may contain nano, sub-micro and micro grain/particle structures. Such structures may help to prevent melt flow by reacting/diffusing with a low melt phase. At least one of the multi-qubit die SoC contains a through silicon via (TSV) and or a redistribution layer. Such a die having a TSV and/or a redistribution layer may use a second superconducting microbump technology to attach multi die SoC to a superconducting multi-chip module (SMCM) and/or an organic and/or a ceramic and/or a glass substrate.

At least one of the SMCM and/or organic and/or ceramic and/or glass substrate containing a through via and/or a blind via and/or a stacked via and/or a staggered via using a third superconducting microbump technology to attach the SMCM to the organic substrate. Interconnect density decreases and pitch increases with increasing interconnect level. It is possible that both first and second and/or third interconnect may be surrounded by a polymer matrix at least once capable of reducing as well increasing viscosity at, or below, a curing temperature until final curing is completed.

In accordance with a yet further aspect of the concepts described herein, a superconducting microbump technology capable of combining multi die SoC into a single package by joining a variety of arbitrary structures to produce various shape, size and pitch at the same package level. The microbump technology may be provided having a single superconducting microbump for finer pitch structure and one or multiple superconducting microbump arrays for larger pitch structures. This provides an interconnect system and technique capable of maintaining finer pitch as well as larger pitch structures in the same packaging layers.

In embodiments, A multi-qubit die SoC interconnect consists of a superconducting microbump and under bump metallurgy (UBM) where the microbump will react with at least part of UBM at the interface to create an interface having a relatively high melting point temperature at the melt interface. In one case, an interface may be provided having a melting point temperature which is a higher temperature than of at least one of the component of the microbump and or UBM. It is also possible to create a concentration gradient at the interface which melts at higher temperature than either the microbump and/or the UBM.

In embodiments, a multi-qubit die SoC interconnect structure is provided in which an interconnect and a UBM may be grown together on a nano-grain, low energy surface. This technique allows for creation of an interconnect and a UBM having the same diameter while remaining portions of the pad will be with a non-wettable surface having a low surface energy. Interconnect side walls may contain nano, sub-micro and micro grain/particle structure also help to prevent melt flow by reacting/diffusing with the low melt phase. At least one of the multi-qubit die SoC containing a through silicon via (TSV) and/or a redistribution layer.

The die may have a TSV and/or redistribution layer and including a second superconducting microbump technology to attach a multi-die SoC to SMCM and/or organic and/or ceramic and/or glass substrate. At least one of the SMCM and/or organic and/or ceramic and/or glass substrate containing a through via and/or a blind via and/or a stacked via and/or a staggered via and using a third superconducting microbump technology to attach an SMCM to an organic rigid-flex and/or an organic rigid with a detachable flex structure. This technique provides interconnect density decreases, along with pitch increases with increasing interconnect level. It is possible that both first and/or second and/or third Interconnect surrounded by polymer matrix at least once capable of reducing as well increasing viscosity at or below curing temperature till final curing.

In one aspect of the disclosure, a cryogenic quantum bit package includes one or more quantum bit (qubit) integrated circuits, each of the one or more qubit integrated circuits comprising at least two qubit circuits. The cryogenic quantum bit package also includes a quantum bit bias control line and a coupler circuit disposed to couple signals between said at least two qubit circuits. The cryogenic quantum bit package additionally includes a superconducting multi-chip module (MCM) and one or more superconducting and/or nearly superconducting interconnects. Each of the one or more superconducting interconnects is disposed between and electrically coupled to the one or more quantum bit integrated circuits and the superconducting MCM such that a signal path is provided between the one or more qubit integrated circuits and the MCM.

The cryogenic quantum bit package may also include one or more of the following features individual or in combination with other features. The coupler circuit may include at least one of: a Josephson junction; a capacitive coupling circuit; an inductive coupling circuit; a resonator; a qubit loop; and a coupler loop. At least a portion of the at least two qubit circuits may be disposed in the superconducting multi-chip module. At least a portion of the coupler circuit may be disposed in the superconducting multi-chip module. At least a portion of the at least two qubit circuit and at least a portion of the coupler circuit may be disposed in said superconducting multi-chip module.

At least a portion of the quantum bit bias control line may be disposed in the qubit integrated circuit. At least a portion of the quantum bit bias control line may be disposed in the superconducting multi-chip module. At least one of the qubit integrated circuits and the superconducting MCM may further comprise a bias control system configured to apply a local effective bias to a corresponding quantum device.

The coupler circuit may be disposed so as to provide coupling to a nearest-neighbor qubit circuit. The cryogenic quantum bit package may further include a plurality of couplers. Each of the plurality of couplers may be disposed to couple to next nearest-neighbor qubit circuits. Each of the qubit chips may further comprise a coupling control system configured to tune the coupling value of a corresponding coupling device in the plurality of coupling devices to a desired coupling value.

In one aspect of the disclosure, a cryogenic quantum bit package includes a first quantum bit integrated circuit and a second quantum bit integrated circuit. The cryogenic quantum bit package also includes a superconducting multi-chip-module (MCM) and an interposer disposed between the first and second quantum bit (qubit) integrated circuits and the superconducting MCM. The interposer includes a TSV substrate and is disposed to electrically interconnect the first and second quantum bit integrated circuits to the superconducting MCM sandwich.

The cryogenic quantum bit package may also include one or more of the following features individual or in combination with other features. The TSV interposer substrate may have an opening provided therein. The cryogenic quantum bit package may further include at least one electrical component disposed in the opening of the TSV interposer substrate with the at least one electrical component electrically and mechanically coupled to the MCM. The MCM may include one of: a CMOS chip; a qubit chip or an SFQ chip.

The cryogenic quantum bit package may include a third qubit chip disposed on an upper surface of the TSV substrate with the first and second qubit chips disposed in a first plane and the third qubit chip disposed in a second different plane. The third qubit chip is disposed to couple signals between at least one of the first and second qubit integrated circuits disposed in the first plane. The first, second and third qubit chips may be disposed to inductively couple signals there between.

At least one of the qubit chips may include a quantum bit circuit. The quantum bit circuit may include a substrate having first and second opposing surfaces. Additionally, the quantum bit circuit can include a conductive layer having first and second opposing surfaces. The first surface of the conductive layer may be disposed over the second surface of the substrate. The conductive layer may include at least one conductive material, the at least one conductive material including a substantially low stress polycrystalline titanium nitride (TiN) material having an internal stress below about two hundred fifty megapascal (MPa). A superconducting resonator and/or at least one of the qubit integrated circuits may be provided as a substantially high quality factor, low loss superconducting resonator and/or qubit. The TiN material may be a (200)-oriented polycrystalline. The TiN material may be provided as a (200) oriented single crystal material having a 4-fold symmetry and in-plane rotational alignment.

The substrate may be provided from at least one of: silicon; deposited Silicon; silicon having at least one surface with a high resistivity characteristic; oxide coated silicon; oxide etched silicon; oxide etched annealed silicon; glass; aluminum oxide; sapphire; germanium; gallium arsenide; an alloy of silicon and germanium; and indium phosphide. The substrate may be at least one of a superconducting substrate or a partially superconducting substrate. The conductive layer may include a superconducting bump and/or a partially superconducting bump disposed to electrically couple at least two of the qubit chips (or integrated circuits).

BRIEF DESCRIPTION OF THE DRAWINGS

Features and advantages of the concepts, systems, circuits and techniques disclosed herein will be apparent from the following description of the embodiments taken in conjunction with the accompanying drawings in which like reference numerals designate like elements throughout the views:

FIG. 4 is a cross-sectional view of an aluminum junction;

FIG. 4A is a plan view of a Josephson junction disposed between a pair of high Q materials formed in a substrate;

FIG. 7 is a plan view of a building block of a passive or active superconducting circuit;

FIG. 7A is a plan view of a building block of a passive or active superconducting circuit having a resonator;

FIG. 7B is a plan view of a building block of a passive or active superconducting circuit having a resonator and a pair of ground planes;

FIG. 7C is a plan view of a building block of a passive or active superconducting circuit having a pair of bias lines;

FIG. 8 is a side view of a plurality of low loss superconducting integrated circuits coupled to a multichip module (MCM) substrate;

FIG. 8A is an enlarged view of a portion of FIG. 8 taken across lines 8A-8A;

FIG. 8B is a side view of a low loss superconducting integrated circuit attached by a superconducting interconnect to a MOM;

DETAILED DESCRIPTION

Figure 1:
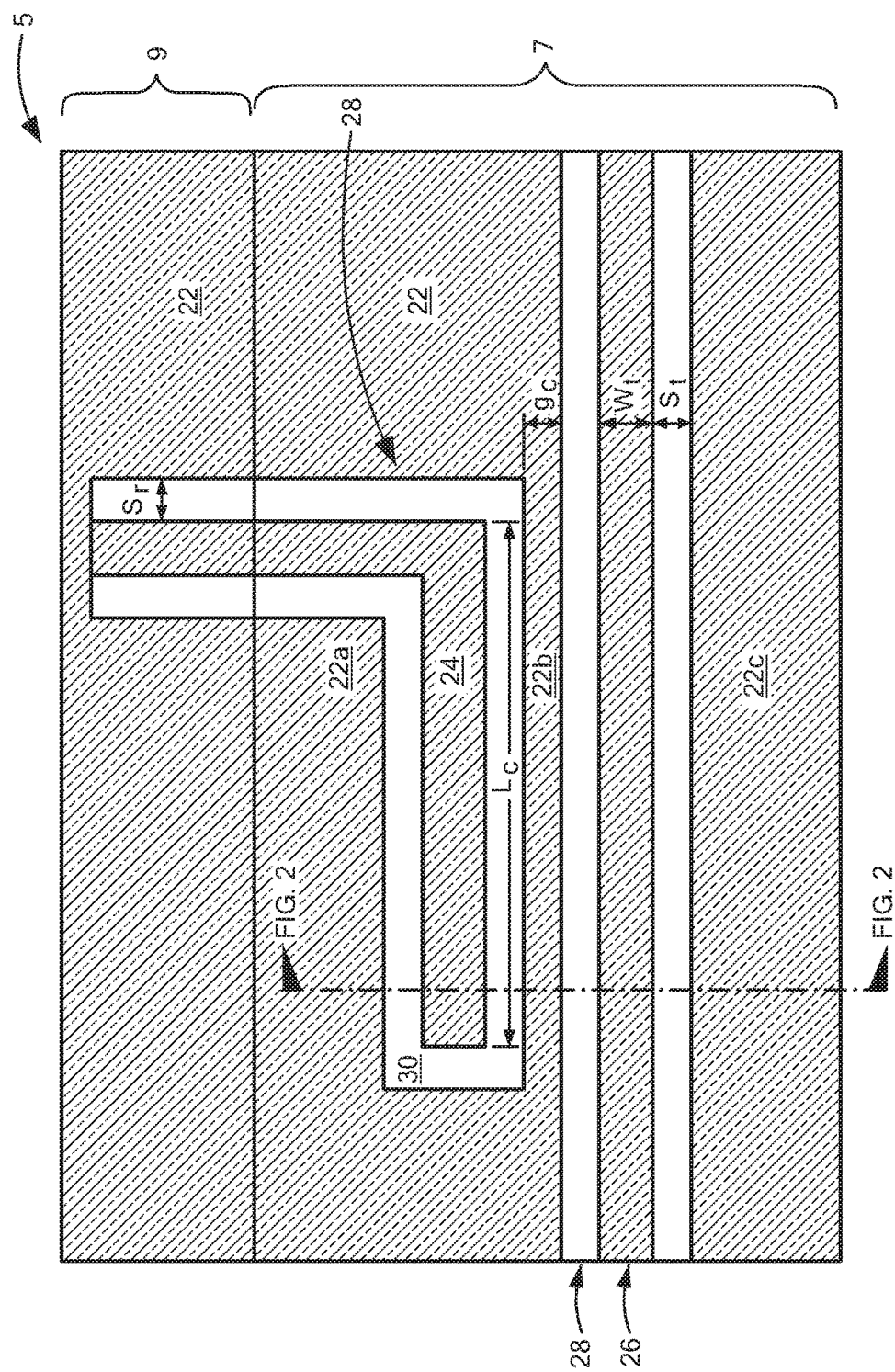
FIG. 1 is a plan view of a superconducting coplanar waveguide (CPW) resonator.

The features and other details of the concepts, systems, and techniques sought to be protected herein will now be more particularly described. It will be understood that any specific embodiments described herein are shown by way of illustration and not as limitations of the disclosure and the concepts described herein. Features of the subject matter described herein can be employed in various embodiments without departing from the scope of the concepts sought to be protected. Embodiments of the present disclosure and associated advantages may be best understood by referring to the drawings, where like numerals are used for like and corresponding parts throughout the various views. It should, of course, be appreciated that elements shown in the figures are not necessarily drawn to scale. For example, the dimensions of some elements may be exaggerated relative to other elements for clarity.

Definitions

For convenience, certain introductory concepts and terms used in the specification are collected here.

As used herein, a "high Q metal" or "high Q material" (or so-called high Q metals or "high Q materials") refers to materials in the 20-400 nm film form capable of producing a high quality factor and are defined as materials in a resonator and/or a superconducting resonator which produce a quality factor in the range of about a few thousands to several millions in the low power and/or single photon region. Illustrative materials include, but are not limited to: niobium (Nb), niobium nitride (NbN), titanium-niobium-nitride (TiNbN), titanium nitride (TiN), aluminum (Al), and rhenium (Re), diamond, graphene etc.

The phrase "quality factor" can be used to describe how long stored energy remains in a resonator. It should be appreciated that there is a difference between a total quality factor and an internal quality factor Qi. Internal quality factor Qi is an intrinsic characteristic of a resonator. A total or loaded quality factor QL, on the other hand, also depends upon other properties, including, but not limited to, coupling to an environment (i.e. an environment external to the resonator) and a feedline. A coupling quality factor (Qc) describes how strong (or closely) the resonator is coupled to the feedline.

As used herein, the term "resonator" refers to a device or system that exhibits resonance at some frequencies. A resonator may be described by two characteristics: (1) a resonance frequency; and (2) a quality factor. Superconducting resonators play a significant role in qubit design, interqubit coupling, quantum information storage, and quantum-state dispersive readout because of their low signal-to-noise ratio and low power dissipation. In addition, as part of the concepts sought to be protected herein, it has been recognized that because superconducting qubits may be fabricated using the same materials and processes as resonators described herein, the study of the loss mechanisms limiting the qualify factor Q in these resonators may prove to be a useful and relatively simple tool for understanding the fabrication-dependent limits to qubit coherence times. Superconducting resonator is provided as any type of microwave resonator, including distributed—e.g., a coplanar waveguide (CPW) resonator, stripline resonator, microstrip resonator, coplanar strip resonator, puck resonator, and related structures, —and lumped element resonators comprising lumped capacitive and inductive elements coupled in parallel and/or in series, the capacitor formed by patterning a conductive layer deposited on a surface of a substrate.

A bit is the most basic unit of classical logic and can occupy one of two discrete states, 0 or 1. A quantum bit, or 'qubit,' on the other hand, can be an arbitrary superposition of the eighteen states $|0\rangle$ and $|1\rangle$. A quantum computer is comprised of logic gates that operate on an ensemble of quantum bits.

Where n classical bits can only exist in one of the 2n possible states, a quantum processor with n qubits can be placed in a complex superposition state of all 2n permutations, containing exponentially more information than a conventional processor.

"Superconducting qubits" are manifested as (e.g. an integrated circuit) electronic circuits comprising lithographically defined Josephson junctions, inductors, capacitors, transmission lines and interconnects. When cooled to dilution refrigerator temperatures, these circuits behave as quantum mechanical "artificial atoms," exhibiting quantized states of electronic charge, magnetic flux, or junction phase depending on the design parameters of the constituent circuit elements. The Josephson junction behaves as a non-linear dissipationless inductor.

Superconducting qubits are engineered to have discrete, anharmonic spectra—an "artificial atom" fabricated using standard lithographic techniques.

"Superconducting artificial atoms" are electronic circuits comprising lithographically defined Josephson tunnel junctions, inductors (L), capacitors (C), and interconnects. Conceptually, they begin as linear LC resonant circuits (i.e., simple harmonic oscillators), which are then made anharmonic to varying degrees by adding a nonlinear inductive element, the Josephson junction (JJ). When cooled to dilution refrigerator temperatures (~20 millikelvin), these superconducting circuits behave as quantum mechanical oscillators (e.g., "artificial atoms") exhibiting quantized states of electronic charge, magnetic flux, or junction phase depending on the design parameters of the constituent circuit elements. A "superconducting device," as defined herein, includes at least one of a superconducting trace, a superconducting interconnect, a partially superconducting interconnect, a Josephson junction, a superconducting qubit and a superconducting resonator during operation.

Three fundamental superconducting qubit modalities are: charge, flux, and phase. Each includes one or more Josephson junctions. The qubit comprises the two-lowest states and is addressed at a unique frequency, $f_{01}$. Qubit modalities represented include charge, quantronium, flux, 2D transmon, fluxonium, and 3D transmon qubits.

The term "superconducting qubit" generally refers to the ground and first-excited state of a superconducting artificial atom. Due to the anharmonicity imparted by the Josephson junction, the ground and first-excited states may be uniquely addressed at a frequency, $f_{01}$, without significantly perturbing the higher-excited states of the artificial atom. These two-lowest states thereby form an effective two-level system (i.e., a pseudo-"spin-1/2" system), and it is this degree of freedom that is used as the qubit, a quantum bit of information. Qubit participates in quantum annealing cycle and settle into one of two possible final states (0, 1). Qubit used real valued constant (weight) which influences qubit's tendency to collapse into two possible final states.

The term "coupler" as used herein refers to a physical device that allows one qubit to influence another qubit. An Inductor and/or a Josephson junction can be a part of coupler. A coupler may be characterized by a real valued constant (strength) that indicates controls or influence exerted by one qubit on another.

As quantum mechanical objects, superconducting qubits can be coherently controlled, placed into quantum superposition states, exhibit quantum interference effects, and become entangled with one another. The time scale over which a superconducting qubit maintains this type of quantum mechanical behavior, and thereby remains viable for quantum information applications, is generally called the "coherence time." The rate at which the qubit loses coherence is related to its interactions with the uncontrolled degrees of freedom in its environment.

The term "interposer" as used herein, refers to and includes any structure capable of electrically interconnecting and/or magnetically and/or inductively and/or capacitively coupling arrays of superconducting conductors on two opposing circuitized substrates using extremely small superconductive and or partially superconductive elements such as micro-bumps, solder paste or conductive paste, as well as by using conductive and or superconductive thru-holes. Such an interposer, as defined herein, includes at least one dielectric layer (and may include many) and at least two external superconductive circuit layers (and possibly one or more internal superconductive circuit layers) wherein the layers may each include selective and or a density array of contact locations.

Examples of dielectric materials include such materials as high resistive silicon, silicon oxide coated Si, silicon nitride coated Si, selective silicon oxide coated Silicon, selective silicon nitride coated Silicon, selective or entire low loss organic (e.g., BCB) coated Silicon and combination. Examples of conductive and or superconductive thru-holes as defined herein include materials as niobium (Nb), niobium nitride (NbN), titanium-niobium-nitride (TiNbN), titanium nitride (TiN), aluminum (Al), rhenium (Re), tungsten, silicide, diamond or any other possible superconducting metal and or superconducting nitride and combination. In one example, conductive and or superconductive thru-holes as defined herein include at least single and or multilayer Titanium nitride where part of the Titanium nitride can be used as Silicon and titanium etch barrier. It is further possible to use titanium nitride single and or multilayer materials with multiple composition and or concentration gradient where at least one composition and or concentration is superconducting during device operation.

A "substrate," as defined herein, is used to describe a chip carrier for flip-chip and/or wirebonding and/or 3D circuits. The substrate can be an active and or a passive integrated circuit based carrier. Additionally, the substrate can be an active and/or passive TSV and/or MCM and/or single chip module based chip carrier. The chip carrier can be Silicon (Si) based, organic based, ceramic based, Sapphire based or a combination thereof.

The term "superconducting multi-chip module (SMCM)" as used herein includes at least one dielectric layer (and may include many) and at least one superconductive circuit layers (and possibly one or more internal superconductive circuit layers) deposited on the base substrate (e.g. Si or high resistive Si) using thin film technology. It is further possible to include one superconductive via and or superconducting pad wherein the superconducting pad contains one or more under bump metals.

Examples of dielectric materials include such materials as silicon (Si), high resistive silicon, silicon oxide as dielectric on Si, silicon nitride as dielectric on Si, selective silicon oxide on Silicon, selective silicon nitride on Silicon, selective or entire low loss organic (e.g., BCB) coated Silicon and combination. Examples of superconductive circuits, vias and pads as defined herein include materials as niobium (Nb), niobium nitride (NbN), titanium-niobium-nitride (TiNbN), titanium nitride (TiN), aluminum (Al), rhenium (Re), or any other possible superconducting metal and or superconducting nitride and combination.

A substrate may have a Josephson junction and or an embedded Josephson junction. It is further possible to use integrated and or embedded capacitors, inductors, resistors. Patterned NbN can act as inductor. Capacitor may be planer, parallel plate, interdigited and combinations thereof. Examples of materials from which resistors may be provided include, but are not limited to: platinum, molybdenum, molybdenum nitride and combinations thereof. The substrate can further have dielectric bridges, crossovers, air bridges and combinations.

The term "superconducting multi-chip module (SMCM)" may be used when at least part of the circuits are superconducting during operation and used superconducting and or normal via between superconducting circuits for interconnects. A superconducting multi-chip module (can have normal UBM conductor for heterogeneous integration as well as to protect the superconducting pad. We defined "superconducting multi-chip module (SMCM)" as when at least part of the circuit is a conductor (e.g., a conventional conductor) and part of a superconducting during operation. The superconducting multi-chip module can have active elements such as various size Josephson junctions and passive elements such as inductors, resistors, transformers, and transmission lines.

In one example, superconducting multi-chip module is a niobium-based integrated-circuit fabrication process appropriate for integrating superconducting chips. It is based on four Nb metal layers separated by PECVD silicon oxide dielectric. It utilizes I-line (365 nm) photolithography and planarization with chemical-mechanical polishing (CMP) for feature sizes down to 0.8 micron. There are four superconducting Nb layer and used Ti—Pt—Au as under bump metal layer. Superconducting vias are created between metal layers. In a typical process, vias are etched into PECVD $SiO_2$ dielectric and filled with niobium metal of the subsequent superconducting layer. Superconducting multi-chip module may be used to assemble multiple superconducting and or normal chips. Similarly, superconducting single-chip module (SSCM) may be used to assemble a single superconducting or normal chip.

The term "superconducting module" or "superconducting substrate" includes both superconducting multi-chip module (SMCM) and superconducting single-chip module (SSCM). We use the term "normal module" or "normal substrate" which includes both multi-chip module (MCM) and single-chip module (SCM). Both superconducting and normal module able to attach superconducting and or normal conducting chips.

We defined "cryogenic electronic packaging" as integration and packaging of electronic components for cryogenic (77° K and below) applications. It is possible cryogenic electronic package can be used for room temperature electronics as well. For example interface electronics which needs to interface between cryo and room temperature electronics able to operate at both temperature zones. It also possible that cryogenic electronic package can be used for specific temperature operation (e.g., 4-10° K, below 100° mK). For example superconducting niobium electronics operates below about 8° K, whereas superconducting Aluminum electronics operates below about 500° mK.

The term "under bump metal (UBM)" or" under bump metallization (UBM)" as used herein refers to structures which include materials which provide a low resistance electrical connection to the superconducting pad. A UBM may adhere well both to the underlying superconducting pad and to the surrounding superconducting circuit's passivation layer, hermetically sealing the superconducting circuits from the environment. In some cases, a UBM may provide a strong barrier to prevent the diffusion of other bump metals into the superconducting circuits. A top layer of a UBM must be readily wettable by the bump metals, for solder reflow. In one embodiment a UBM uses multiple different metal layers, such as an adhesion layer, a diffusion barrier layer, a solderable layer, and an oxidation barrier layer. It is further possible that the UBM layers are compatible metals which in combination have low internal mechanical stresses. Example of materials from which a UBM may be provided include, but are not limited to: 20 nm Ti-50 nm Pt-150 nm Au, 10 nm Ti-50 nm Au, 5 nm Ti-5 nm Pt-5 nm Au-1000 nm Indium, 5 nm Ti-5 nm Pt-5 nm Au-1000 nm Sn, 50 nm Pt-100 nm Au, 5 nm Ti-500 nm In, 20 nm Ti-1000 nm In, Ni—Au, Ni—Pd—Au, Pd—Au, Ti—TiN, Ti—TiN—Ti—Au, Ti—TiN—Ti—In, Ti—TiN—Ti—Sn, Ti—Sn—In etc.

The term "superconducting interconnect" or "partially superconducting interconnect" as used herein refers to structures including at least one superconducting bump and at least one UBM to create electrical and or mechanical connection between two superconducting circuits. We defined "superconducting interconnect" when superconducting bump and superconducting UBM create superconducting interconnect between two superconducting circuits during operation. We also defined "superconducting interconnect" when superconducting bump and normal UBM conductor create superconducting interconnect between two superconducting circuits during operation. Here normal UBM conductors become superconducting due to proximity effect.

We defined "partially superconducting interconnect" as when a superconducting bump and a UBM conductor (e.g., a conventional UBM conductor) create a conductor interconnect (e.g., a conventional conductor interconnect) between two superconducting circuits during operation. Here normal UBM conductors dominate interconnect conductance although part of the conductor interconnect is superconducting due to superconducting bump. In one example superconducting interconnect use as Al-UBM-Indium-UBM-Al or Nb-UBM-In-UBM-Nb.

Examples of initial interconnect composition prior to bonding with second superconducting substrate include, but are not limited to: Ti(5 nm)-Au(20 nm)-8 um In, Ti(5 nm)-Au(100 nm)-8 um In, Ti(5 nm)-Au(50 nm)-8 um In, Ti(5 nm)/Pt(20 nm)/Au(20 nm)+8 um In, Ti(5 nm)/Pt(20 nm)/Au(20 nm)+8 um In, Ti(5 nm)/Pt(50 nm)/Au(100 nm)+8 um In, Ti(5 nm)/Pt(50 nm)/Au(150 nm)+8 um In, 8 um Indium-1 um tin, 4.5 um Indium-4.5 um tin, 6 um Silver bump with 2 um In, 5 nm Ti-6 um Ag-5 nm Ti-50 nm Pt-100 nm Au-2 um In, Al—In, Pb—In, Pb—Ti—In, Pb—Sn—In, Pb—Sn—In—Au(10 nm). Nb—Pb—Sn—In, Nb—Pb—In, Nb—Ti(5 nm)-Pb(8 um)-In(2-5 um), 48Sn-52In etc. In one example, a total interconnect resistance for an Al based superconducting substrate may be calculated as: interface resistance of Al-UBM+interface resistance of (UBM-In)+interface resistance of (In-UBM)+interface resistance of UBM-Al. In another example, we use a so-called "nearly superconducting interconnect" which is defined as interconnect with resistance ranges in the micro ohms (100 micro ohms or less) to nano ohms region.

Example compositions of superconducting interconnects include: (10-400)nm Al-(3-20)nm Ti-(5-40)nm Au-(1-5)μm In-(5-40)nm Au— (5-20)nm Ti-(10-400)nm Al. In such examples, Al is used as a superconducting pad and Ti—Au or Ti—Au-thin (≤1000 nm) Indium can act as a UBM. It is possible for Au thickness in the interconnect part to be consumed by Indium and rest of the Au will superconducting based on proximity.

Additional example compositions of superconducting interconnects include: (10-400)nm Al-(3-20)nm Ti-(10-400) nm Al, (10-400)nm Al -(1-5)μm In-(10-400)nm Al, (10-400) nm Al-(3-20)nm Ti-(5-40)nm Au-(1-5)μm In -(1-5)μm Sn-(5-40)nm Au-(5-20)nm Ti-(10-400)nm Al, and (10-400)nm Nb-(3-20)nm Ti-(5-40)nm Au-(1-5)μm In-(5-40)nm Au-(5-20)nm Ti-(10-400)nm Nb.

Further example compositions of superconducting interconnects include: (10-400)nm Nb-(3-20)nm Ti-(1-5)μm In-(5-20)nm Ti-(10-400)nm Al, (10-400)nm Nb-(1-5)μm In-(10-400)nm Nb, (10-400)nm Al-(3-20)nm Ti-(5-40)nm Au-(1-5)μm In-(1-5)μm Sn-(5-40)nm Au-(5-20)nm Ti-(10-400) nm Al, and (10-400)nm Al-(3-20)nm Ti-(5-200)nm TiN-(1-5)μm In-(5-200)nm TiN-(5-20)nm Ti-(10-400)nm Al, (10-400)nm Al-(3-20)nm Ti-(5-200)nm TiN-(5-40)nm Au-(1-5) μm In-(5-40 nm) Au—(5-200)nm TiN-(5-20)nm Ti-(10-400) nm Al. Additional example compositions of superconducting interconnects include: (10-400)nm Nb—(3-20)nm Ti—(5-200)nm TiN-(1-5)μm In-(5-200)nm TiN-(5-20)nm Ti-(10-400)nm Nb, (10-400)nm Nb-(3-20)nm Ti-(5-200)nm TiN-(5-40)nm Au-(1-5)μm In-(5-40 nm) Au-(5-200)nm TiN-(5-20)nm Ti-(10-400)nm Al, and combinations thereof.

In this example, it is assumed that an Al pad is used for both superconducting integrated circuits and or modules for creating superconducting and or partially superconducting interconnects, assuming UBM resistance negligible in the range of nano ohm and Indium, aluminum superconducting during device operation. R(Al-UBM): contact resistance and R(UBM-In):interface resistance between bump and UBM. If Indium is used as a material from which to provide a UBM, then a Total Resistance (TR) may be computed as TR=2R (Al-UBM) assuming Indium to indium mixing much better and indium is superconducting. In this case, a contact resistance [R(Al-UBM)] will be superconducting due to proximity. So, keeping same materials as UBM as well as a bump has many benefits other than adding multiple materials.

As used herein, the term "conductive fusible metal" is used to describe a metal including one or more of tin-lead, bismuth-tin, bismuth-tin-iron, tin, indium, indium-silver-lead, indium-lead (In—Pb), Indium-lead-tin (In—Pb—Sn), tin-indium, indium-gold, tin-indium-gold, tin-silver, tin-gold, indium, tin-silver-zinc, tin-silver-zinc-copper, tin-bismuth-silver, tin-copper, tin-copper-silver, tin-indium-silver, tin-antimony, tin-zinc, tin-zinc-indium, copper-based solders, and alloys thereof. The metals may change forms (e.g., from a solid to a liquid) during a bonding or during post bonding annealing or reflow process.

As used herein, the term "conductive structure" is used to describe an interconnect structure for electrically coupling one or more interconnect pads, electrical connections, components, devices, modules, and semiconductor structures and devices. The conductive structure may include at least one of a micro via having a diameter which is between about one micrometer (μm) and about one-hundred fifty μm's and a sub-micron via having a diameter of less than about one μm.

As used herein, the term "via first" may be used to describe a micro via and/or a submicro via used to make at least one electrical connection between a first device layer and second device layer in a semiconductor structure including at least two device layers. Additionally, as described here, the term "via" first may also be used to describe a micro via and/or a submicro via passing through a dielectric material or layer (in some embodiments, only the dielectric material or layer) to make at least one electrical connection between a first device layer and a second device layer in a semiconductor structure including at least two device layers. For a via first process, the first device layer and the second device layer are completed separately. As one example, a partial via material is added on first and/or second opposing surfaces (i.e., top and/or bottom surfaces) of the first second device layers and subsequent bonding and/or post bonding process create a via first between the first and second device layers.

The via first may be filled with at least one metal or alloy having a high Coefficient of Thermal Expansion (CTE) to produce a rigid, robust, and conductive via first joint between the at least two device layers during the composite bonding process. High temperatures and/or high pressures may be applied and used to bond the two device layers and provide a three-dimensional (3D) interconnection (i.e., interconnect) among the device layers. The high CTE metal or alloy are expanded at relatively high temperatures and interdiffuse with each other to produce the 3D interconnect. Alternatively, the via first may be filled with a low temperature fusible metal which melts and interdiffuse during bonding or post bonding processes.

As used herein, the term "spacer" is used to describe a structure, or a combination of structures, to control spacing between a chip and a chip carrier and or protect the chip during flip-chip bonding and or when providing self-alignment marks on the chip. In one example, Gold or Aluminum wire act as a spacer to control indium bump height during flip-chip bonding. In another example, Gold or Al wire can create a wall (e.g., a 3D wall) to isolate specific devices. A 3D wall may, for example, provide isolation which is suitable for use in dielectric bridges. In one embodiment, an Al wire can make (or provide) a superconducting 3D wall.

In some embodiments, it is possible to create and use an Al and or Au wire for a spacer as well as inductor. The wire can be a 3D transmission line and or spiral and or solenoid inductor. A spacer may include at least one of a silicon, a deposited silicon, an etched silicon, a high resistive etched silicon, an oxide coated silicon, silicon dioxide, glass, etched and or deposited silicon nitride, annealed oxide, oxide etched recrystallized silicon, aluminum oxide, one or more metals and combinations thereof.

As used herein, the term "via last" is used to describe a micro via and/or a submicro via used to make at least one electrical connection between a first device layer and a second device layer in a semiconductor structure including at least two device layers. Fabrication of the first device layer is completed first, and the second device layer is deposited over the first device layer. The second device layer is completed with via last process. A pad layer which includes one or more interconnect pads may be added after via last process. In one embodiment, via last is filled. Additionally, in one embodiment, the via last can be unfilled or partially filled. Via last may pass through the device layers (e.g., second device layers) and, in some embodiments, one or more isolation layers or materials. A titanium (Ti) material having a thickness of about ten nanometers (nm) and, a metal organic chemical vapor deposition (MOCVD) Titanium Nitride (TiN) liner having a thickness of about five nm, and tungsten plugs may be used for via lasts. A MOCVD or chemical vapor deposition (CVD) $TiN_X$, with X less than or equal to 1, is preferred for better conformal coating.

As used herein, the term "through silicon via" (TSV) is used to describe a vertical interconnect which passes substantially through one or more of a silicon wafer, a silicon die, a silicon interposer, silicon active circuits, silicon passive circuits, or other silicon circuits, components or layers.

TSVs can be fabricated by different methods and approaches. In Silicon (Si) via-first approaches, for example, TSVs are fabricated prior to fabrication of active devices (i.e. bipolar or MOSFET devices) to which the TSVs may be coupled. The approach includes patterning the TSVs, lining the TSVs with a high temperature dielectric (thermal oxide or chemical vapor deposition), filling the TSVs with doped polysilicon and using chemical mechanical polishing (CMP) techniques to remove excess polysilicon from one or more surfaces of the TSVs. Si via-first approaches allow for the use of high temperature processes to insulate and fill the TSVs.

In Si via-middle approaches, TSVs are fabricated after forming the active devices to which the TSVs may be coupled, but before back end of line (BEOL) stack fabrication. The approach includes patterning the TSVs after a contact process, lining the TSVs with a low temperature dielectric deposition, and then filling the TSVs with single/multiple barrier metals. Typically the TSVs are filled with Copper (Cu) and/or W. For TSVs filled with Cu, a Cu seed layer is disposed on top of a barrier layer and a subsequent Cu electroplating fills the TSVs. The TSVs are then planarized using CMP techniques. For W, chemical vapor depositing (CVD) processes are used to fill the TSVs, and CMP techniques are used to remove excess polysilicon from one or more surfaces of the TSV. W is preferred for filling high aspect ratio TSVs (e.g., TSVs with aspect ratio of height-to-width >10:1). In general, Cu is used to fill low aspect ratio TSVs (e.g., TSVs with aspect ratio <10:1). Si via-middle process are useful for fabricating TSVs with a small via pitch, TSVs having minimal blockage of wiring channels, and TSVs having a low via resistance, for example.

In front side Si via-last approaches, TSVs are fabricated at the end of the BEOL processing of the wafer. Si via-last approaches are similar to Si via middle approaches, but Si via-last approaches use low temperature dielectric depositions (<400 C) compared to higher temperature dielectric compositions (<600 C) in Si via middle approaches. Front side Si via-last approaches may be suitable for their coarse TSV feature size, which simplifies the process of integrating TSVs into semiconductor structures. The front side Si via-last approaches may also useful for wafer-to-wafer bonding. In such approaches, TSVs can be formed at the end of the wafer-to-wafer bonding process, connecting multiple layers in the multi-layer (e.g., three-dimensional (3D)) stack of wafers or semiconductor structures.

Front side Si via-last approaches may use TSV etch as well as the entire BEOL dielectric stack. Backside Si via-last approaches also use wafer to wafer (or semiconductor structure to semiconductor structure) stacking. The wafers can be bonded together using oxide bonding or polymer adhesive bonding, either front-to-front or front-to-back. The wafers can be thinned by etching and or polishing. Additionally, a TSV may be formed in the wafers by etching a via down to bond pads on a top wafer and a bottom wafer. The process includes patterning the TSVs after the contact process, lining the TSVs with a low temperature dielectric deposition, and then filling the TSVs with a single/multiple barrier metal (e.g., Cu and/or W). The TSVs are then planarized through a subsequent CMP process.

A number of inorganic and organic dielectric materials having a thickness in a range of about one hundred nanometers (nm) to about one thousand nm can be used to insulate the TSVs. TSV dielectrics may be required to have good step coverage (at least 50% through the depth of the trench), good thickness uniformity (<3% variation across the wafer), high deposition rate (>100 nm/min), low stress (<200 MPa), low leakage current (<1 nA/cm2), and high breakdown voltage (>5 MV/cm).

Plasma-enhanced chemical vapor deposition (PECVD) of SiO2 or SiN, or sub-atmospheric chemical vapor depositions (SACVD) of SiO2, are some examples of insulator deposition. The most commonly used conductors to fill TSVs are doped polysilicon (180 Iohm-cm), tungsten (5.6 Iohm-cm), or copper (1.7 Iohm-cm). W deposited by CVD has a good fill of the TSV and can be integrated with the contacts to which the TSVs are to be coupled. A TiN liner is required to ensure that the WF6 precursor does not attack the Si substrate in the TSV. A disadvantage of W compared to Cu is that it has a high intrinsic stress (1400 MPa for W, 20 MPa for Cu). TSV can be superconducting during qubit operation. A superconducting TSV comprises a Titanium Nitride (TiN) and or poly Si and or Al and or high Q metal. TSV can be provided as a combination of titanium-titanium nitride-tungsten and/or titanium-titanium nitride-high Q materials-tungsten and or titanium-titanium nitride-high Q materials and or titanium-high Q materials-tungsten and or high Q materials-tungsten and or high Q materials, etc.

Reactive-ion-etching (RIE) may be used to create high aspect ratio TSVs and deep trench structures in the Si (i.e., for capacitors or for isolation) in which the TSVs are provided. In one embodiment, a TSV RIE Bosch process may be used to fabricate the TSVs, with process alternating between deposition and etching steps to fabricate deep vias. SF6 isotropic etching of Si may not be suitable for forming TSVs (which require a highly anisotropic etch). Fluorocarbon chemistry (e.g., C4F8) may be used for anisotropic etching achieved through the deposition of a chemically inert passivation on the sidewall of the TSVs.

Chemical mechanical polishing (CMP) may be used for planarization of metal filled vias (e.g., micro vias), for example. Additionally, a metal contact (i.e. pad) in an upper device layer (e.g., the second device layer) may be an annulus with an about a one point five micrometer (µm) opening that also functions as a self-aligned mask (e.g., hard mask) during the plasma etch of the oxide beneath it to reach a corresponding metal contact in a lower device layer (e.g., the first device layer). In order to fully dispose and electrically the via, the size of the metal contacts, and thus the pitch of the vertical interconnect, is made proportional to about twice the wafer-wafer misalignment of the wafers including the first and second device layers.

Figure 2:
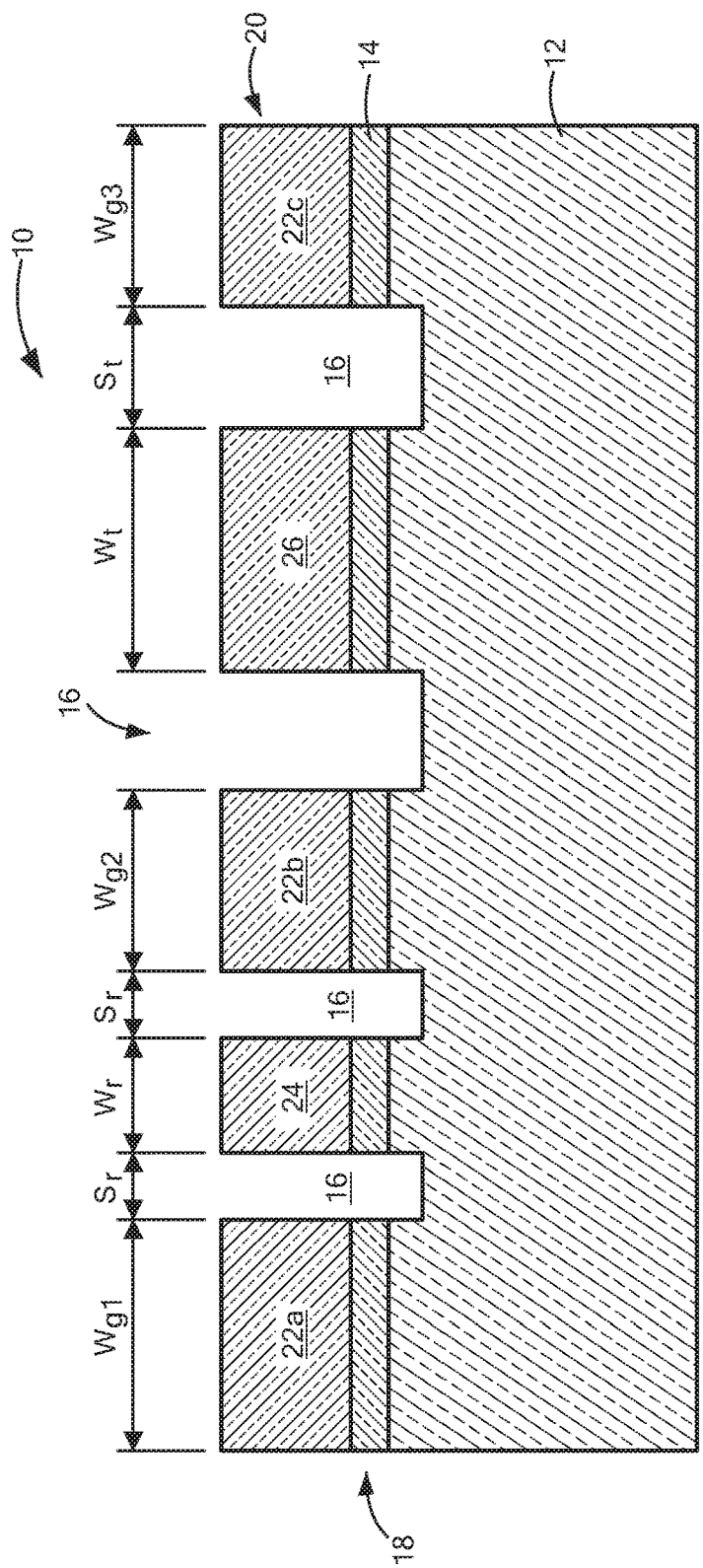
FIG. 2 is a cross-sectional view of the CPW resonator taking across lines 2-2 of FIG. 1.

Referring now to FIGS. 1 and 2 in which like elements are provided having like reference designations, a superconducting co-planar waveguide (CPW) resonator 5 includes a first portion 7 corresponding to a resonator-to-feed-line coupling portion and a second portion 9 corresponding to one end of the CPW resonator shorted to a ground plane. As may be most clearly visible in FIG. 2, the resonator-to-feedline coupling portion 7 comprises a substrate 12 having an optional buffer layer 14 disposed over a first surface thereof. Substrate 12 may be provided as a hydrogen and/or fluoride and/or nitride terminated substrate. Alternatively, substrate 12 may be provided having a native oxide layer. Alternatively still, substrate 12 may be provided from high resistive Silicon (Si) having resistivity in the range of 3 kilo ohm-cm to 20 kilo ohm-cm or higher, or as a high purity Si substrate or as an oxide coated substrate or a sapphire substrate. It should be appreciated that, in general, a high resistive silicon or sapphire is good for lower loss.

A plurality of trenches 16 are formed or otherwise provided in the substrate and buffer layer to define a plurality of raised regions (or islands) 18. A conductive layer 20 is disposed over optional buffer layer 14 in the raised regions to provide conductors 22a-22c, 24, 26. The conductive layer may be provided from a high Q metal such as titanium nitride (TiN) which forms the resonator-to-feed-line portion of the CPW structure 7. Trench depth can be in the range of 10 nm to 100 microns. It is further possible to increase trenches to few hundred microns depending upon substrate thickness. Trench can have same buffer layer as buffer layer 14 or it can have a different buffer layer. For example, trenches can have oxide and/or hydroxide and/or fluoride and/or chloride based buffer layer when the trenches are formed during resonator patterning through the silicon nitride buffer layer 14. The trenches can have the same buffer layer as 14 when trenches are formed prior to buffer layer 14 and conductive layer 20 deposition. It is further possible to use hydrogen and/or fluoride and/or nitride terminated trench or trench with native oxide.

In one example, high-Q resonator films were deposited on 50-mm C-plane sapphire and or Si wafers. The wafers were cleaned in piranha solution (sulfuric acid and hydrogen peroxide) prior to loading into the deposition system. The wafers were annealed in the deposition system at RT-900 C to facilitate outgassing and sapphire surface reconstruction, after which 250 nm of aluminum and or other Q material was deposited at a growth rate of about 0.025 nm/s and a substrate temperature of 150 C. The high-Q aluminum was patterned (contact lithography and wet-etching and or dry etching) into the following device features: shunt capacitors, coplanar waveguide (CPW) resonators, ground planes, and optical alignment marks.

In particular, the conductive layer 20 forms a CPW ground plane 22 (with ground plane portions 22a, 22b, 22c having widths $W_{g1}$, $W_{g2}$, $W_{g3}$ visible in FIG. 2), a resonator center line 24 having a width $W_r$ disposed between and spaced apart from ground plane portions 22a, 22b by a distance $S_r$ and a feed line 26 having a width $W_t$ and disposed between and spaced apart from ground plane portions 22b, 22c by a distance $S_t$. The length of the capacitor elbow is Ic and the distance between through line gap and the capacitor elbow gap is gc. The width of center conductor (feedline) is wt, resonator center line width is $W_r$, the gap between the center conductor and the ground is $S_t$.

It is, of course, also possible to form the planar geometry of a capacitively coupled CPW resonator where the resonator is formed via a center conductor having a width W, separated from the lateral ground planes by a gap having a width S. Resonators with various center conductor lengths l aiming to design fundamental frequencies $f_0$ in the GHz range (1-10 GHz) may also be used. The center conductor is coupled via so-called "finger capacitors" to the input and output transmission lines. To achieve larger coupling, finger capacitors formed from single or multiple pairs of fingers with appropriate length $L_f$, width $w_f$, and separation $S_f$ may be used. It is further possible that the center conductor is coupled via gap capacitors to the input and output transmission lines. For small coupling capacitances of gap capacitors with appropriate widths $W_g$ should be used.

Feed line 26 is used for excitation and readout. The length of meandered CPW resonator line 24 can be adjusted for a specific fundamental frequency. Design parameters used to make such a frequency adjustment include, but are not limited to a length $I_c$ of capacitor elbow portion 28 of the CPW resonator structure and a distance between an edge of a through line gap 29 and an edge of a resonator gap 30 $g_c$ as well as a width $w_t$ of feed line 24 and the width $s_t$ of the gap between an edge of the feed line 24 and an edge of the ground plane region 22c.

It should, of course, be appreciated that the CPW resonator described in conjunction with FIGS. 1 and 2 is merely one example and that other resonator structures may also be used.

The increasing interest in resonators related to qubit design has been caused by improvements in performance provided by coplanar waveguide (CPW) resonators described herein. In contrast to lumped element resonators which comprise lumped element capacitors and/or inductors coupled either in a parallel or a series geometry, CPW resonators simply comprise a stripline between two groundplanes. The energy stored in a resonator is determined by its resonance frequency f0 and the number of the stored photons n (E=nhf0). CPW resonators may thus be provided having a well defined resonance frequency characteristic as well as a well-defined coupled quality factor characteristic. The resonance frequency is controlled by the resonator length and its loaded quality factor is controlled by its capacitive coupling to input and output transmission lines. Strongly coupled (i.e., overcoupled) resonators with accordingly low quality factors are ideal for performing fast measurements of the state of a qubit integrated into the resonator. On the other hand, undercoupled resonators with large quality factors can be used to store photons in the cavity on a long time scale, with potential use as a quantum memory.

The coplanar waveguide resonator (CPW) 5 thus comprises a strip that may be meandered depending upon the length. The strip may be either shorted to ground ($\lambda/4$) or open ended ($\lambda/2$-resonator). The resonance frequency for such a resonator is determined by its length and the light velocity in the material. A series of CPW resonators with different frequencies can be measured by using a single feedline. In one embodiment, the resonator shorts to a ground plane at one end, and capacitively couples to a through line at another end. It is possible to combine air bridges and or crossovers and CPW capacitors to increase coherence. It is further possible to use Squid shunted with CPW. It is further possible to use capacitively coupled CPW.

Processing then continues by depositing a resonator thin film over the buffer layer 46. A photo resist layer is then patterned over the thin film layer 50 and the resonator thin film layer and/or buffer layer and/or substrate portions are etched 52. Either positive or negative resists may be used and either wet or dry etch techniques may be used. The resist is then removed and the thus formed resonator may then be cleaned.

In one example, photoresist can be provided as AZ1512 deposited by spin coating at 4000 RPM to create 1.2 micron thick resist. Resist baked at 105 degree Celsius for 2 minutes and exposed at around 60 mJ/cm$^2$. In one example, 2 minutes in MIF917 can develop the resonator feature. A 7 minute etch with CF4/O2 (15 sccm:1 sccm) at 10 mTorr at 250V (~38 W) is good for etching 50-70 nm TiN film. It is further possible to use BCl$_3$/Cl$_2$ based plasma etch for TiN. It is possible to use dry stripping of resist using O$_2$/N$_2$/H$_2$O at around 150 degree Celsius at 2000 motor pressure. It is further possible to use single or multistep wet etching and or stripping. Act935 and or Hot acetone (40 C) and or Aleg380 can be used for etching as well as resist stripping process. It is further possible to use oxygen-helium and/or forming gas and/or atmospheric and/or argon and/or hydrogen-helium plasma to clean the residual organic from resonators.

Figure 3:
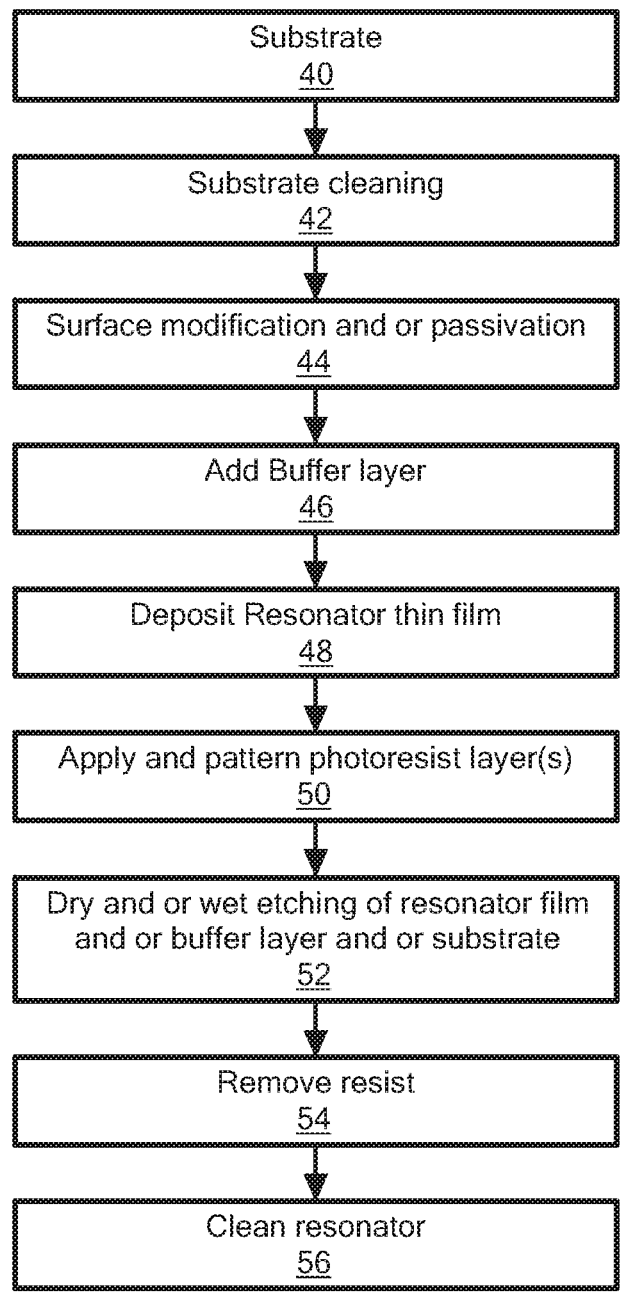
FIG. 3 is a flow diagram illustrating a process for fabricating a CPW resonator.
Figure 3A:
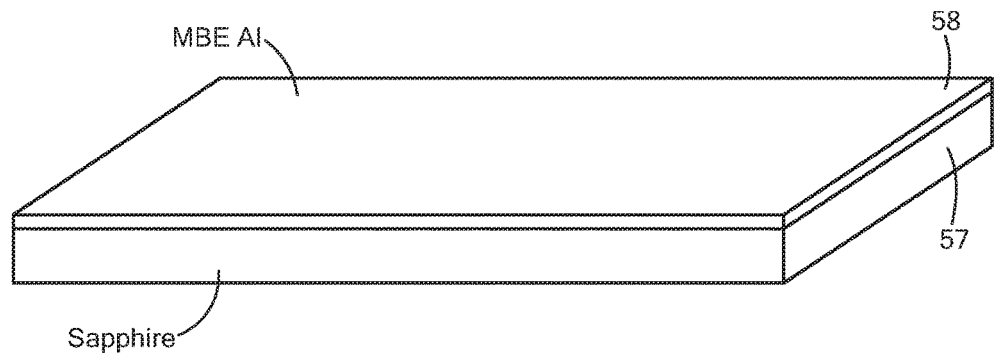
FIG. 3A is an isometric view of a sapphire substrate having a high Q metal disposed thereover.
Figure 3B:
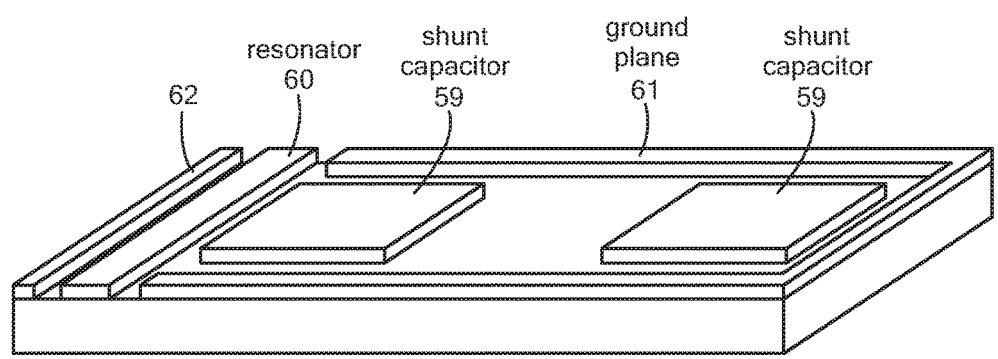
FIG. 3B is an isometric view of a sapphire substrate having an MBE aluminum patterned to provide a capacitor.
Figure 3C:
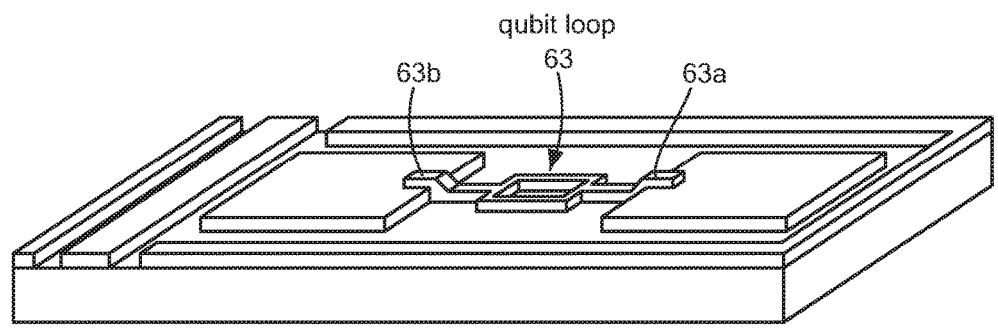
FIG. 3C is an isometric view of an aluminum qubit loop which contains three aluminum Josephson junctions.

In one particular process flow example and with reference to FIGS. 3A-3C in which like elements are provided having like reference designations, film 58 having a high Q characteristic (so-called "high-Q films") was deposited on 50-mm outgassed C-plane sapphire substrate 57 (e.g. a sapphire wafer). It should, of course, be appreciated that in alternate embodiments Si or other substrate materials may be used. The wafers were cleaned in piranha solution (sulfuric acid and hydrogen peroxide) prior to loading into the deposition system. The wafers were annealed in a deposition system at RT-900 C to facilitate outgassing and sapphire surface reconstruction, after which 250 nm of aluminum was deposited (e.g. using a molecular beam epitaxty (MBE) technique) at a growth rate of 0.025 nm/s and a substrate temperature of 150 C (FIG. 3A). Although aluminum was used in this particular example, it should be understood that other high Q materials may also be used.

As shown in FIG. 3B, the high-Q aluminum was patterned (e.g. using contact lithography techniques and wet-etching and/or dry etching techniques) or otherwise processed to provide device features including, but not limited to, shunt capacitors 59, coplanar waveguide (CPW) resonators 60, ground plane 61 surrounding the capacitors, and optical alignment marks 62. In this illustrative embodiment, capacitors 59 are shown having a square, shunt capacitor geometry. Those of ordinary skill in the art will appreciate, of course, that capacitors may be formed having a wide variety of different geometries selected to suit the needs of a particular application.

As shown in FIG. 3C, an aluminum qubit loop 63 is then patterned or otherwise provided such that first and second connection points 63a, 63b electrically contact the shunt capacitors 59. In this illustrative example, qubit loop 63 is provided having three Josephson junctions 64a, 64b, 64c with two Josephson junctions 64a, 64b disposed on one side on the loop 63 and a single Josephson junction 64c disposed on a second, opposite side of the loop.

A Josephson junction is defined as two superconductors allowed interacting through a so-called "weak link," where the "weak link" may be provided from a thin insulating barrier, a normal metal, or a narrow superconducting constriction—respectively referred to as an S-I-S, S-N-S, or S-C-S junction. A supercurrent flows/tunnels through this weak link, even in the absence of a voltage. The critical current of the junction is related to the superconducting gap of the electrode materials as well as the type and thickness of the insulating barrier. It is often characterized by a critical current density Jc and the area A of the junction such that Ic=Jc×A.

Josephson tunnel junctions are formed by two superconducting electrodes separated by a very thin (~1 nm) insulating barrier. In this configuration, the collective superconducting order of one electrode (parameterized by a phase $\varphi_i$) coherently connects with that of the other electrode ($\varphi_2$) via the elastic tunneling of Cooper pairs through the barrier. The resulting supercurrent, l, and junction voltage, V, are related to the superconducting phase difference, $\varphi=\varphi_1-\varphi_2$, across the junction In one illustrative embodiment, the qubit loop and Josephson junctions were formed using double-angle evaporation of aluminum through Dolan-style bridges. The free-standing bridges were realized using a bilayer mask comprising a germanium hard mask on top of a sacrificial MMA/MAA layer [MicroChem methyl methacrylate (MMA (8.5)/MAA EL9)]. The qubit loop and junctions were patterned using electron-beam lithography (Vistec EBPG5200) and ZEP520A resist (ZEON-REX Electronic Chemicals). This pattern was transferred into a Germanium (Ge) layer using a CF4 plasma, and the underlying MMA/MAA resist was under-etched using an oxygen plasma to create free-standing bridges. Prior to the aluminum evaporation, ion milling was used to clean exposed contact points on the MBE aluminum and or titanium nitride to ensure superconducting contact with the evaporated aluminum. In one embodiment qubit loop formed on top of resonator surface.

The qubit loops and junctions were realized with two separate angle-evaporated aluminum layers (formed between the two aluminum evaporation steps), static oxidation conditions were used to prepare junctions having an appropriate critical current density. In one embodiment qubit loop is provided as a relatively large Al—AlO$_x$—Al junction having characteristics similar to a superconducting wire during device operation. It is further possible that at least part of the qubit loop can have junction oxide sandwiched between Al metal layers. Oxide can be partially and or fully separated Al loop metal layers. It is possible to use Poly methyl methacrylate and or acrylate based resist and or Poly butene-1-sulphone based resist instead of ZEP. It is further possible to use epoxy copolymer of glycidyl methacrylate and ethyl acrylate based negative resist and or 3 components (base polymer, an acid generator, and a crosslinking agent) based negative resist can be used instead of ZEP.

The materials and techniques described herein enable fabrication of TiN superconducting CPW resonators having internal quality factors above $10^7$ at high powers and over $10^6$ at low power single photon regime from two different sputtering systems (Sigma and Endura systems). The materials and techniques described also result in cross-wafer reproducibility. That is, resonators made from two different tools (i.e. Sigma and Endura tools) showed consistency across wafers with low power Qi's over a million over the entire wafers. Furthermore, materials and techniques described herein result in wafer-to-wafer reproducibility. For example, both Sigma and Endura tool produces resonators from new wafers show low power Qi's over a million.

The materials and techniques described herein are also capable of depositing High Q TiN on an eight inch (8") wafer and are capable of generating high Q from various TiN film thickness. In one example, when Sigma tool used 6-12 kW deposition power, 150-450 degree Celsius deposition temperature, 15-33 sccm Ar flow, 90-100 sccm Nitrogen flow to produce very low stress in the range of 90-100 Mega pascale around 140-150 nm Titanium nitride with sheet resistance 3-25 ohms/square to produce best possible low power average Q in the range of 1-5 Million. It is further possible to use $Si_3N_4$ (SiN) buffer layer under the TiN. In one example, silicon nitride is a low-stress $Si_3N_4$.

In another example, Endura can produce very high compressive stress and or tensile stress in the range of 0.5-4 giga Pascale when deposited at around 200 degree Celsius produce around 65-75 nm titanium nitride with sheet resistance 9-30 ohms/square to produce best possible low power average Q in the range of 1-3 million. The intrinsic quality factor (Qi) of TiN resonators can vary by changing width and gap. Here gap may be defined as a spacing between the resonator center line and the ground plane; width may be defined as a width of the resonator center line. In one example, average low power Q from low stress TiN resonators from resonators with gaps/widths (gap is the spacing between the resonator center line and the ground plane; width is the width of the resonator center line) of 5 μm/10 μm, 8 μm/16 μm and 11 μm/22 μm respectively with single-photon Qi's over 1 million.

Referring now to FIGS. 4 and 4A in which like elements are provided having like reference numbers throughout the several views, a semiconductor structure 65 comprises a substrate 66 having a high Q metal 67 disposed over portions of a first surface thereof. Substrate 66 may be provided as a hydrogen and/or fluoride and/or nitride terminated substrate. Alternatively, substrate 66 may be provided having a native oxide layer. Substrate 66 may also be provided as a silicon ($S_i$) substrate having a high resistivity characteristic or as a high purity $S_i$ substrate or as an oxide coated silicon substrate. Substrate 66 may also be provided as a sapphire substrate. Preferred substrates are annealed, recrystallized, and smooth (around 5 angstrom substrate roughness) so as to help to produce high quality film on the substrate surface. A layer of aluminum 66 is disposed over the first substrate surface and over the high Q metal portions 67. An aluminum junction 68 is formed using aluminum oxide (Al Ox; x=0.1-1.5).

Thus, the structure of FIGS. 4, 4A may be used as a building block or as a portion of a building block of a passive or active superconducting circuit. A Josephson junction 64 which may be the same as or similar to Josephson junctions 64a-64c described above in conjunction with FIG. 3C, is formed between the two regions of high Q material 67 (e.g. TiN) coupled by a superconducting trace 69. Prior to depositing superconducting trace 69, ion milling was used to clean exposed contact points on the 67 to ensure superconducting contact with the 69. It is further possible that the contact resistance between region 67 and superconducting trace 69 becomes superconducting during operation due to proximity. As will be described below in conjunction with FIGS. 7-7F variants of such a circuit structure may also be used.

Figure 5:
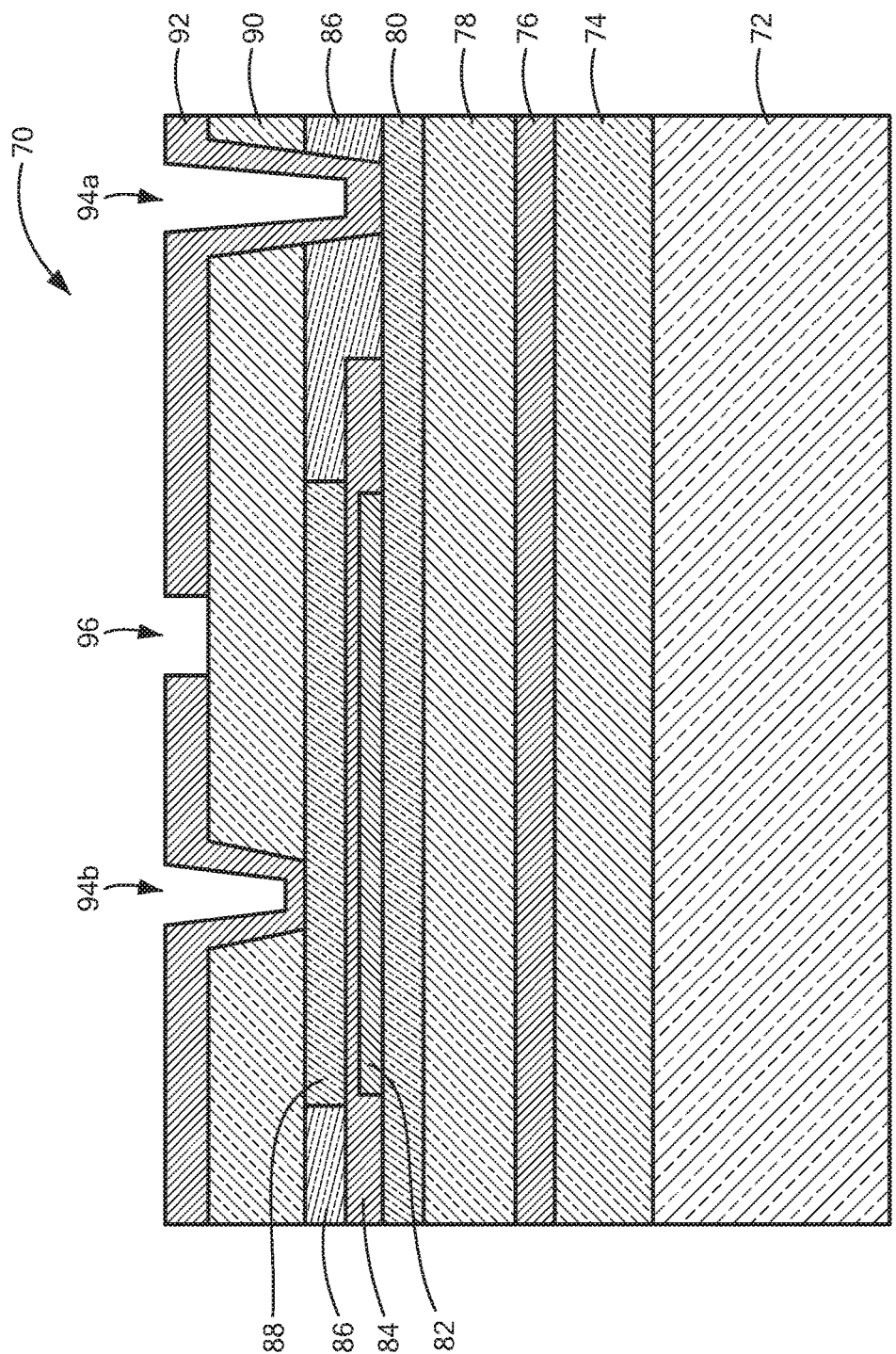
FIG. 5 is a cross-sectional view of a capacitor and a shunted nobium junction.

Referring now to FIG. 5, a super conducting IC 70 comprises a substrate 72 having an oxide layer 74 formed or otherwise disposed thereover. A high Q metal layer 76 is disposed over the oxide layer. A second oxide layer 78 is disposed over the high-Q metal layer 76. A nobium layer 80 is disposed over the second oxide layer 78.

An aluminum layer 82 is disposed over niobium or portions of nobium layer 80 and an aluminum oxide layer (AlOx) 84 is formed or otherwise disposed over aluminum layer 82 and portions of nobium layer 80.

A second nobium layer 88 is disposed over the AlOx (x=0.1-1.5) layer 84 so as to form a nobium junction. An anodized nobium oxide layer (NbOx) 86 is disposed over an AlOx layer 84 and portions of the nobium layer 80 so as to protect the nobium junction. A third oxide layer 90 disposed over the NbO$_x$ layer 86 and second nobium layer 88. A conductor 92 is disposed using either an additive technique (e.g. sputtering) or a subtractive technique (e.g. etching) and one or more conductive vias 94a, 94b may be formed or otherwise provided in the structure 70.

Openings 96 may also be formed or otherwise provided in conductive layer 92 (e.g. via an etching technique or via a masking and lift off technique). Conductive via 94a is formed or otherwise provided to contact the first nobium layer 80 while conductive via 94b is formed or otherwise provided to contact the second nobium layer. In one example, at least one of conductive via (94a, 94b) and/or conductive pad (92) and/or superconducting trace (76) include at least titanium nitride and or other high Q material.

A stack comprising layers of Nb/Al-AlOx-Nb can be used as a Josephson junction. Such a junction stack can be grown immediately after removal of native oxide from a bottom niobium electrode of the stack. A clean junction interface is desirable for realizing a robust and repeatable high-critical current junction. For this reason, it is sometimes preferable to first mill the sample to ensure that the surface is clean of native oxide inside the junction via. Next, a thin layer of aluminum is grown (about 8 nm) at low power. A thin aluminum layer won't uniformly cover the niobium, while a thick aluminum layer runs the risk of shorting out the junction by covering the via-step. Next, oxygen is introduced into the chamber to form the tunnel barrier. Initially, the chamber is seeded with a 1 mTorr oxygen flow for two minutes. The gate valve is then closed, allowing the oxygen pressure to rise to the target value. The sample is held in the oxygen atmosphere for 10 minutes, after which the oxygen is pumped out. A 4-12 nm cap of aluminum is deposited, directly followed by 100-200 nm of niobium.

The junction oxidation is the most variable part of a superconducting low-inductance undulatory galvanometer (SLUG) fabrication process. The critical current of the junctions is set, at least in part, by the oxidation exposure, which is the product of the oxygen partial pressure and the time. The critical current density (JC, critical current per junction area) scales inversely with the square root of exposure. It is possible that Nb-junction (Nb/Al-AlOx-Nb) may be fabricated on a silicon substrate with a 500 nm layer of thermal $SiO_2$. In one example, Josephson junctions are defined using 193 and or 248 nm optical lithography (stepper, 5× reduction) and subtractive dry etching of the Nb/Al-AlOx/Nb trilayer where AlOx dielectric layer sandwiched between a bottom superconductor material layer (Nb/Al) and a top superconductor material layer (Nb).

It is further possible to use a thermal hardening process on the Josephson junction trilayer to control diffusion of the dielectric layer into the bottom superconductor material layer and the top superconductor material layer, and etching openings in the Josephson junction trilayer to form one or more Josephson junction qubits. In one embodiment, an AlOx dielectric layer may have etchant constituent predominately at the junction edge. Anodization of the lower Nb layer forms a thin NbOx protective layer around the junction. The inter-layer dielectric is a low-temperature PECVD silicon oxide deposit to embed the entire junction. The electrical connections between the lower and upper Nb wiring layers are formed using superconducting vias. Parallel-plate capacitors are formed implicitly where the upper and lower metallization layers overlap due to the intermediate PECVD and NbOx layers.

An additional high-capacitance structure can be formed by creating a via from the upper metallization layer to the anodization layer. Electrical contact is made to the chip through titanium/platinum/gold bond pads. Anodizing Nb—Al—$AlO_x$ will result in Nb—$NbO_x$—$AlO_x$— $NbO_x$. It is possible to have $NbO_x$ presence in $AlO_x$ (x=0.1-1.5) layer and similarly it is also possible to present $AlO_x$ in the $NbO_x$ layer. Addition of oxide on anodized Nb—Al—$AlO_x$ layer will produce $NbO_x$— $AlO_x$_$NbO_x$—$SiO_x$. It is also possible to present $Nb_ySi_{(1-y)}O_x$ between $NbO_x$ and $SiO_x$ layer. Anodized produce porous niobium oxide and addition of PECVD oxide creates intermixing at the niobium oxide and PECVD oxide interface.

In yet another aspect of the concepts described herein, a method is provided of forming Josephson junction qubits. The method comprises depositing a first superconductor material layer (Nb—Al) over a substrate, forming a dielectric layer over the first superconductor material layer (Nb—Al—$AlO_x$), and depositing a second superconductor material layer(Nb) over the dielectric layer. The first superconductor material layer, the dielectric layer and the second superconductor material layer form a Josephson junction trilayer.

It is further possible to use Al layer instead of Nb. The method further comprises annealing the Josephson junction trilayer in an inert environment at a temperature between about 150° C. to about 400° C. for a time period between about 10 minute to about 120 minutes to control diffusion of the dielectric layer into the first superconductor material layer and the second superconductor material layer. It is possible to use multiple etching. First etching will etch top superconductor and stop at oxide layer. Second etching step will etch oxide and bottom superconducting layer and thus etching Josephson junction trilayer of entire substrate form one or more Josephson junction qubits.

It further possible that embedded Josephson junction qubits are arranged on a superconducting substrate and each qubits comprise a Josephson junction trilayer where a superconductor base layer of Josephson junction position on top of ground and large superconducting plane separated by thick (40 nm-400 nm) oxide dielectric. It is further possible to use one or more embedded Josephson junctions where a Josephson junction is sandwiched between a bottom superconductor material layer and a top superconductor material layer and the Josephson junction is separated from top and bottom superconducting layer by oxide dielectric. In some embodiments, at least one superconducting layer comprises of consists of titanium nitride.

Figure 6:
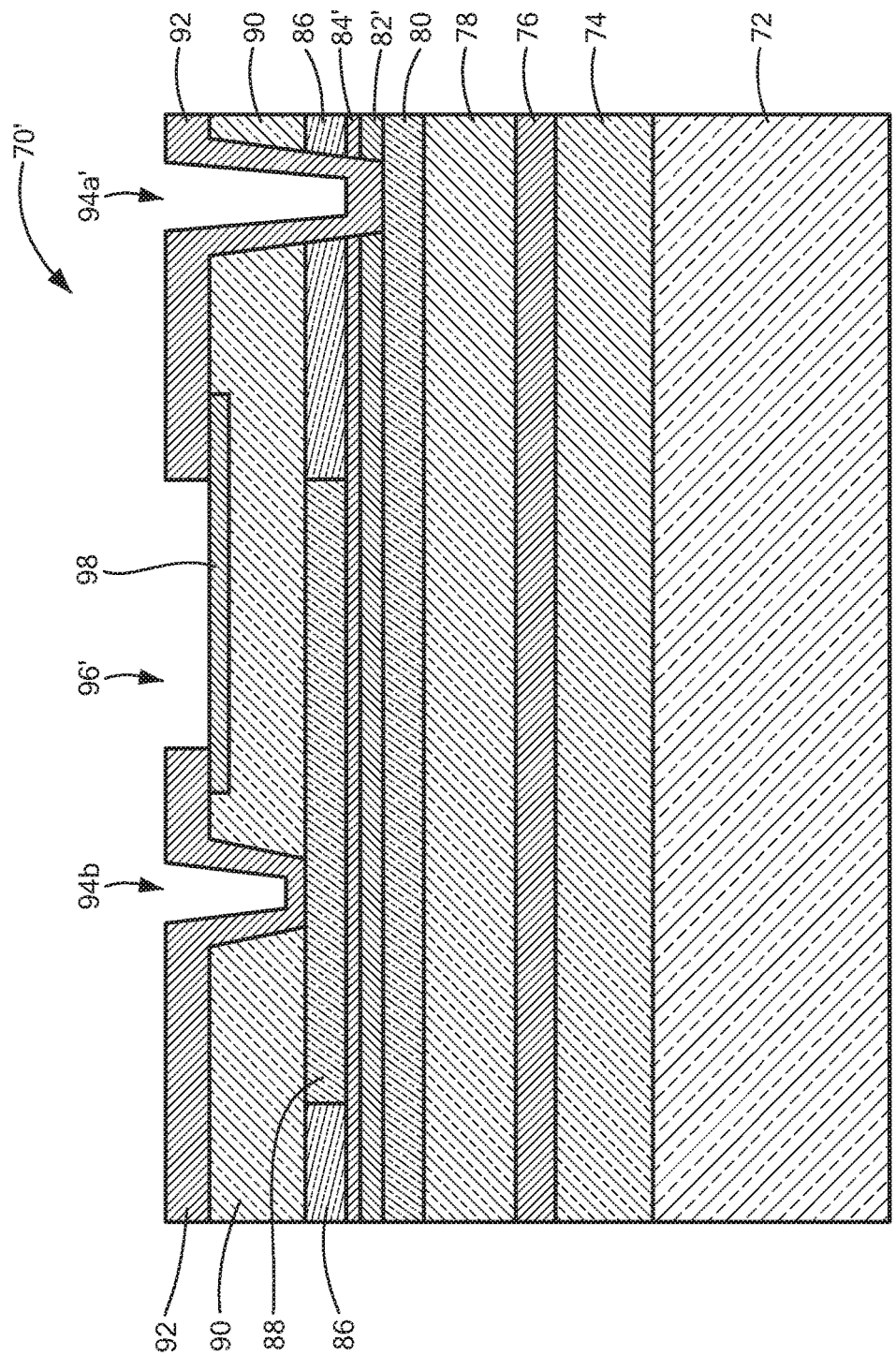
FIG. 6 is a cross-section view of a capacitor and a resistively shunted nobium junction.

Referring now to FIG. 6 in which like elements of FIG. 5 are provided having like reference designations, a superconducting IC 70' includes an aluminum layer 82' disposed over an entire portion of niobium layer 80 deposited on top of niobium layer 82 and an aluminum oxide layer 84' is disposed over an entire portion of aluminum layer 82'. The second niobium layer 88 are disposed over the AlOx layer 82' and selectively etched. Anodization of niobium layer 80 in presence of Al layer 80 and the AlOx layer 82' produce anodized niobium oxide layer 86. The PECVD oxide layer 90 is disposed over the NiOx and Nb layers 86, 88. In another example, anodization of niobium layer 80 and cross section of niobium layer 88 in presence of Al layer 80 and the AlOx layer 82' produce niobium oxide layer 86 which covers entire bottom niobium layer 80 and cross sectional area of top niobium layer 88.

In this illustrative embodiment, a conductive via 94a' is formed or otherwise provided through oxide layer 90, NbOx layer 86', AlOx layer 84', Al layer 82' and contacts Nb contacts AlOx layer 88 as in FIG. 5.

In open region 96' a resistor 98 is formed or otherwise provided between the two conductive vias 94a', 94b. The resistor can be embedded in the oxide and connected with pad 92 by a superconducting micro-via. The via and micro-via can be filled, partially filled with single and or multilayer superconducting materials. In one example, a Nb/Al-$AlO_x$/Nb tri-layer utilizes 248-nm and 193-nm photolithography and planarization with chemical-mechanical polishing (CMP) for wiring-layer feature sizes down to 200 nm and Josephson junction diameters down to 250 nm.

The process uses Nb superconducting layer, Pt or Mo based resistance layers and Nb and or TiN and or high Q metal based superconducting interconnects between all metal and resistor layers. Interconnects are etched and vias filled with the niobium metal and or titanium nitride and or high Q metal of the subsequent superconducting layer. The process uses superconducting circuits with a single and or multiple Josephson junction layer. Metal wiring layers are separated by dielectric, and vias are used to interconnect layers to form circuits. A separate resistive layer is deposited and patterned for shunt resistors. Chemical mechanical planarization (CMP) is employed at various steps in the process to maintain yield and uniformity. Superconducting integrated circuit requires under bump metal pad for flip chip bonding with SMCM. These pads are composed of 20 nm of Ti (adhesion layer), 50 nm of Pt (barrier layer) and 150 nm of Au.

It should be noted that like elements of FIGS. 5, 6 and 7-7F are provided having like reference numerals throughout the several views.

Turning now to FIG. 7, a circuit 100 which corresponds to a building block or part of a building block of a passive or active superconducting circuit includes a pair of Josephson junctions 102a, 102b disposed in separate legs 103a, 103b of superconducting traces 104 coupled between two regions 64 of high Q material (e.g. TiN). In one example, Josephson junctions 102a, 102b and superconducting traces 104, 103a, 103b are patterned using single photolithography process. In another example, 64 made with titanium nitride and superconducting traces 104, 103a, 103b use sputtered and or evaporated and or MBE aluminum. It is further possible, all the superconducting traces 64, 104, 103a, 103b use sputtered and or evaporated and or MBE aluminum.

Referring now to FIG. 7A, a plurality of Josephson junctions 102b, 102c are disposed in a leg 103b which is provided by superconducting traces 104. A ground plane 106 is disposed about the Josephson junctions 102a-102c and a resonator 108 is formed or otherwise provided at one end of the structure 105 proximate one of the high Q metal regions 64. In one example, resonator 108, ground plane 106 and capacitor 64 are patterned using single photolithography process. In another example, 64, 106, 108 are made with titanium nitride and superconducting traces 104, 103a, 103b use sputtered and or evaporated and or MBE aluminum. It is further possible, all the superconducting traces 64, 106, 108, 104, 103a, 103b use sputtered and or evaporated and or MBE aluminum.

Referring now to FIG. 7B, resonators 108a, 108b are formed or otherwise provided at each end of structure 105'.

Referring now to FIG. 7C, a structure 110 corresponding to a building block or part of a building block of a passive or active superconducting circuit includes bias lines 112, 114. The bias lines 112, 114 may be provided as "on chip" or "off chip" bias lines. Using superconducting lines can reduce, and ideally eliminate, resistance and associated heat generation during circuit operation, thus improving qubit chip characteristics.

Figure 7D:
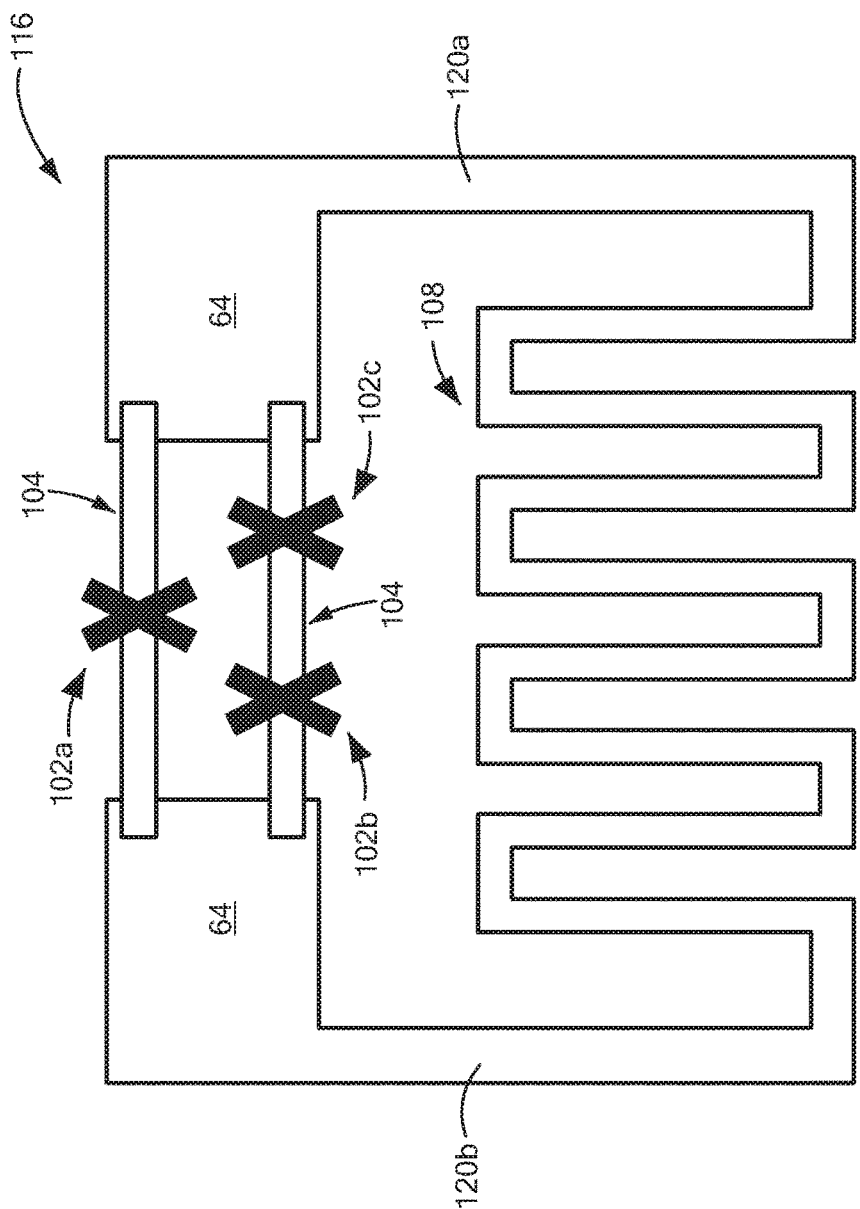
FIG. 7D is a plan view of a building block of a passive or active superconducting circuit having an inductor having a plurality of Josephson junctions.

Referring now to FIG. 7D, a structure 116 which may, for example, correspond to a building block or part of a building block of a passive or active superconducting circuit includes an inductive element 108 coupled between respective ends of paths 120a, 120b formed or otherwise provided from a high Q metal (e.g. TiN). Paths 120a, 120b extend between high Q metal regions 64 and inductive element 118 to provide a superconducting circuit having an inductive characteristic. In one example, inductive element 108 can use separate superconducting material (e.g. Niobium nitride) and a separate photolithographic process may be used to pattern the inductive element.

Figure 7E:
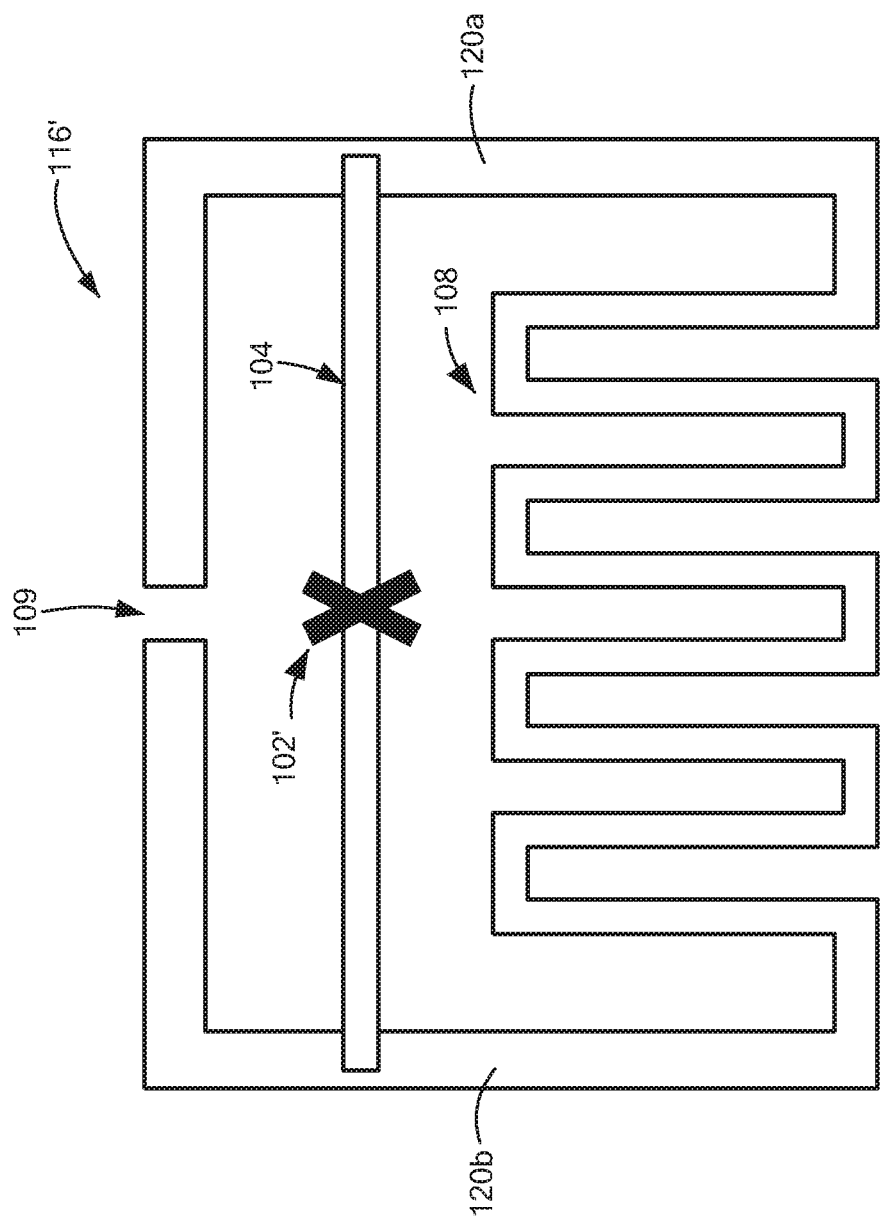
FIG. 7E is a plan view of a building block of a passive or active superconducting circuit having an inductor and a single Josephson junction.

Referring now to FIG. 7E a structure 116' which may, for example, correspond to a building block or a portion of a building block of a passive or active superconducting circuit includes an inductive element 108 and a capacitive element 109 each having first and second terminals coupled to respective ends of signal paths 120a, 120b. A single Josephson junction 102 is coupled between signal paths 120a, 120b provided from a high Q metal. Thus, a superconducting structure having capacitive and inductive characteristics is provided.

Figure 7F:
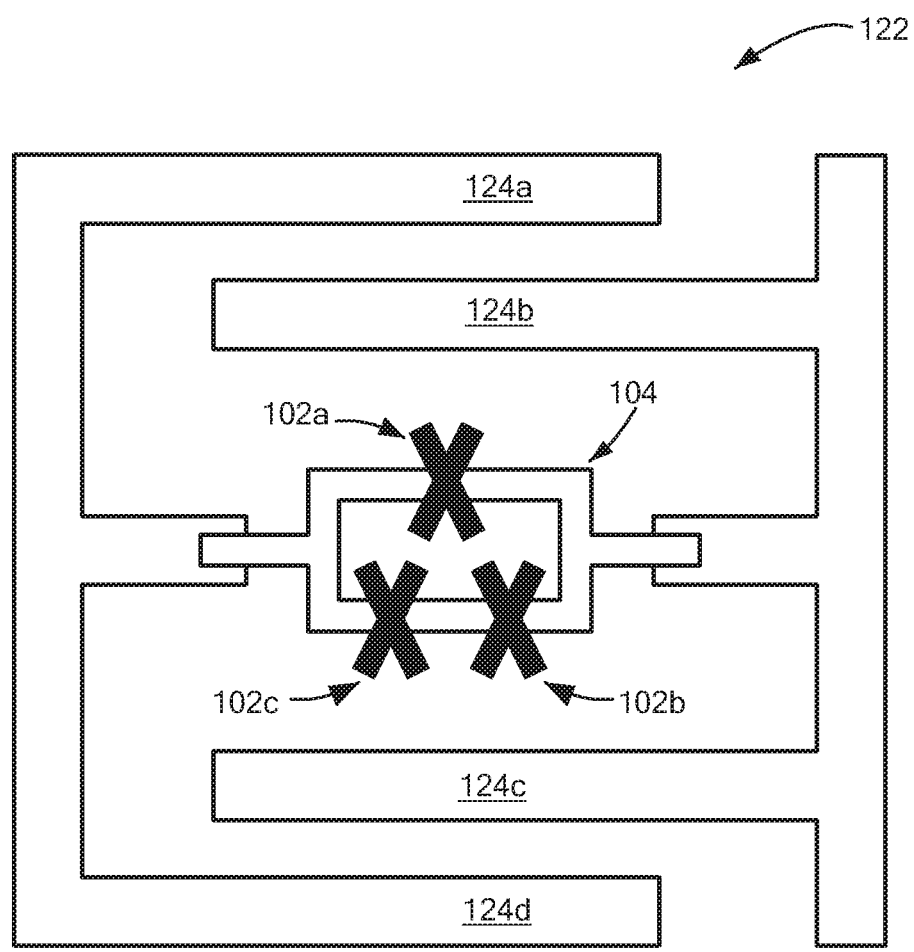
FIG. 7F is a plan view of a building block of a passive or active superconducting circuit having an inter digital capacitor.

Referring now to FIG. 7F, a structure 122 which may, for example, correspond to a building block of a passive or active superconducting circuit includes a plurality of inter digitated paths 124a-124d provided from a high Q metal material. First ones 124a, 124c of paths (or fingers) 124a-124d project from a first base structure 126 and second ones of paths 124b, 124d project from a second base structure 126b. The capacitance of the inter digital capacitor structure depends at least in part upon the finger base width, finger lengths, finger widths and number of fingers. FIG. 7-7F corresponds to various building blocks or parts of a building block of passive or active superconducting circuit combinations. In one example, at least portions of FIGS. 7-7F may be utilized to as part of a circuit for superconducting qubit coupled to a parallel or series LC oscillator, JJ coupled to parallel or series LC oscillator, capacitively coupled qubits, Qubit coupled to electromagnetic resonator, superconducting qubit coupled to coplanar waveguide resonator where the resonator is capacitively coupled to RF transmission lines, qubit is coupled via a capacitance etc. In another example, at least portions of FIGS. 7-7F describe part of circuit for an amplifier to perform high-fidelity qubit readout.

Figure 9:
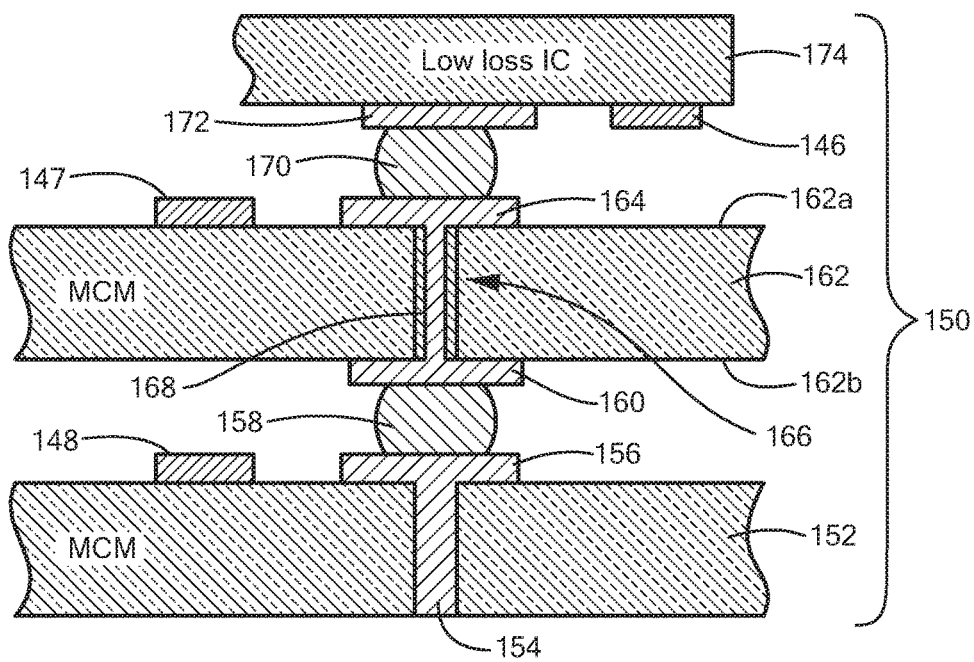
FIG. 9 is a low loss superconducting flip-chip structure having an intermediate substrate coupled between an MCM and a low loss integrated circuit.
Figure 9A:
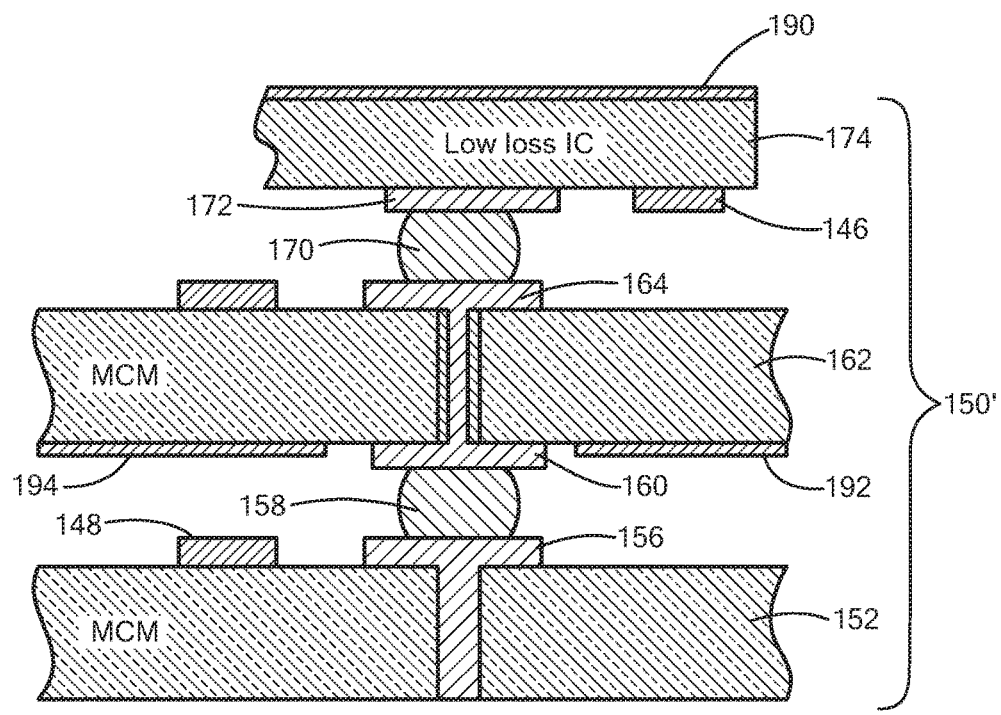
FIG. 9A is a low loss superconducting flip-chip structure having an intermediate substrate coupled between an MCM and a low loss integrated circuit and having a high Q metal shielding.

Described in conjunction with FIGS. 8-9A is an integrated approach to provide 3D constructions on various qubit die package configurations using a flip-chip superconducting interconnect technique. This approach is suitable for high-end electronics where part of a package, if necessary, can be replaced, repaired, or even upgraded without compromising overall electrical performance. Such replacement, repair or upgrade may be desirable for cost reasons, for example (e.g. it may be more cost effective to replace, repair or upgrade only a portion of the electronics rather than replace the entire electronics package). The interconnect methodology described herein may also be desirable for a range of superconducting applications since the techniques described herein make it possible to integrate non-superconducting and superconducting ICs. Thus, the interconnect methodology described herein facilitates integration of heterogeneous technologies and components on the same SoC platform.

Referring now to FIGS. 8 and 8A in which like elements are provided having like reference designations, a plurality of low loss superconducting integrated circuits (LLSICs) 130a-130d are coupled through respective ones of superconducting inter connects 132a-132p and respective ones of superconducting signal paths generally denoted 134 to a substrate 136. Superconducting interconnects may be provided from any suitable material including, but not limited to, those materials described above in connection with the definition of a superconducting interconnect. Substrate 136 may be provided, for example, as a superconducting multi-chip module (SMCM) substrate or as any suitable under bumpy metal (UBM) substrate. Substrate 136 may, in turn, be disposed over an optional second substrate (or carrier) 138. Signal paths 134 provide electrical signal path connections between desired ones of superconducting interconnects 132a-132p as well as between other circuit elements or components (now shown in FIG. 8 or 8A). Alternatively, 136 can be superconducting single-chip module (SSCM) or normal conductor based multi-chip module (MCM) or normal conductor based single-chip module (SCM).

In one example, substrate 136 electrically and/or capacitively and/or inductively is coupled to low loss superconducting integrated circuits (130a-130d). Superconducting inter connects 132a-132p can be produce by different methods. For example 4.8 micron tin and 5.2 micron Indium react at around 120-130 degree Celsius with each other to produce tin-indium solder. Similarly, 8 micron tin bump may react with 1 micron indium bump or pad, to produce a superconducting interconnect having a tin-indium interface and a tin-indium concentration gradient.

It is further possible that an 8 micron indium bump may react with a 1 micron tin bump or pad, to produce a superconducting interconnect having tin-indium interface and tin-indium concentration gradient. When an 8 micron Pb bump reacts with a 1 micron tin bump or pad, it produces superconducting interconnect having tin-lead interface and tin-lead concentration gradient. When a Pb coated tin bump reacts with an indium pad, it produces an interconnect having PbSn at Pb interface and Sn—In at In pad interface, Sn concentration gradient and Sn bump. When a 4.8 micron gold coated tin bump reacts at elevated temperature (120-130 degree Celsius) with a 5.2 micron gold coated Indium bump, it produces tin-indium solder where gold coating is thin enough (<50 nm) to diffuse into the solder matrix. It is possible to use gold coating in all of the above interconnect compositions where a gold coating may be used to protect the metal from oxidation and thus allow reaction with each other during superconducting interconnect formation.

As may be more clearly visible in FIG. 8A, in some embodiments, a first superconducting trace 138 may optionally be disposed between a connection point of low loss IC 130a and a surface of superconducting interconnect 132a and a second superconducting trace 140 may optionally be disposed between a surface of superconducting interconnect 132a and signal path 140 and superconducting via 134. Thus, superconducting traces 138, 140 and superconducting interconnect 132 form a connection path between IC 130a and via 134. As noted above, in some embodiments superconducting traces 138, 140 may be omitted from the connection path. In one example superconducting via 134 includes at least titanium nitride and or other high Q material.

Referring now to FIG. 8B in which like elements of FIG. 8A are provided having like reference designations, a connection path between low loss IC 130a and signal path 140 includes first and second layers of under bump metals (UBM) 142, 144 (e.g. which may be provided as one or a combination of $T_i/P_t/A_u$) disposed between superconducting interconnect 132a and respective ones of superconducting traces 138, 140. In one example, UBMs 142, 144 include at least titanium nitride and or other high Q material as part of the metal stack.

In one illustrative embodiment, one or more of the low loss superconducting ICs 130a-130d and/or SMCM 136 may include at least one which may be the same as or similar to the resonators described above in superconducting resonator devices 146, 148 conjunction with FIGS. 1-7. Superconducting resonator devices 146, 148 may be formed with a low stress having X-ray radius curvature over 100 meters, polycrystalline preferably (200)-oriented trenched titanium nitride (TiN) layer deposited on an $S_i$ service having a high resistivity characteristic. This arrangement provides high Q, low loss resonator structures suitable for operation over RF and/or microwave frequency ranges.

Referring now to FIGS. 9, 9A in which like elements are provided having like reference designations, a low loss flip-chip superconducting structure 150 comprises a superconducting multi-chip module (SMCM) 152 having a super conducting via signal path 154 disposed therethrough (i.e. between first and second surfaces of SMCM 152). A first end of via 154 has a superconducting trace 156 disposed thereover and a superconducting interconnect 158 is disposed over trace 156. A second superconducting trace disposed on a bottom surface 162b of an intermediate substrate 162. Alternatively, 152 can be superconducting single-chip module (SSCM) or normal conductor based multi-chip module (MCM) or normal conductor based single-chip module (SCM).

A second superconducting trace 164 is disposed over a top surface of intermediate substrate 162. A superconducting via 166 is provided in substrate 162 and is electrically coupled between traces 160, 164. Superconducting via comprises a low stress Titanium Nitride (TiN) superconducting or non-superconducting layer 168. Thus, intermediate substrate 162 is provided having at least one through via (e.g. via 166) containing a low stress TiN superconducting or non-superconducting layer (e.g. such as layer 168).

In one embodiment, non-superconducting layer 168 may consist of or comprise single and/or multiple superconducting materials or multiple layers of single superconducting materials. It is further possible that at least one material and/or at least one composition in 168 is superconducting. It is further possible non-superconducting layer 168 may consist of or comprise normal and superconducting materials. It is also possible that non-superconducting layer 168 may consist of or comprise superconducting and/or non-superconducting titanium nitride composition. Non-superconducting layer 168 can be provided as a combination of titanium-titanium nitride-tungsten and/or titanium-titanium nitride-high Q materials-tungsten and or titanium-titanium nitride-high Q materials and or titanium-high Q materials-tungsten and or high Q materials-tungsten and or high Q materials, etc.

A second superconducting interconnect element 170 is disposed over signal path 164 and is electrically coupled to a low loss IC 174 through a signal path 172. Thus, with this structure, one or more low loss ICs 174 may be electrically and physically coupled to a SMCM through an intermediate substrate with one or more superconducting interconnects.

In embodiments, some or all of low loss superconducting ICs, intermediate substrates and SMCMs may include one or more superconducting resonator devices. In the illustrative embodiment of FIG. 9, superconducting resonator devices 146-148 are disposed on respective ones of SMCM 152, intermediate substrate 162 and low-loss superconducting IC 174. Superconducting resonator devices may be the same as or similar to superconducting resonator devices described above in conjunction with FIGS. 1-5) formed with a low stress, X-ray radius of curvature over 100 meters, polycrystalline (preferably 200 oriented), trenched TiN layer deposited or otherwise provided on a high resistive $S_i$ surface to provide high Q, low-loss resonator structures preferably operated at RF and/or microwave frequencies (e.g. over the 100 MHz to 100 GHz frequency range.).

In one example, 146 and 147 can be resonator-to-feed-line coupling portion where 146 can be resonator portion and 147 can be feedline portion and capacitively coupled with each other. In another example, 146 and 147 each can have portion of device (qubit, resonator etc) and capacitively and or inductively and or electrically coupled with each other to complete the device. It is also possible at least portion of building blocks described in FIG. 7-7F can be distributed between 146 and 147 and capacitively and or inductively and or electrically coupled with each other. Structure 150 may also include one or more resonator structures 146, 147, 148 shown disposed on surfaces of respective ones of SMCM 152, intermediate substrate 162 and low loss IC 174.

It should be noted that structure 150 may include only one, two or none of the resonator structures 146, 147, 148. It is possible that at least portion of building blocks described in FIG. 7-7F can be distributed between 146 and 147 and electrically coupled with each other using superconducting and or partially superconducting bump. It is further possible that at least portion of building blocks described in FIG. 7-7F can be distributed between 146, 147 and 148 and electrically coupled with each other using superconducting and or partially superconducting bump, and superconducting and or normal through silicon via (TSV).

Referring now to FIG. 9A, one or more low-loss ICs 174 coupled to an SMCM 152 through an intermediate substrate 162 with a superconducting interconnect includes shielding structures 190, 192, 194 coupled to the low-loss superconducting ICs 174 and/or intermediate substrate 162. Thus, at least portions of LLSIC's such as any of LLSICs 132a-132d (FIG. 8) may include high Q metal shielding and/or at least portions of intermediate substrate may include high Q metal shielding which shield components from spurious or undesirable electromagnetic energy or magnetic or infrared. In one example high Q metal act as a magnetic shield for the qubit. In general, high Q metal shielding is primarily magnetic shielding for qubits.

Figure 10:
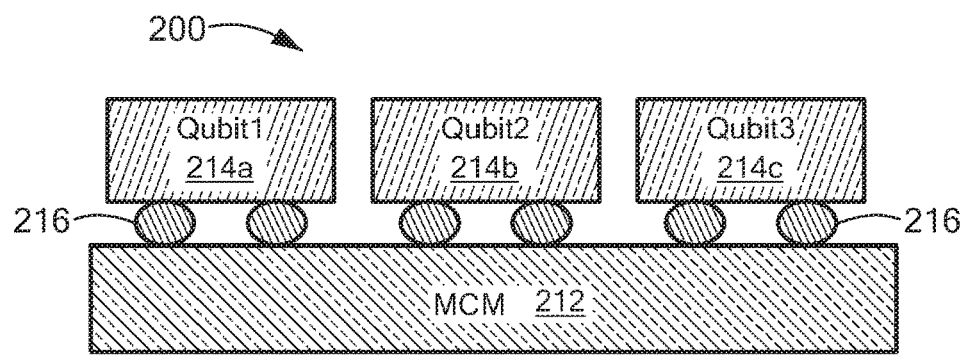
FIG. 10 is a side view of a cryogenic quantum bit package.
Figure 10A:
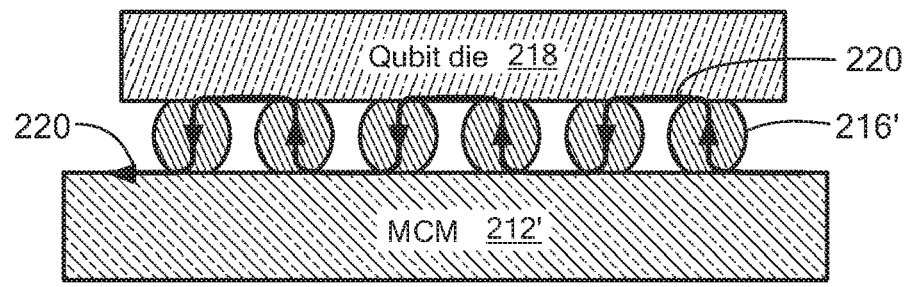
FIG. 10A is a side view of a quantum bit die coupled to a multi-chip module through superconducting or nearly superconducting interconnects.

Referring now to FIG. 10, a cryogenic quantum bit (qubit) package 200 includes a one or more quantum bit integrated circuits 214a, 214b, 214c ("qubit ICs" or "qubit chips") coupled to a multi-chip module (MCM) 212 through one or more superconducting or nearly superconducting interconnects 216. With such an arrangement, signals may propagate between multiple different qubit chips and/or between both multiple qubit chips and the MCM and/or between qubit chips and the MCM. FIG. 10A illustrates a signal propagating between an MCM and a single qubit die through a plurality of superconducting or nearly superconducting interconnects.

As will be described in detail below, such signal propagation is accomplished via the use of coupler circuits provided in the qubit ICs and/or in the MCM and/or in both the qubit ICs and/or the MCM. It should be appreciated that the coupling described herein can be accomplished utilizing multiple qubits (e.g. qubit-qubit coupling) or with a Josephson junction or with capacitive or inductive coupling circuits or with a resonator. FIGS. 15-31 to be described below illustrate a variety of different circuits which may be used for coupling signals between qubits (i.e. qubit-qubit coupling) between qubits and circuits on substrates (i.e. qubit-substrate coupling) and between qubits and MCMs (i.e. qubit-MCM coupling). In one embodiment, each of the qubit chips comprises at least two qubit circuits and at least one coupler which contains at least one Josephson junction (JJ), at least one quantum bit bias control line (e.g. see FIGS. 23, 24), and at least one resonator (e.g. see FIGS. 26, 27, 30, 31).

In some embodiments, a coupler may be configured or disposed to couple to a nearest-neighbor qubit. Thus, the cryogenic qubit package 200 may include a plurality of couplers configured to couple to next nearest-neighbor qubits so as to allow propagation of signals through a plurality of proximately disposed qubit chips. One or all qubit chips or the MCM may also contain coupling control systems with each coupling control system configured to tune the coupling value of a corresponding coupling device (e.g. see FIGS. 17-31).

In some embodiments one or more couplers may be disposed on the MCM rather than in the qubit IC. In still other some embodiments, one or more couplers may be split between the MCM and the qubit IC. That is, a portion of the coupler may be provided in the qubit IC and another portion of the same coupler may be provided in the MCM.

In some embodiments, the superconducting or nearly superconducting interconnects may be provided as part of a qubit loop and/or a coupler loop to create nearest-neighbor qubit coupling.

In some embodiments, one or more qubit chips and/or MCMs may further comprise a at least one quantum bit bias control line as well as a bias control system configured to apply a local effective bias on a corresponding quantum device. In one embodiment, the structures shown in FIGS. 21-29 can be considered quantum circuits. A qubit can be used as Quantum device. Additionally, quantum circuits can have single and/or multiple same and/or different quantum devices. For example, the structure shown in FIG. 25 may represent a quantum circuit where qubit 401 and resonator 382 can be considered as quantum devices.

It should be appreciates that MCM 212 may be provided as a superconducting multi-chip module (SMCM) 212. As will be described further below, in some embodiments, MCM 212 may be provided having one or more a superconducting or nearly superconducting signal paths disposed therethrough (i.e. between first and second surfaces of MCM 212). Alternatively, MCM 212 may also be provided as a superconducting single-chip module (SSCM) or a conventional conductor based multi-chip module (MCM) or a conventional conductor based single-chip module (SCM).

In general, the superconducting or nearly superconducting interconnects 216 may be the same as or similar to the types described hereinabove. In general, the superconducting interconnect or nearly superconducting interconnects 216 may be provided from any suitable material including, but not limited to, those materials described above in connection with the definition of a superconducting interconnect.

For example, the superconducting or nearly superconducting interconnects 216 may comprise a superconducting bump and superconducting under bump metallurgy (UBM) where the bump reacts with at least part of the UBM at an interface thereof to provide a lower temperature melt superconducting interface. In one case, interface material melts at a lower temperature than that at which the bump and UBM melt. In some embodiments, a superconducting concentration gradient may exist at the interface which melts at lower temperature than bump materials.

Figure 11:
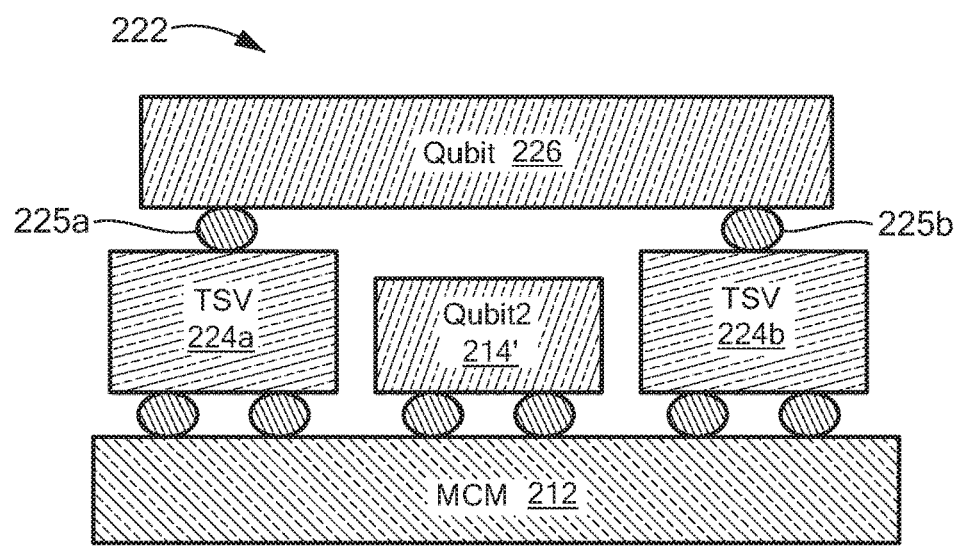
FIG. 11 is a side view of a quantum bit integrated circuit package provided from an interposer electrically connecting a quantum bit integrated circuit and the multichip module.

Referring now to FIG. 11, in which like elements of FIG. 10 are provided having like reference designations, a qubit cryogenic package comprises a first qubit IC 226 coupled to an MCM 212 though an interposer layer 224 which is here provided from a pair of TSV substrates 224a, 224b (i.e. a substrate which includes one or more TSVs). A plurality of superconducting or nearly superconducting interconnects 225a, 225b (which may be the same as or similar to interconnects 216 described above in conjunction with FIG. 10) provide signal paths between the first qubit IC 226 and the TSV substrates 224a, 224b. In the illustrative embodiment of FIG. 11, the first qubit 226 has a pair of superconducting or nearly superconducting interconnects 225a, 225b coupled to the MCM though a pair of TSV substrates. Those of ordinary skill in the art, after reading the disclosure provided herein, will appreciate that in other embodiments, it may be desirable or necessary to use more than two superconducting or nearly superconducting interconnects to provide a physical signal path between the first qubit 226 and the MCM 212.

The interposer 224 electrically interconnecting the first qubit IC and MCM is provided having an opening therein in which is positioned at least one electrical component. The electrical component may be provided, for example, as a second qubit chip. Alternatively, the electrical component may be provided as a complementary metal oxide semiconductor (CMOS) chip, a single-flux-quantum (SFQ) chip or any other type of electrical circuit component, coupled to the base MCM.

Furthermore, as will be described in further detail below, a third qubit (not shown in FIG. 11) may also be grown on upper surface of the TSV substrate and coupled (e.g. capacitively or inductively coupled) to the first and/or second qubit chip.

In the illustrative embodiment of FIG. 11, the second qubit IC is directly coupled to the MCM though a plurality of superconducting or nearly superconducting interconnects. Thus, the plurality of superconducting or nearly superconducting interconnects provide signal paths between the second qubit IC and the MCM.

It should also be appreciated that signals may be coupled between the different qubits chips through one or more capacitive or inductive coupling circuits. Thus, the size of the gap (or spacing) between surfaces of the first and second qubit chips is selected to allow capacitive or inductive coupling between the first and second qubit chips.

Figure 12:
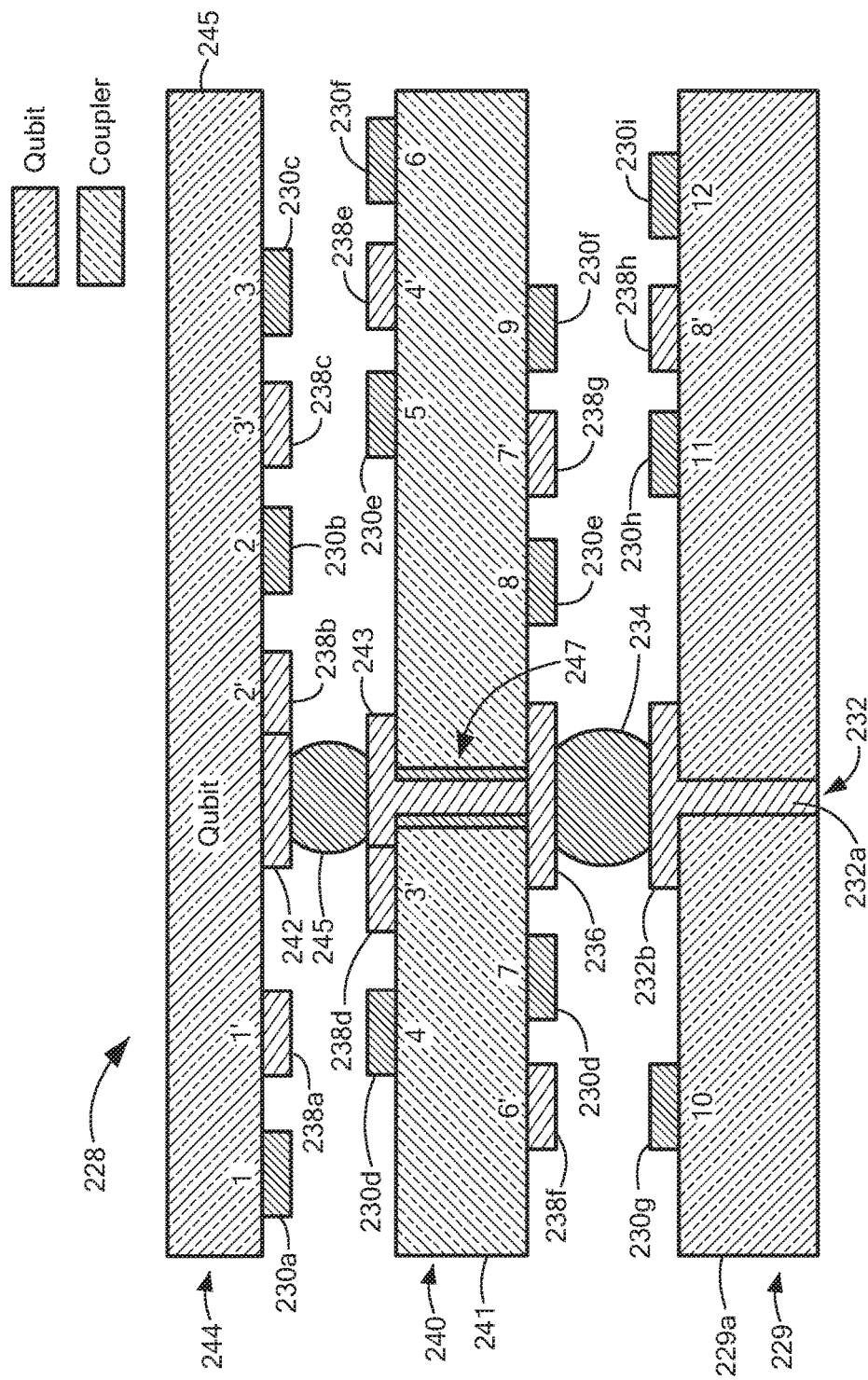
FIG. 12 is a side view of a quantum bit integrated circuit coupled to a multichip module through a through silicon via (TSV) substrate.

Referring now to FIG. 12, a qubit chip 244 is coupled to a multichip module 229 through an interposed layer here shown as a TSV substrate 240. As illustrated in FIG. 12, the qubit chip 244 comprises a substrate 245 having a plurality of qubit circuits 230, here twelve qubit circuits 230a-230i disposed therein or provided therein. Substrate 245 also has a plurality of coupler circuits 238 here eight coupler circuits 238a-238h disposed therein or provided therein. Some of the qubit and coupler circuits 230, 238 provide in-plane coupling of signals provided thereto (i.e. the qubits and/or couplers may be electrically coupled to other qubit and/or coupler circuits which lie in the same plane) while others of the qubit and coupler circuits 230, 238 provide between-plane coupling of signals provided thereto (i.e. the qubit and coupler circuits 230, 238 may be electrically coupled to other ones of qubits and/or coupler circuits which lie in a plane which is different than the plane in which the qubit and/or coupler circuit lies). Thus, the spacing (i.e. both horizontal and vertical spacing) between the qubit and coupler circuits 230, 238 is selected to allow capacitive and/or inductive coupling of signals between the various circuits 230, 238 as well as between circuits and signal paths provided on or as part of TSV 240 and/or MCM 229.

For example, in-plane coupling of signals may occur between qubit circuit 230a and coupler circuit 238a which are both part of qubit chip 244 while between-plane coupling of signals may occur between qubit circuit 230d (which is part of TSV 240) and coupler circuit 238a (which is part of qubit chip 244). With such coupling, signals may propagate in either direction between qubit chip 244 and MCM 229.

It should be appreciated that in this illustrative embodiment, MCM 229 may be provided as a superconducting multi-chip module (SMCM) 229 having a super conducting via signal path 232 disposed therethrough (i.e. between first and second surfaces of SMCM 229). A first end of via 232a has a superconducting trace 232b disposed thereover and a superconducting interconnect 234 is disposed over trace 232b. A second superconducting trace 236 disposed on a bottom surface of intermediate substrate 241. Alternatively, MCM 229 may be provided as a superconducting single-chip module (SSCM) or a conventional conductor based multi-chip module (MCM) or a conventional conductor based single-chip module (SCM).

A second superconducting trace 243 is disposed over a top surface of substrate 241. A superconducting via 247 is provided in substrate 241 and is electrically coupled between traces 236, 243. Superconducting via 247 may be the same as or similar to superconducting via 166 described above in conjunction with FIGS. 8, 9 and 9A and may comprise, for example, a low stress Titanium Nitride (TiN) superconducting or non-superconducting layer. Thus, substrate 241 is provided having at least one through via (e.g. via 247) containing a low stress TiN superconducting or non-superconducting layer.

In one embodiment, the non-superconducting layer of via 247 may consist of or comprise single and/or multiple superconducting materials or multiple layers of single superconducting materials.

A second superconducting or near superconducting interconnect element 245 is disposed over signal path 243 and is electrically coupled to qubit IC 244 through a signal path 242. Thus, with this structure, one or more qubit circuits 230 may be electrically and physically coupled to MCM 229 (which may be an SMCM) through intermediate TSV substrate 240 (aka interposer 240) with one or more superconducting or nearly superconducting interconnects (with only one superconducting or nearly superconducting interconnect 247 being shown in FIG. 12 to promote clarity in the drawings and written description).

Figure 13:
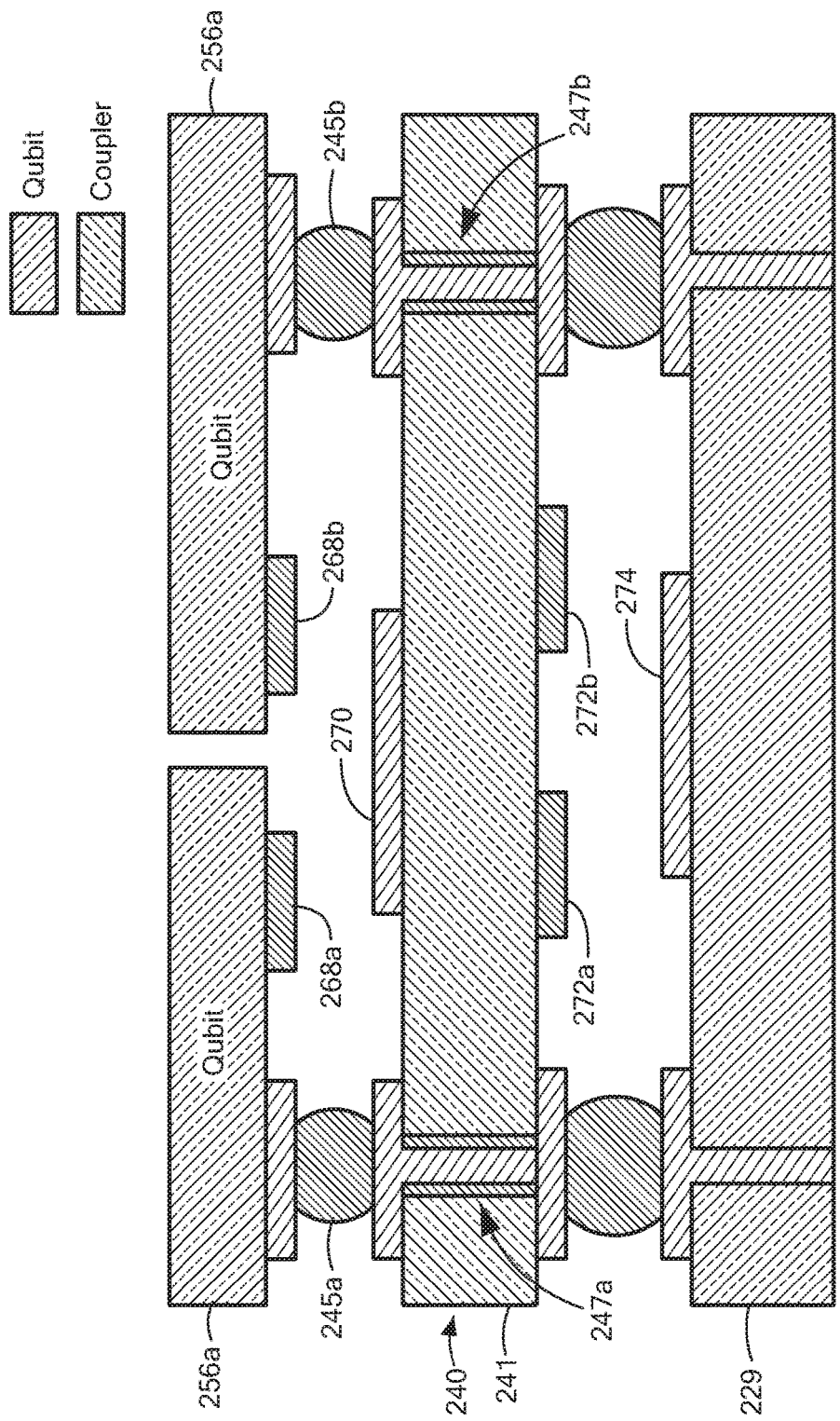
FIG. 13 is a side view of a pair of quantum bit integrated circuits coupled to a multichip module through a TSV substrate.

Referring now to FIG. 13, in which like elements of FIG. 12 are provide having like reference numerals, a pair of quantum bit integrated circuits 256a, 256b are coupled to MCM 229 through TSV substrate 240.

In the illustrative embodiment of FIG. 13, qubits 268a, 268b may be coupled to each other (i.e. in-plane coupling) and either or both of a qubits 268a, 268b may be coupled to a coupler circuit 270. Similarly, qubits 272a, 272b may be coupled to each other (i.e. in-plane coupling) and either or both of a qubits 272a, 272b may be coupled to coupler circuit 270 as well as to a coupler circuit 274 provided as part of MCM. In one example, qubit 268a is coupled to qubit 268b through the coupler 270. Similarly, in one example, qubit 272a is coupled to qubit 272b through the coupler 274. FIG. 13 is an example of inter chip qubit coupling.

In this way, signals may be coupled from qubit chips 256a, 256b to MCM 252 via superconducting or nearly superconducting interconnects 245a, 245b and superconducting signal paths 247a, 247b or through coupling of signals which occurs between qubit and coupler circuits 268a, 268b, 270, 272a, 272b, and 274.

Figure 14:
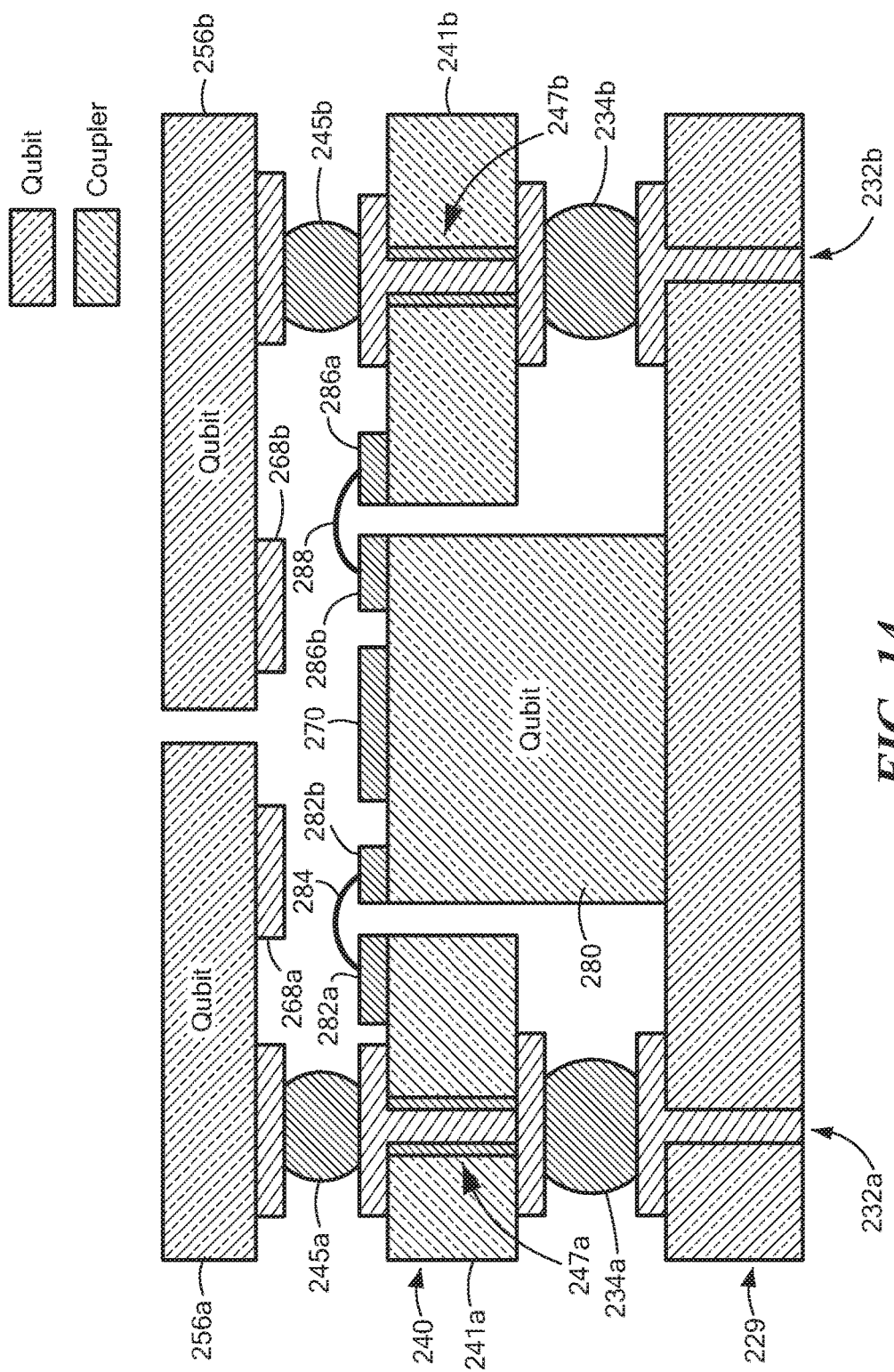
FIG. 14 is a side view of a pair of quantum bit integrated circuits coupled to a multichip module through a pair of TSV substrates.

Referring now to FIG. 14 in which like elements of FIG. 13 are provided having like reference designations, the interposer 240 promotes electrical interconnection of the qubit ICs 226a, 226b and MCM 229 and is provided having an opening therein in which is positioned at least one electrical component 280. In this illustrative embodiment, the electrical component is illustrated as a third qubit chip 280. In alternate embodiments, however, the electrical component 280 may be provided as a complementary metal oxide semiconductor (CMOS) chip, a single-flux-quantum (SFQ) chip or any other type of electrical circuit component, coupled to the base MCM.

It should be appreciated that in those embodiments in which electrical component 280 is provided as a qubit chip 280, the qubit chip may disposed on (or even fabricated on (e.g. grown on) an upper surface of the MCM 229.

In the illustrative embodiment of FIG. 14, qubit IC 280 is electrically coupled to other circuitry though electrically conductive portions 282a, 282b. It should be appreciated that conductive portion 282a is provide on interposer portion 241a and conductive portion 282b is provide on qubit 280 (i.e. conductive portions 282a, 282b correspond to a split or segmented transmission line). A bond wire 284 (e.g. Al) electrically couples spaced apart superconductive portions 282a, 282b. Thus, the electrically superconductive portions 282a, 282b and bond wire bond 284 together form a superconducting signal path through which signals may propagate between circuitry disposed on interposer 240 (and more particularly interposer portion 241a) and qubit 280. Similarly, superconductive portions 286a, 286b and bond wire 288 (e.g. Al) together form a superconducting signal path through which signals may propagate between circuitry disposed on interposer 240 (and more particularly interposer portion 241b) and qubit 280. FIG. 14 represents interchip qubit coupling as well as creating a superconducting signal path between the chips.

As noted above, signals may be coupled between the different qubits chips through one or more capacitive or inductive coupling circuits (e.g. coupler 270) and thus, the spacing between surfaces of the qubit chips 256a, 256b, 280 is selected to allow capacitive or inductive coupling therebetween as well as between interposer layer 240 and MCM 229.

Figure 15:
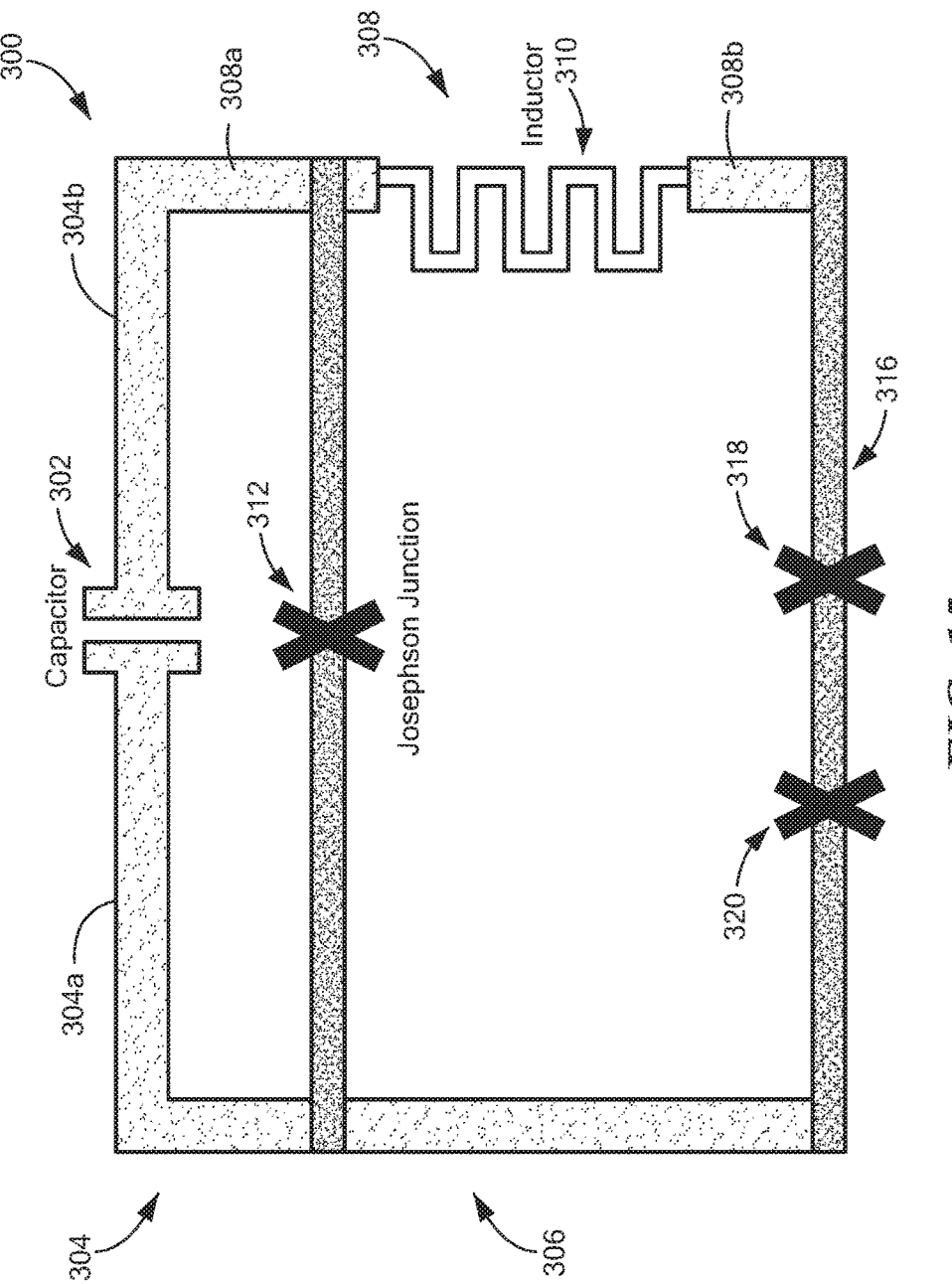
FIG. 15 is a plan view of a building block of a passive or active superconducting circuit (C-shunt quantum bit)

Referring now to FIG. 15, a structure 300 which may, for example, correspond to a building block or a portion of a building block of a passive or active superconducting circuit (C-shunt quantum bit) includes a capacitive element 302 (here illustrated as a capacitor) formed or otherwise provided in a first signal path of a first leg 304 of the C-shunt quantum bit 300. Respective ones of second and third signal path legs 306, 308 are coupled to respective ends of signal path portions 304a, 304b. An inductive element 310 is serially disposed in the third signal path leg 308 (i.e. with a first terminal of inductor 310 coupled to signal path portion 308a and a second terminal of inductor 310 coupled to signal path portion 308b). It should, of course, be appreciated that the inductive element may alternatively be serially disposed in the second signal path leg 306.

A single Josephson junction 312 is provided in a signal path 314 provided from a high Q metal and coupled between the first terminal of the inductive element and the third signal path leg 306. A second high Q metal signal path 316 in which a pair of Josephson junctions 318, 320 are provided, is coupled between a second terminal of inductive element 310 (here illustrated as an inductor) and the third signal path 306. Thus, a superconducting structure having both capacitive and inductive elements (and thus capable of exhibiting capacitive and inductive coupling characteristics) is provided.

It should be appreciated that stipple patterns used in the signal paths in FIGS. 15-29 indicate different high Q metals (e.g., Al, Nb, TiN, NbTiN etc) or high Q metals deposited in different steps. Because it is necessary to perform in-situ cleaning (e.g. ion mill) of the high Q metal surfaces prior to disposing a second high Q metal on it. Similarly, Josephson junctions are formed or otherwise provided in deposition steps which different than deposition steps which in which conventional high Q metal deposition occurs.

In FIG. 15, for example, signal path portions 304a, 304b, 306, 308a, 308b may be provided as TiN and signal path portions 312, 316 may be provided as Al. It should be noted that in some embodiments, it may be desirable to provide all signal paths portions from Al (for example, Al deposited in two different steps).

Figure 16:
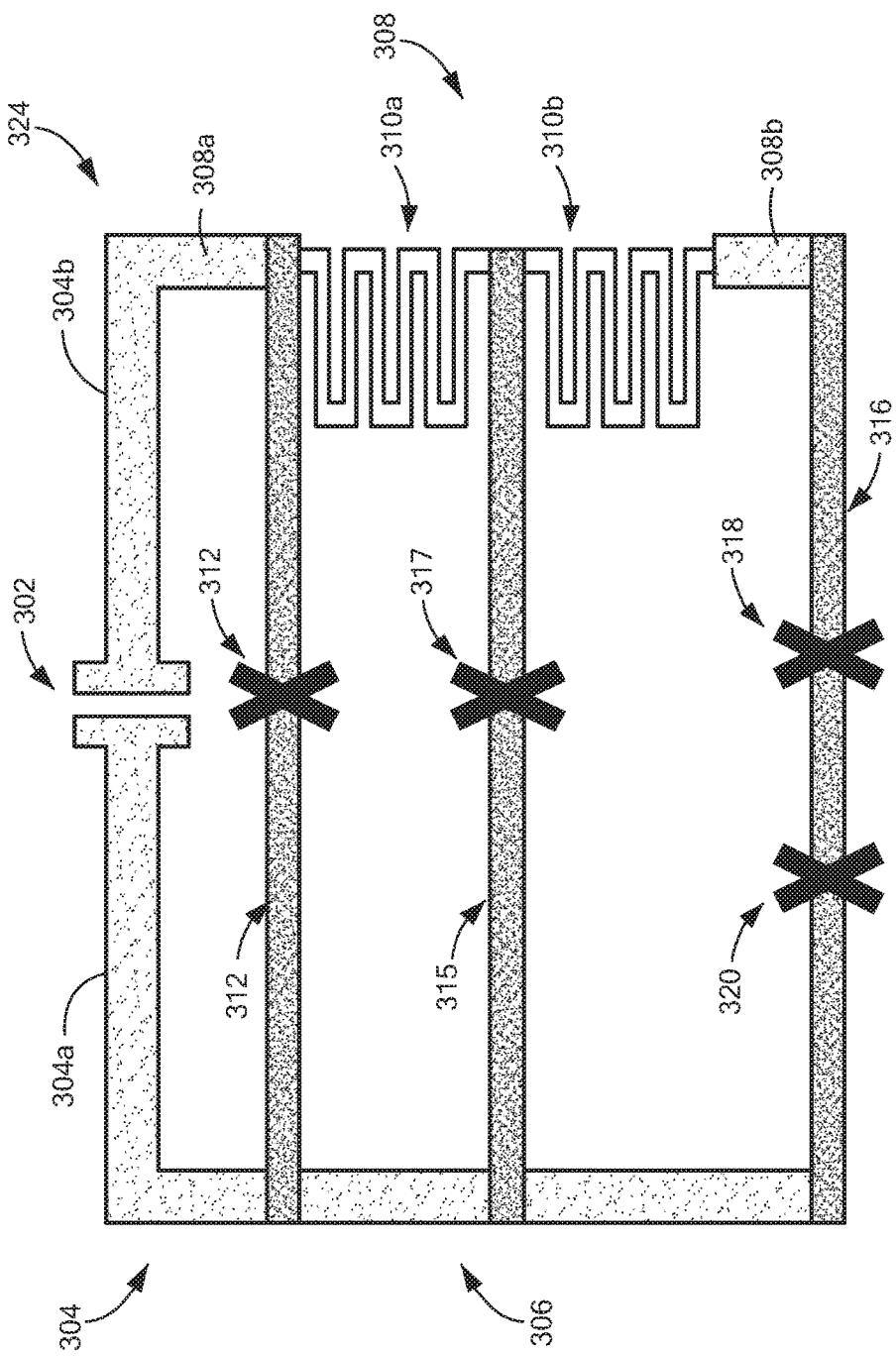
FIG. 16 is a plan view of a building block of a passive or active superconducting circuit (spin quantum bit)

Referring now to FIG. 16 in which like elements of FIG. 15 are provided having like reference designations, a structure 324 which may, for example, correspond to a building block of a passive or active superconducting circuit (spin quantum bit) includes capacitive element 302 formed or otherwise provided in a first signal path of a first leg 304 of the spin quantum bit 324. Respective ones of second and third signal path legs 306, 308 are coupled to respective ends of signal path portions 304a, 304b. A pair of inductive elements 310a, 310b are serially disposed in the third signal path leg 308 (i.e. with a first terminal of inductor 310a coupled to signal path portion 308a and a second terminal of inductor 310a coupled to a first terminal of inductor 310b and a second terminal of inductor 310b coupled to signal path portion 308b). It should, of course, be appreciated that the inductive elements 310a, 310b may alternatively be serially disposed in the second signal path leg 306.

A single Josephson junction 312 is provided in a signal path 314 provided from a high Q metal and coupled between the first terminal of the inductive element and the third signal path leg 306. A second high Q metal signal path 315 which includes a single Josephson junction 317 has a first end coupled between a second terminal of inductive element 310a and a first terminal of inductive element 310b and a second end coupled to the third signal path 306.

A second high Q metal signal path 316 in which a pair of Josephson junctions 318, 320 has a first end coupled to a second terminal of inductive element 310b and a second end coupled to a second end of the third signal path 306 (i.e. signal path 316 is coupled between the second terminal of inductor 310b and a second end of signal path 306. Thus, a superconducting structure 324 having both capacitive and inductive elements (and thus capable of exhibiting capacitive and inductive coupling characteristics) is provided.

Figure 17:
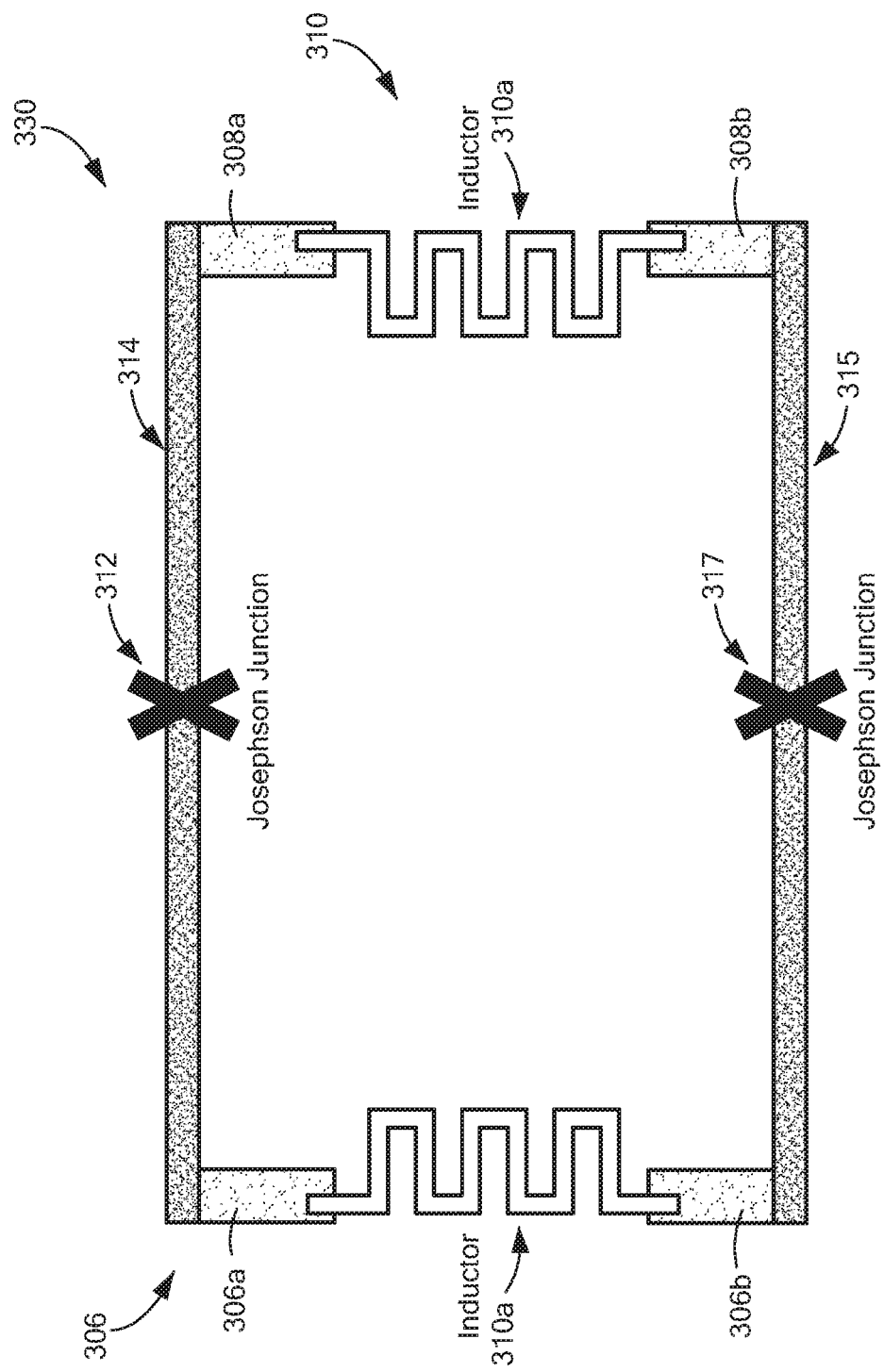
FIG. 17 is a plan view of a building block of a passive or active superconducting coupler circuit.

Referring now to FIG. 17 in which like elements of FIGS. 15 and 16 are provided having like reference designations, a structure 330 which may, for example, correspond to a building block of a passive or active superconducting coupler circuit includes a pair of inductive elements 310a, 310b serially disposed in respective ones of signal path legs 306, 308 (i.e. with a first terminal of inductor 310a coupled to signal path portion 306a and a second terminal of inductor 310a coupled to a signal path portion 306b and a first terminal of inductor 310b coupled to signal path portion 308a and a second terminal of inductor 310b coupled to signal path portion 308b).

Josephson junction 312 provided in signal path 314 is coupled between the first terminal of the inductive element 310a and the first terminal of the inductive element 310b. Similarly, Josephson junction 317 provided in signal path 315 is coupled between the second terminal of the inductive element 310a and the second terminal of inductive element 310b. Thus, a superconducting structure 330 having inductive elements on opposite ends there of (and thus capable of exhibiting inductive coupling characteristics) is provided.

Figure 18:
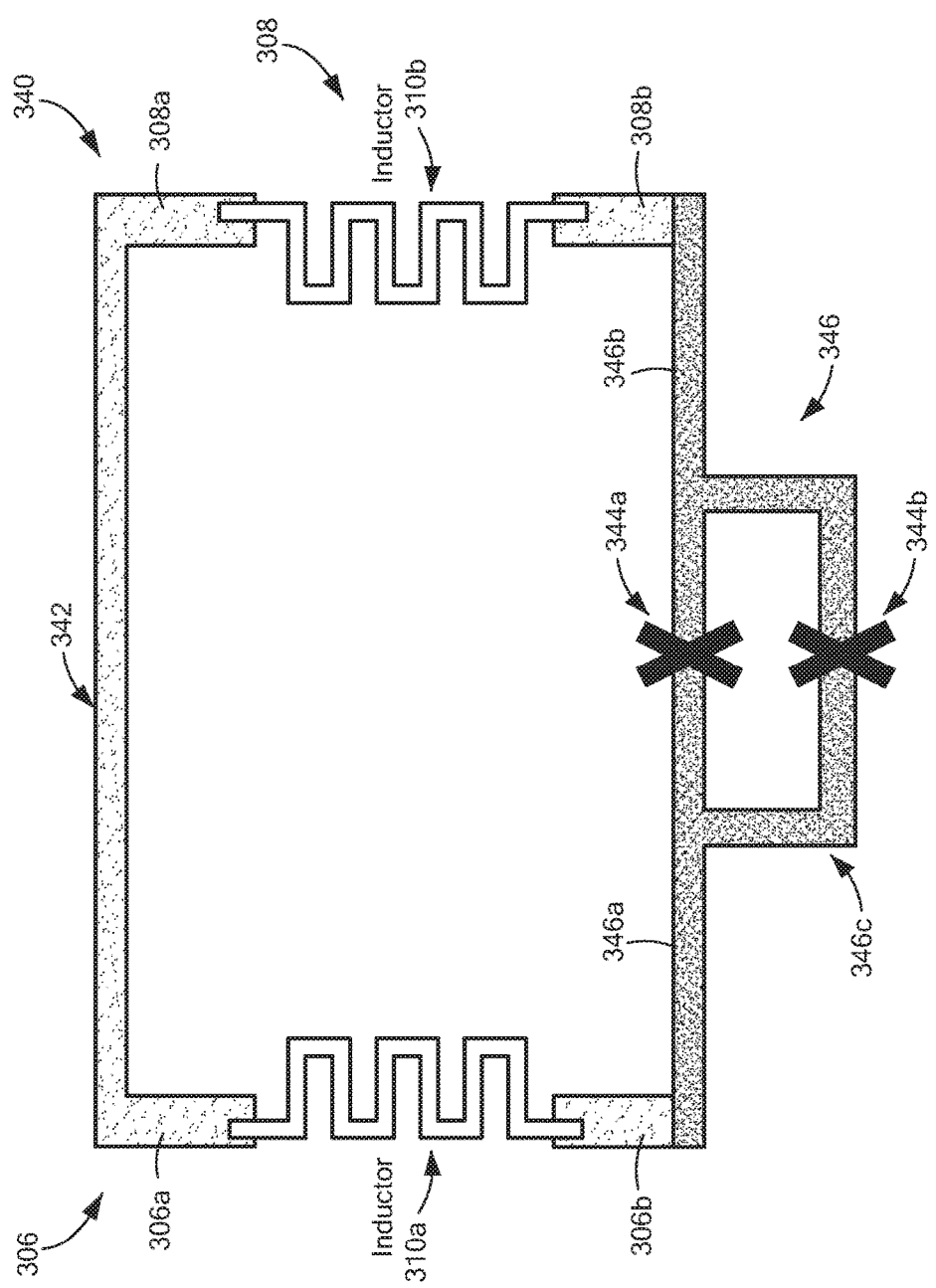
FIG. 18 is a plan view of an alternate building block of a passive or active superconducting coupler circuit.
Figure 19:
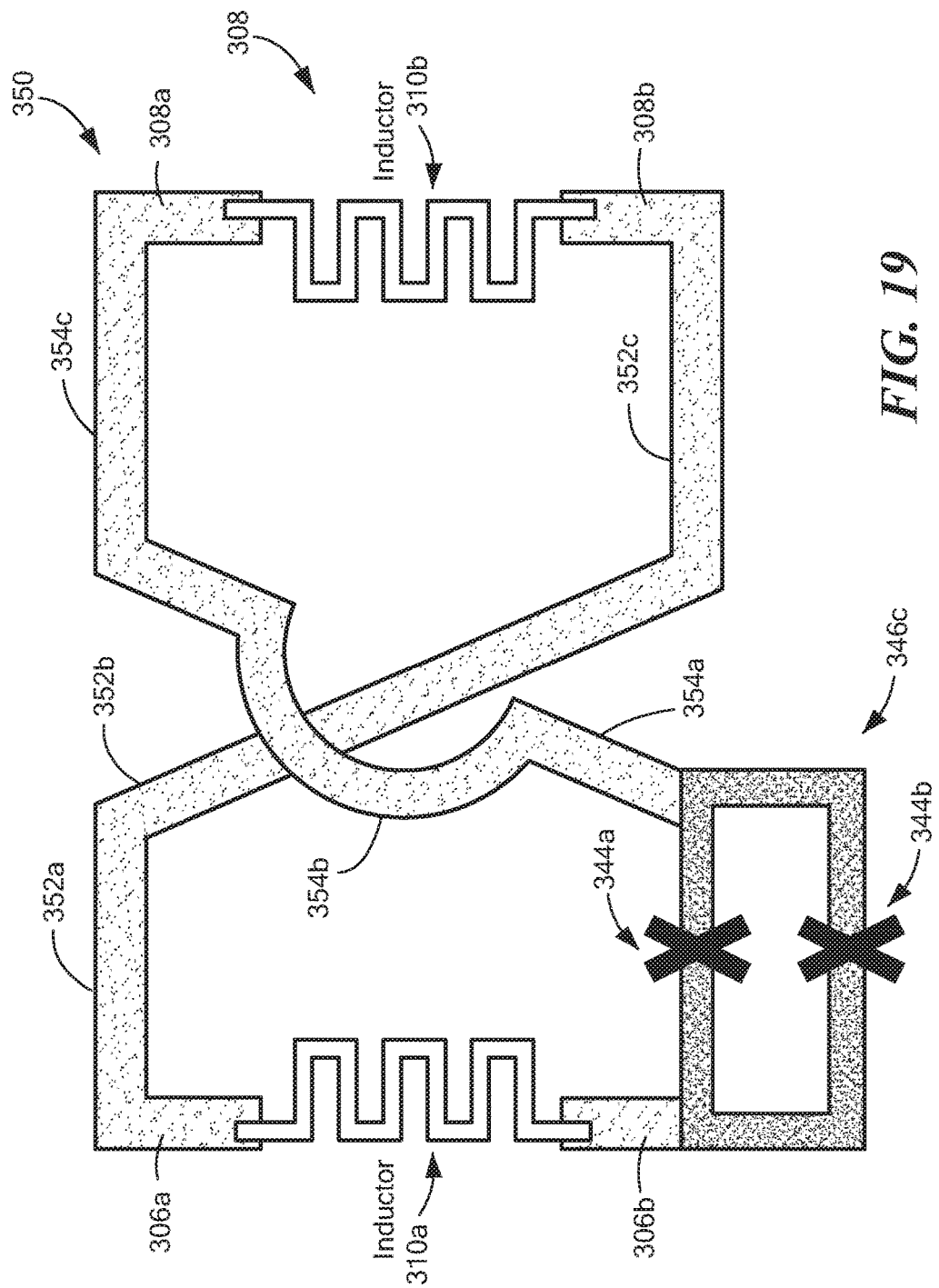
FIG. 19 is a plan view of an alternate building block of a passive or active superconducting coupler circuit.

FIGS. 18 and 19 are examples of an RF superconducting quantum interference device (SQUID) system as tunable flux qubit.

Referring now to FIG. 18 in which like elements of FIGS. 15-17 are provided having like reference designations, a structure 340 which may, for example, correspond to an alternate embodiment of a building block of a passive or active superconducting coupler circuit includes a pair of inductive elements 310a, 310b serially disposed in respective ones of signal path legs 306, 308 (i.e. with a first terminal of inductor 310a coupled to signal path portion 306a and a second terminal of inductor 310a coupled to a signal path portion 306b and a first terminal of inductor 310b coupled to signal path portion 308a and a second terminal of inductor 310b coupled to signal path portion 308b).

A signal path 342 is coupled between the first terminal of the inductive element 310a and the first terminal of the inductive element 310b.

A pair of Josephson junctions 344a, 344b are parallel coupled in a loop portion 346c of a high Q metal signal path 346 coupled between the second terminal of the inductive element 310a and the second terminal of inductive element 310b. Thus, a superconducting structure 330 having inductive elements on opposite ends there of (and thus capable of exhibiting inductive coupling characteristics) is provided.

Referring now to FIG. 19 in which like elements of FIGS. 15-18 are provided having like reference designations, a structure 350 which may, for example, correspond to an alternate embodiment of a building block of a passive or active superconducting coupler circuit includes a pair of inductive elements 310a, 310b serially disposed in respective ones of signal path legs 306, 308 (i.e. with a first terminal of inductor 310a coupled to signal path portion 306a and a second terminal of inductor 310a coupled to a signal path portion 306b and a first terminal of inductor 310b coupled to signal path portion 308a and a second terminal of inductor 310b coupled to signal path portion 308b).

A signal path 352 (here shown having sections 352a, 352b, 352c) coupled between the first terminal of the inductive element 310a and the first terminal of the inductive element 310b.

A pair of Josephson junctions 344a, 344b are parallel coupled in a loop portion 346c of a high Q metal signal path, a first portion of the loop is coupled to the second terminal of the inductive element 310a through signal path portion 306b and a second portion of the loop is coupled to the second terminal of inductive element 310b through a signal path portion 354 (here shown having sections 354a, 354b, 354c). Thus, a superconducting structure 330 having inductive elements on opposite ends there of (and thus capable of exhibiting inductive coupling characteristics) is provided.

It should be appreciated that signal path 354 includes signal path portion 354b which utilizes a cross-over or dielectric bridge. Cross over 354b can be made using conventional aluminum (Al) wire bonding and/or ribbon bonding techniques and/or a lithographic process. Cross-over portion 354b helps to increases Qubit density. Also, use of cross-over signal paths help to address circuit complexity issues within a given area/volume.

It should also be appreciated that stipple patterns used in the signal paths in FIGS. 18 and 19 indicate different high Q metals (e.g., Al, Nb, TiN, NbTiN etc) or high Q metals deposited in different steps. Because it is necessary to perform in-situ cleaning (e.g. ion mill) of the high Q metal surfaces prior to disposing a second high Q metal on it. Similarly, Josephson junctions are formed or otherwise provided in deposition steps which different than deposition steps which in which conventional high Q metal deposition occurs.

Figure 20:
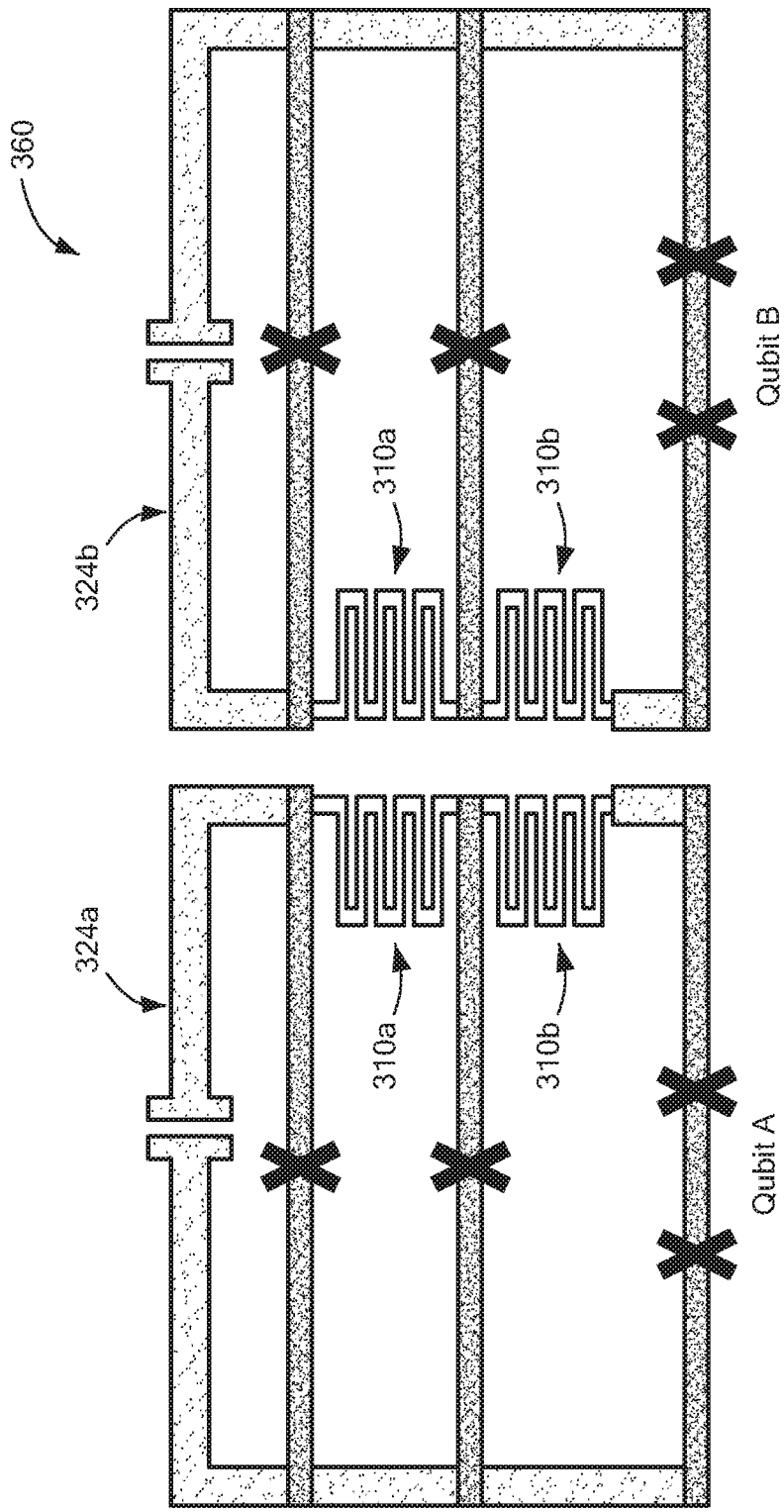
FIG. 20 is a plan view of a pair of quantum bit circuits coupled through inductive coupling.

Referring now to FIG. 20 in which like elements of FIGS. 15-19 are provided having like reference designations, a structure 360 which includes a pair of quantum bit circuits 324a, 324b coupled through inductive coupling provided by inductive elements 310a, 310b. Quantum bit circuits 324a, 324b may be the same as or similar to circuit 324 described above in conjunction with FIG. 16. It should be appreciated that circuits 324a, 324b may be used to provide in-plane or between-plane coupling utilized the manner described above in conjunction with FIGS. 10-14.

FIG. 20 is an example of direct qubit-qubit coupling. In one example, qubit 324a can stay in one plane or chip (e.g., 214a in FIG. 10) and 324b can stay in another plane with chip (e.g., MCM 212 in FIG. 10). The qubit 324a and the chip can be capacitively and/or inductively coupled with each other. In another example, qubit 324a can stay in one plane or chip (e.g., 130a in FIG. 8A) and 324b can stay in another plane with chip (e.g., MCM 136 in FIG. 8A). The qubit 324a and the chip can be capacitively and or inductively coupled with each other.

Figure 21:
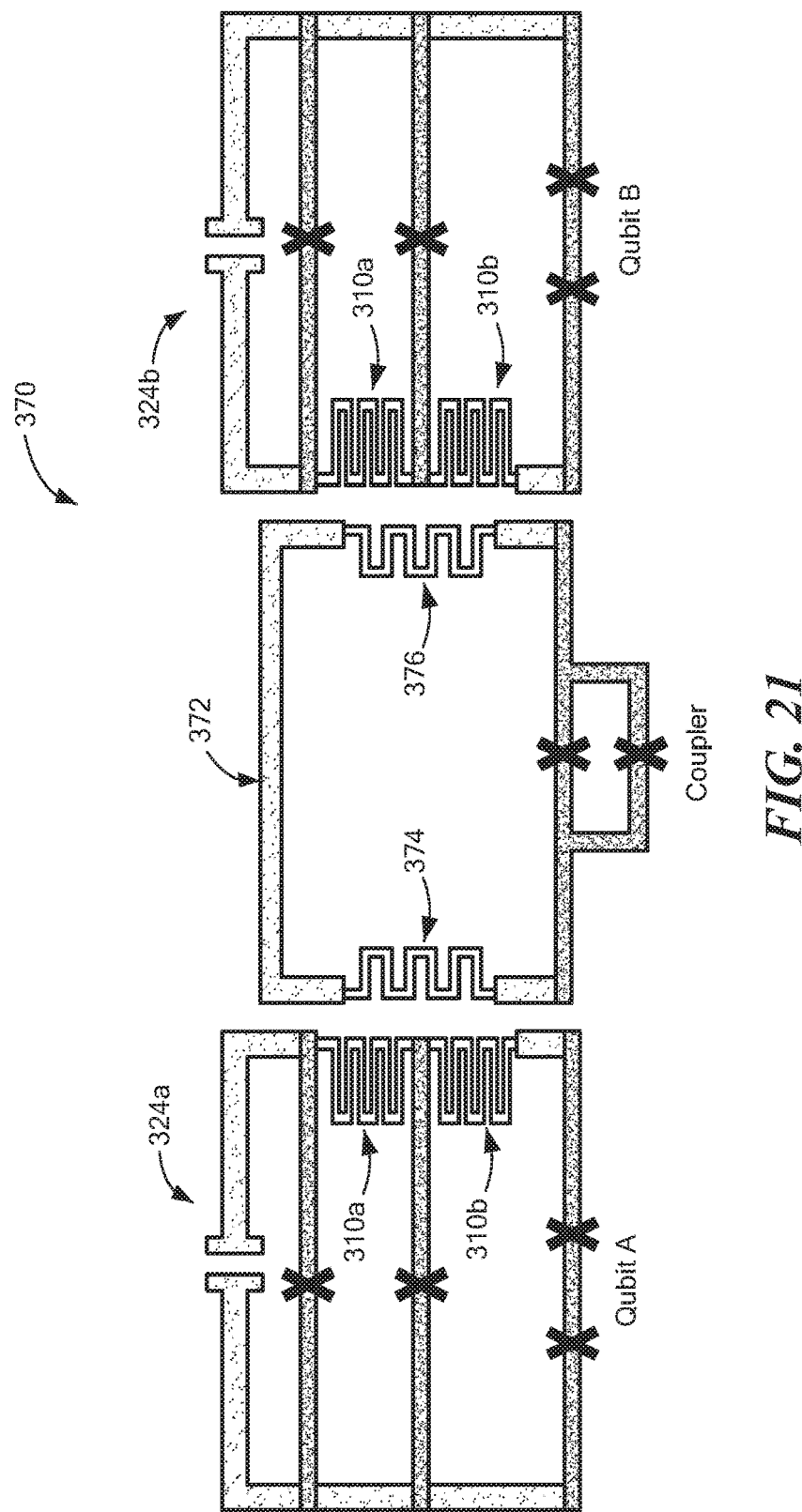
FIG. 21 is a plan view of a pair of quantum bit circuits coupled through a coupler circuit using inductive coupling.

Referring now to FIG. 21 in which like elements of FIGS. 15-19 are provided having like reference designations, a structure 360 which includes a pair of quantum bit circuits 324a, 324b coupled through a coupler circuit 372 using inductive coupling. In this illustrative embodiment, inductive elements 374, 376 provided in coupler circuit 372 are coupled to inductive elements provided in quantum bit circuits 324a, 324b. In particular, signals may be coupled between inductive element 374 in coupler 372 and inductive elements 310a, 310b in quantum bit circuit 324a. Similarly, signals may be coupled between inductive element 376 in coupler 372 and inductive elements 310a, 310b in quantum bit circuit 324b. In one example, inductor elements 310a, 310b merge with inductive element 374 to maintain and/or balance mutual inductance between qubit 324a and coupler 372.

Thus, coupling structure 360 may be used to provide in-plane or between-plane coupling utilized the manner described above in conjunction with FIGS. 10-14. It should also be appreciated that all or portions of the different circuits 324a, 324b, 372 may be provided on any of a qubit IC, an interposer or an MCM such as the ones described above in conjunction with FIGS. 10-14.

The coupling structure 360 (or, more simply "coupler 360") consists of a quantum bit and/or resonator and/or Josephson junction and/or inductor and/or capacitor. The quantum bit coupling is achieved by placing the coupler 360 at the intersections of the quantum bit loops and selectively applying bias currents. The network is scalable and makes it possible to perform a universal set of quantum gates. The coupling scheme allows gate operation at the charge degeneracy point of each quantum bit. The two quantum bit coupling can be generalized to a chain of N number of coupled quantum bits and every (or substantially every) quantum bit is then coupled to its nearest neighbor via the coupler 360 with individual bias current lines.

In one embodiment, the quantum bits are independent when the bias current is turned off and the quantum bit can be individually controlled using the gate voltage. In one example, qubit 324a and qubit 324b and coupler 372 can be placed in the structure shown in FIG. 12. For example, elements 230b-238c-230c can be used as 324a-272-324b coupling combination where qubit 324a is used in 230b, coupler 272 can be used as element 238c and qubit 324b is used as element 230c. In FIG. 12, several such combinations are possible. For example, elements 230e-238e-230f or 230e'-238g-230f or elements 230h-238h-230i or elements 230b-238c-230e or 230e'-238g-230h can be used as elements 324a-272-324b coupling combination. Similarly, in FIG. 13, a coupling combination of elements 324a-272-324b can be used for elements 268a-270-268b and/or elements 272a-274-272b.

Figure 22:
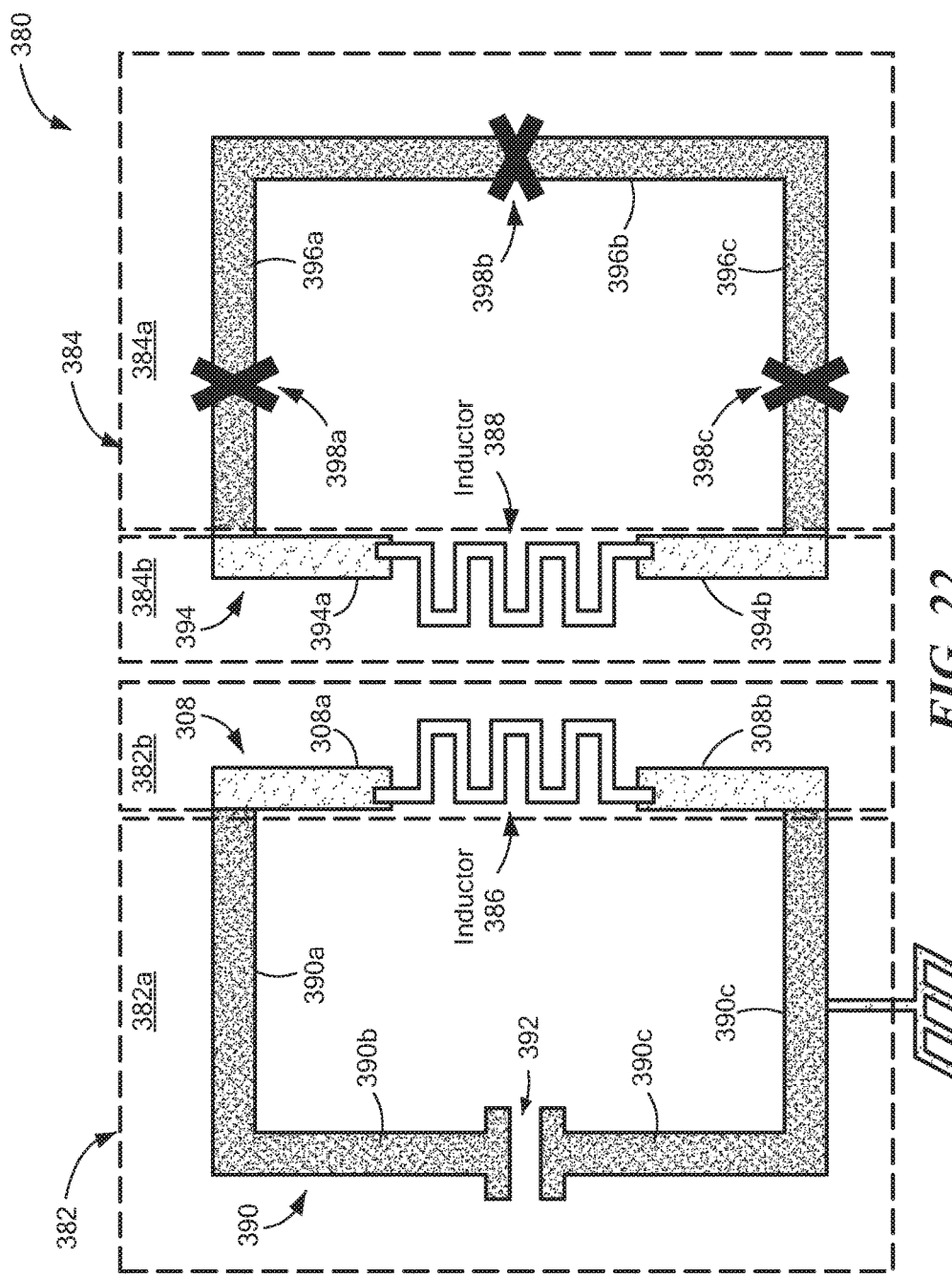
FIG. 22 is a plan view of a pair of quantum bit circuits coupled through inductive coupling.

Referring now to FIG. 22 in which like elements of FIGS. 15-20 are provided having like reference designations, a structure 380 includes a pair of quantum bit circuits 382, 384 between which signals may be coupled through inductive elements 386, 388. Inductive elements 386, 388 may be the same as or similar to inductive elements 310 (310a, 310b, 374, 376 described above).

In this illustrative embodiment, quantum bit circuit 382 includes a first signal path 308 comprised of signal path portions 308a, 308b with inductive element 386 serially coupled therebetween. Quantum bit circuit 382 further includes a second signal path 390 which includes a capacitive element 392. Signal path 390 includes signal path portions 390a-390d with a first end of signal path portion 390a coupled to a first end of signal path portion 308a and a first end of signal path portion 390d coupled to a first end of signal path portion 308b. Signal path portion is also coupled to a reference potential which is here illustrated as ground.

As noted above, in some embodiments, signal path portions 308a, 308b may be provided from TiN and signal path portions 390a-390d and capacitive element 392 may be provided from Al. Since the signal path portions 308a, 308b may be provided from a material which is different than signal path portions 390a-390d, if it is desirable or necessary to provide a first portion of quantum bit circuit 382 on a first substrate (e.g. a qubit IC substrate such as substrate 245 in FIG. 12) and a second portion of quantum bit circuit 382 on a second, different substrate (e.g. an interposer substrate such as substrate 241 in FIG. 12), then the circuit 382 may be split at the junctions where ends of signal path portions 390a, 390d, physically contact or otherwise join ends of signal path portions 308a, 308b. In this manner, circuit portion 382a may be provided on a first substrate and circuit path portion 382b may be provided on a second different substrate.

In other embodiments, however, it may be desirable or necessary, that both signal paths portions 308a, 308b, 390a-390d and capacitive element 392 are all provided from Al deposited in two different steps. Again, in such embodiments, it may still be desirable to split the circuit 382 at the junctions where ends of signal path portions 390a, 390d, physically contact or otherwise join ends of signal path portions 308a, 308b so as to allow circuit portion 382a to be provided on a first substrate (e.g. one of MCM, interposer or qubit IC substrates 229a, 241, 245 described above in conjunction with FIG. 12) and circuit path portion 382b to be provided on a second different substrate (e.g. a different one of MCM, interposer or qubit IC substrates 229a, 241, 245 described above in conjunction with FIG. 12).

Quantum bit circuit 384 includes a first signal path 394 comprised of signal path portions 394a, 394b with inductive element 388 serially coupled therebetween. Quantum bit circuit 382 further includes a second signal path 396 which includes signal path portions 396a-396d. Josephson Junctions are 398a-398c are disposed in respective ones of signal path portions 396a-396d. A first end of signal path portion 396a is coupled to a first end of signal path portion 394a and a first end of signal path portion 396c is coupled to a first end of signal path portion 394b.

As with circuit 382, in some embodiments, signal path portions 394a, 394b may be provided from TiN and signal path portions 396a-396c may be provided from Al. In other embodiments, however, it may be desirable or necessary, that both signal paths portions 394a, 394b, 396a-396c and Josephson Junctions 398a-398c are all provided from Al deposited in two different steps.

As with circuit 382, it may be desirable to split the circuit 384 so as to provide some portions of circuit 384 to be provided on a first substrate and other portions of circuit 384 to be provided on a second different substrate. Thus, in some applications, it may be desirable to split the circuit 384 at the junctions where ends of signal path portions 396a 396c, physically contact or otherwise join ends of signal path portions 394a, 394b so as to allow a circuit portion 384a to be provided on a first substrate (e.g. one of MCM, interposer or qubit IC substrates 229a, 241, 245 described above in conjunction with FIG. 12) and a circuit portion 384b to be provided on a second different substrate (e.g. a different one of MCM, interposer or qubit IC substrates 229a, 241, 245 described above in conjunction with FIG. 12).

Thus, coupling structure 380 may be used to provide in-plane or between-plane coupling utilized the manner described above in conjunction with FIGS. 10-14. It should also be appreciated that all or portions of the different circuits 384, 386 may be provided on any of a qubit IC, an interposer or an MCM such as the ones described above in conjunction with FIGS. 10-14.

Figure 23:
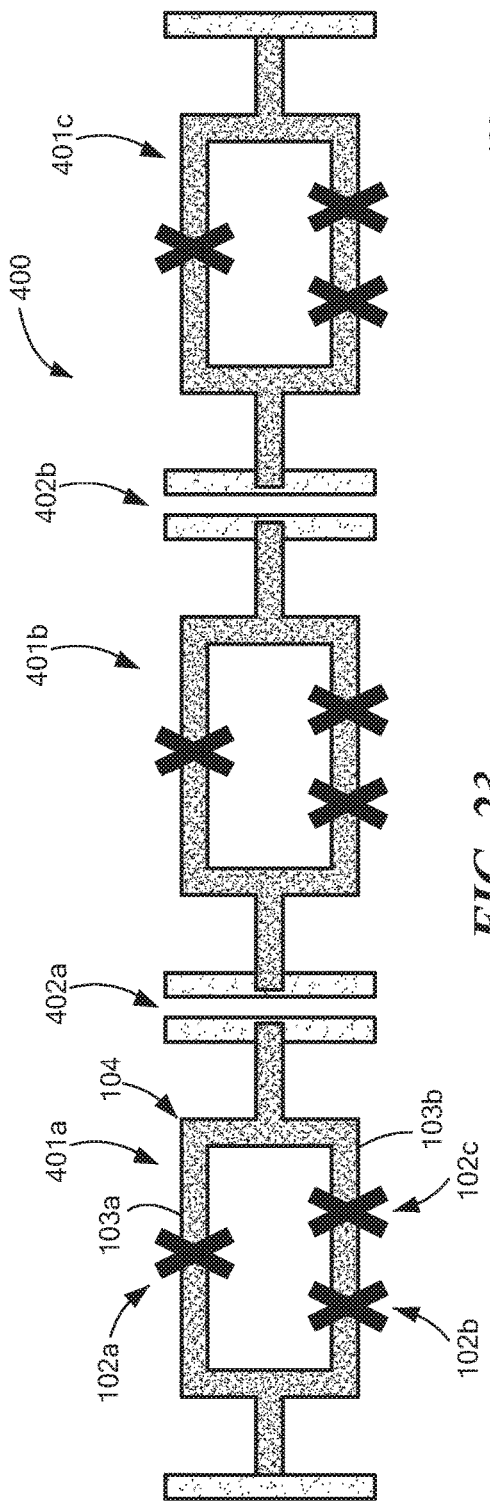
FIG. 23 is a plan view of a series of quantum bit circuits coupled through capacitive coupling.

Referring now to FIG. 23 a circuit 400 includes a plurality of quantum bit circuits 401 (with three quantum bit circuits 401a, 401b, 401c here being shown in the illustrative embodiment of FIG. 23) coupled through capacitive coupling elements 402 (with two capacitive elements 402a, 402b here being shown in the illustrative embodiment of FIG. 23).

In this illustrative embodiment, quantum bit circuits 401 includes a first Josephson junction 102a disposed in a first leg 103a of superconducting traces 104 and a pair of Josephson junctions 102b, 102c disposed in a second leg 103b of superconducting traces 104. In some embodiments, the Josephson junctions may be coupled between two regions of high Q material (e.g. TiN). In one illustrative embodiment, Josephson junctions 102a-102c and superconducting traces 103a, 103b, 104 may be patterned using single photolithography process. In another example superconducting traces 103a, 103b, 104 may be provided using any of a sputtering technique and or evaporated and or provided from MBE aluminum. It is further possible that all the superconducting traces 104, 103a, 103b use sputtered and or evaporated and or MBE aluminum.

Capacitors 402a, 402b are disposed between each of the quantum bit circuits 401a, 401b, 401c so as to provide a series of quantum bit circuits coupled through capacitive coupling.

It should be appreciates that in some embodiments, capacitors 402a, 402b may be provided from TiN and quantum bit circuits 401a, 401b, 401c may be provided from Al. In other embodiments, however, it may be desirable or necessary, that both quantum bit circuits 401a, 401b, 401c and capacitors 402a, 402b are all provided from Al deposited in two different steps.

Figure 24:
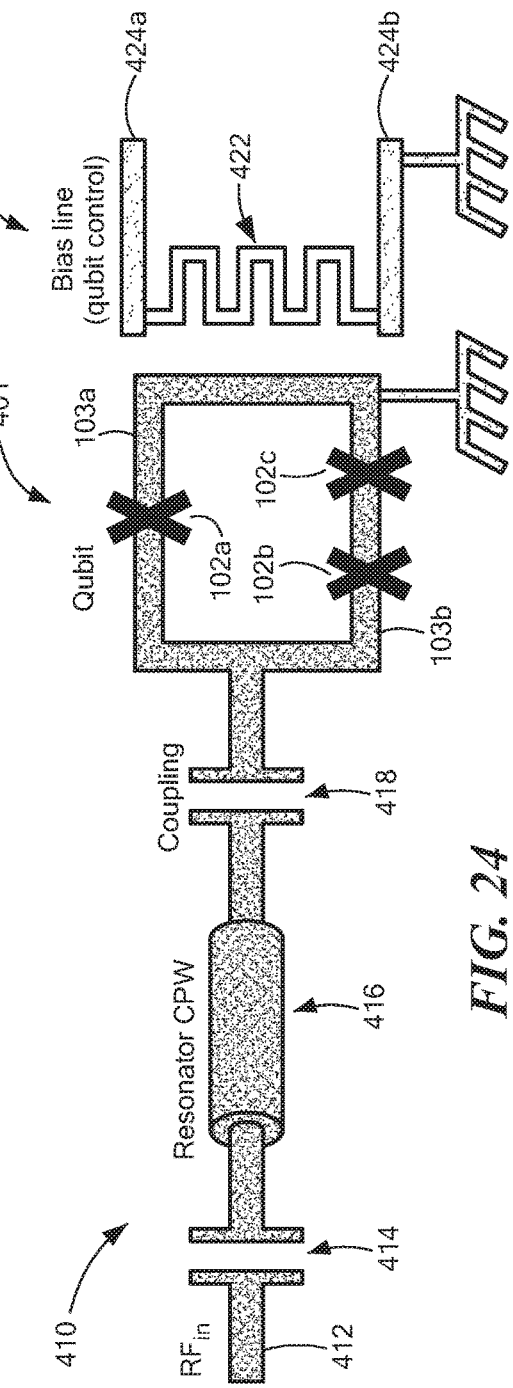
FIG. 24 is a plan view of a quantum bit system having a quantum bit bias control line.

Referring now to FIG. 24, in which like elements of FIGS. 1-23 are provided having like reference designations, a quantum bit system 410 includes an RF input signal path 412 coupled through a capacitor 414 to a CPW resonator 418. CPW resonator 418 is coupled through a second capacitor 418 to a qubit circuit 401 which is coupled to a reference potential, here illustrated as ground. A qubit bias control line 420 is inductively coupled to qubit circuit 401 through an inductor 422 serially coupled between bias control line signal path portions 424a, 424b with one end of signal path portion 422b being coupled to a reference potential, here illustrated as ground. FIG. 24 is an example of qubit circuit where a qubit 401 is capacitively coupled to a CPW resonator 416 and inductively coupled to a bias line 420.

Figure 25:
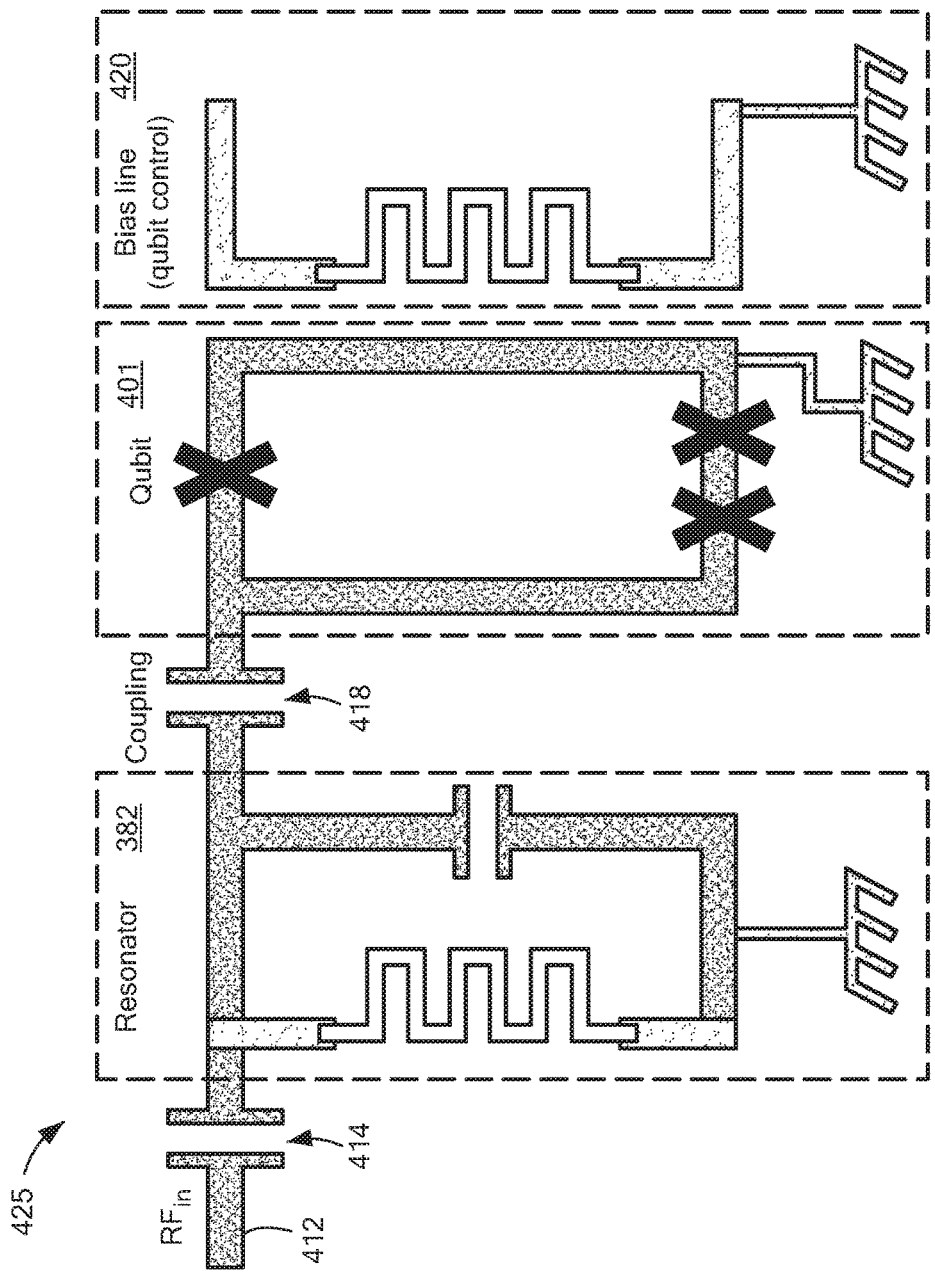
FIG. 25 is a plan view of another embodiment of a quantum bit system having a quantum bit bias control line.

Referring now to FIG. 25 in which like elements of FIGS. 1-24 are provided having like reference designations, another embodiment of a quantum bit system 425 includes an RF input signal path 412 coupled through capacitor 414 to a resonator 382. Resonator 382 is coupled through a second capacitor 418 to a qubit circuit 401. A qubit bias control line 420 is inductively coupled to qubit circuit 401 through an inductor 422 serially coupled between bias control line signal path portions 424a, 424b with one end of signal path portion 422b being coupled to a reference potential, here illustrated as ground.

In one embodiment, FIG. 25 is an alternate way of representing FIG. 24. FIG. 25 is an example of a qubit circuit where a qubit 401 is capacitively coupled to resonator 382 and inductively coupled to bias line 420. In one example, qubit 401 and/or resonator 382 can stay in one plane or chip (e.g., 214a in FIG. 10) and bias line 420 can stay in another plane or chip (MCM 212 in FIG. 10) can be inductively coupled to qubit 401. In another example, qubit 401 and bias line 420 can stay in one plane or chip (e.g., 214a in FIG. 10) and resonator 382 can stay in another plane or chip (MCM 212 in FIG. 10) can be capacitively coupled to qubit 401. In another example, qubit 401 may be provided as part of bias line 420 and resonator 382 can stay in one plane or chip (e.g., 130a in FIG. 8A) and rest of the bias line 420 can stay in another plane or chip (136 MCM in FIG. 8A) can be electrically coupled using superconducting and or nearly superconducting interconnect (e.g., 138-132a-140 in FIG. 8A) with each other to complete bias circuit during operation.

Figure 26:
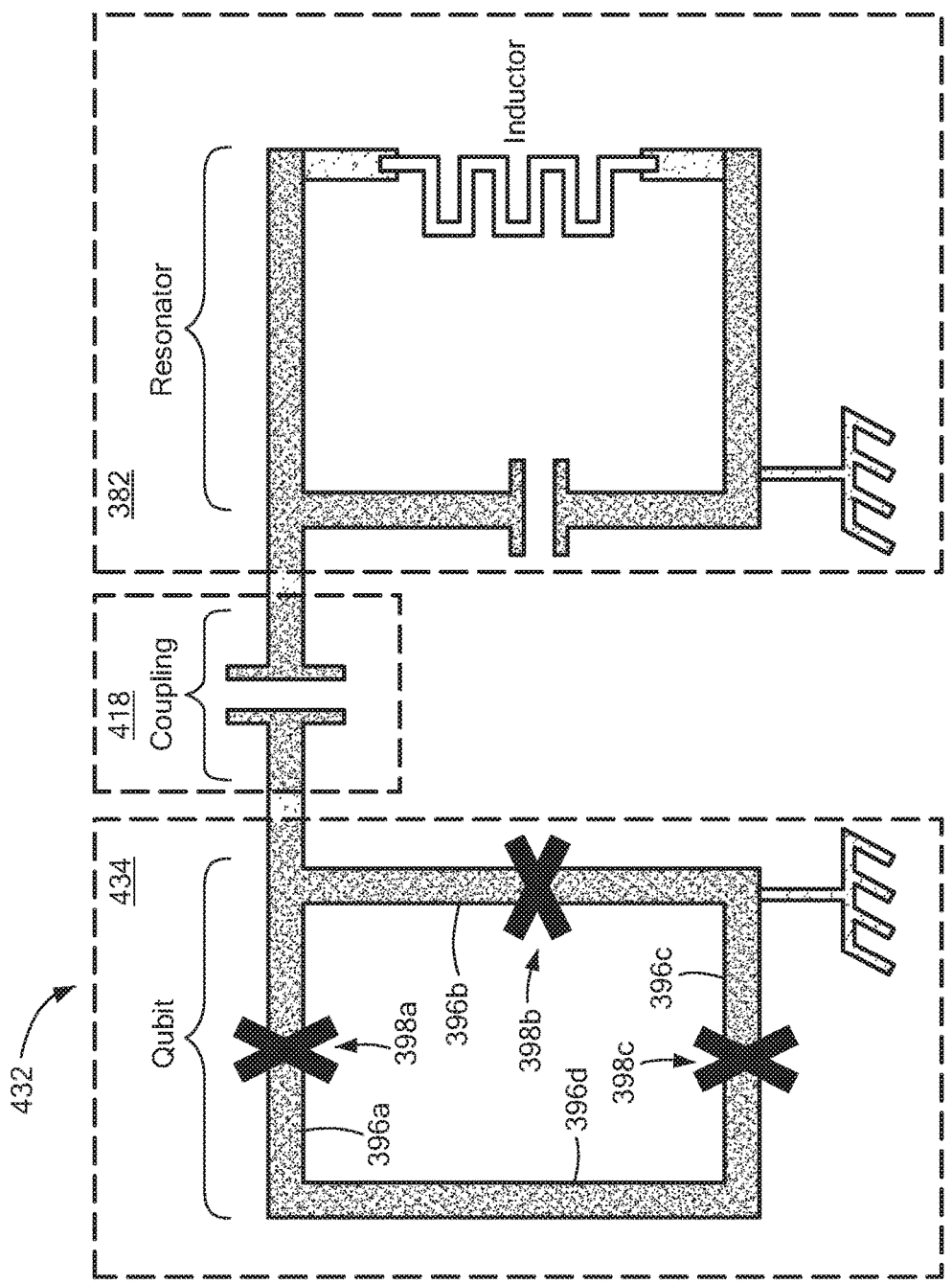
FIG. 26 is a plan view of a quantum bit coupled to a resonator via capacitive coupling.

Referring now to FIG. 26 in which like elements of FIGS. 1-25 are provided having like reference designations, a quantum bit circuit 432 is coupled through a capacitive coupling element (here illustrated as a coupler 418) to a resonator 382.

FIG. 26 is an example of a qubit circuit where a qubit 434 is capacitively coupled to a resonator 382. In one example, qubit 434 can stay in one plane or chip (e.g., 214a in FIG. 10) and resonator 382 can stay in another plane or chip (MCM 212 in FIG. 10) and be capacitively coupled to qubit 434. In another example, qubit 434 may be provided as part of resonator 382 and can stay in one plane or chip (e.g., 130a in FIG. 8A) and rest of the bias line 382 can stay in another plane or chip (136 MCM in FIG. 8A) and be electrically coupled using superconducting and or nearly superconducting interconnects (e.g., 138-132a-140 in FIG. 8A) with each other to complete resonator circuit during operation.

In another example, resonator 382 can be a superconducting co-planar waveguide (CPW) resonator as described in FIG. 1 where the resonator stays in one plane or chip (e.g., 130a in FIG. 8A) and the feedline can stay in another plane or chip (MCM 136 in FIG. 8A) and be capacitively coupled to resonator-to-feedline. In another example, resonator 382 can be a superconducting co-planar waveguide (CPW) resonator as described in FIG. 1 where part of the resonator stay in one plane or chip (e.g., 130a in FIG. 8A) and rest of the resonator can stay in another plane or chip (MCM 136 in FIG. 8A) and be electrically coupled using superconducting and or nearly superconducting interconnect (e.g., 138-132a-140 in FIG. 8A) with each other to complete resonator circuit during operation.

Figure 27:
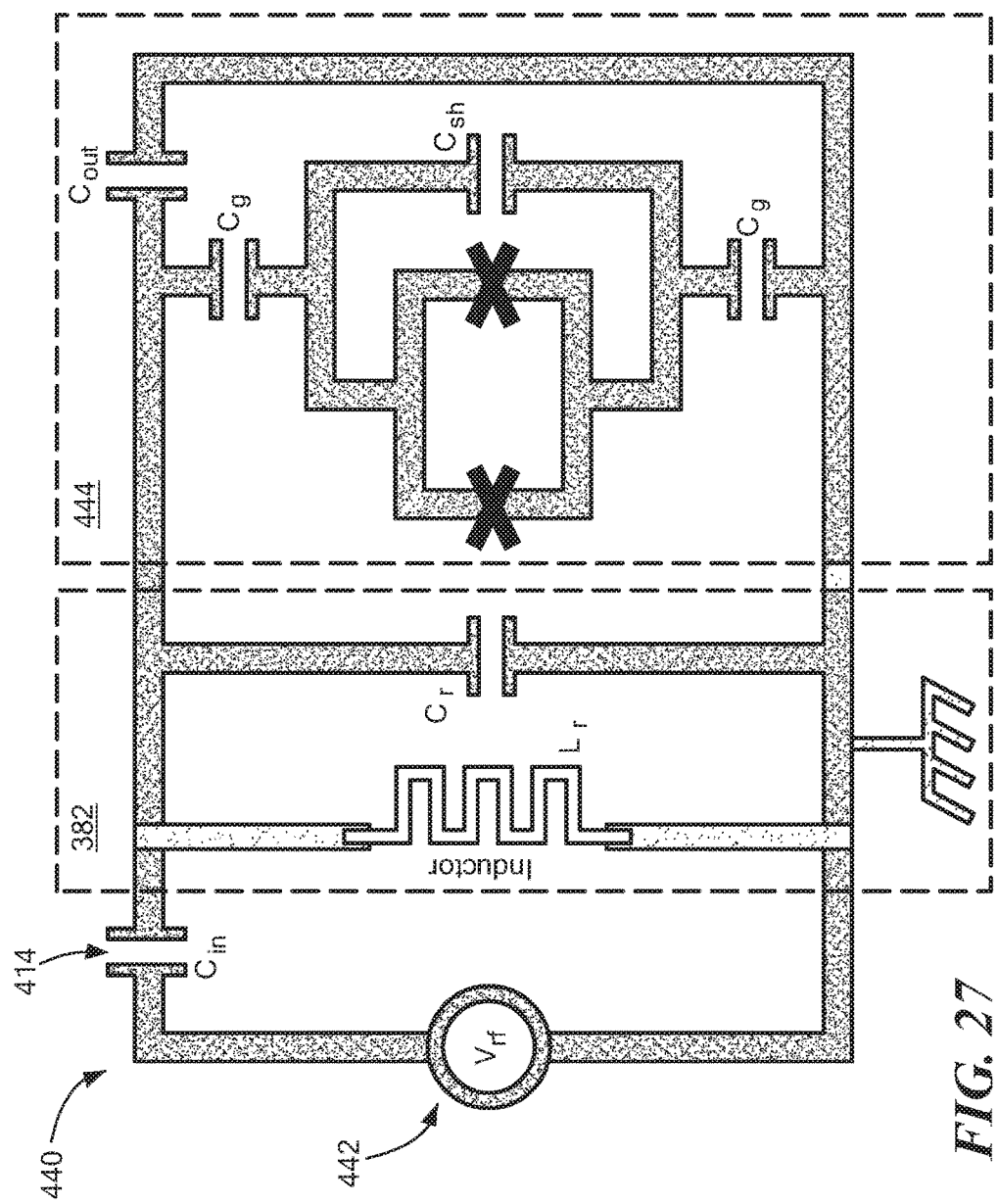
FIG. 27 is a plan view of a quantum bit system which uses capacitive coupling between an RF signal source and a resonator.

Referring now to FIG. 27 in which like elements of FIGS. 1-26 are provided having like reference designations, a quantum bit system 440 includes an RF signal source 442 coupled to a resonator 382 through an input capacitor 414. Resonator 382 is coupled qubit circuit 444. The qubit is shunted by a capacitor and capacitively coupled to the resonator. The two Josephson junctions with capacitance and Josephson energy CJ and EJ are shunted by an additional large capacitance $C_{sh}$, matched by a comparably large gate capacitance Cg. The qubit and/or resonator can stay in the qubit chip (e.g., 130a in FIG. 8A) and the control circuits (e.g., DC bias line, RF bias lines) can be placed in another chip such as interposer or MCM (MCM 136 in FIG. 8A) and create more space to qubit chip to increase qubit density.

Figure 28:
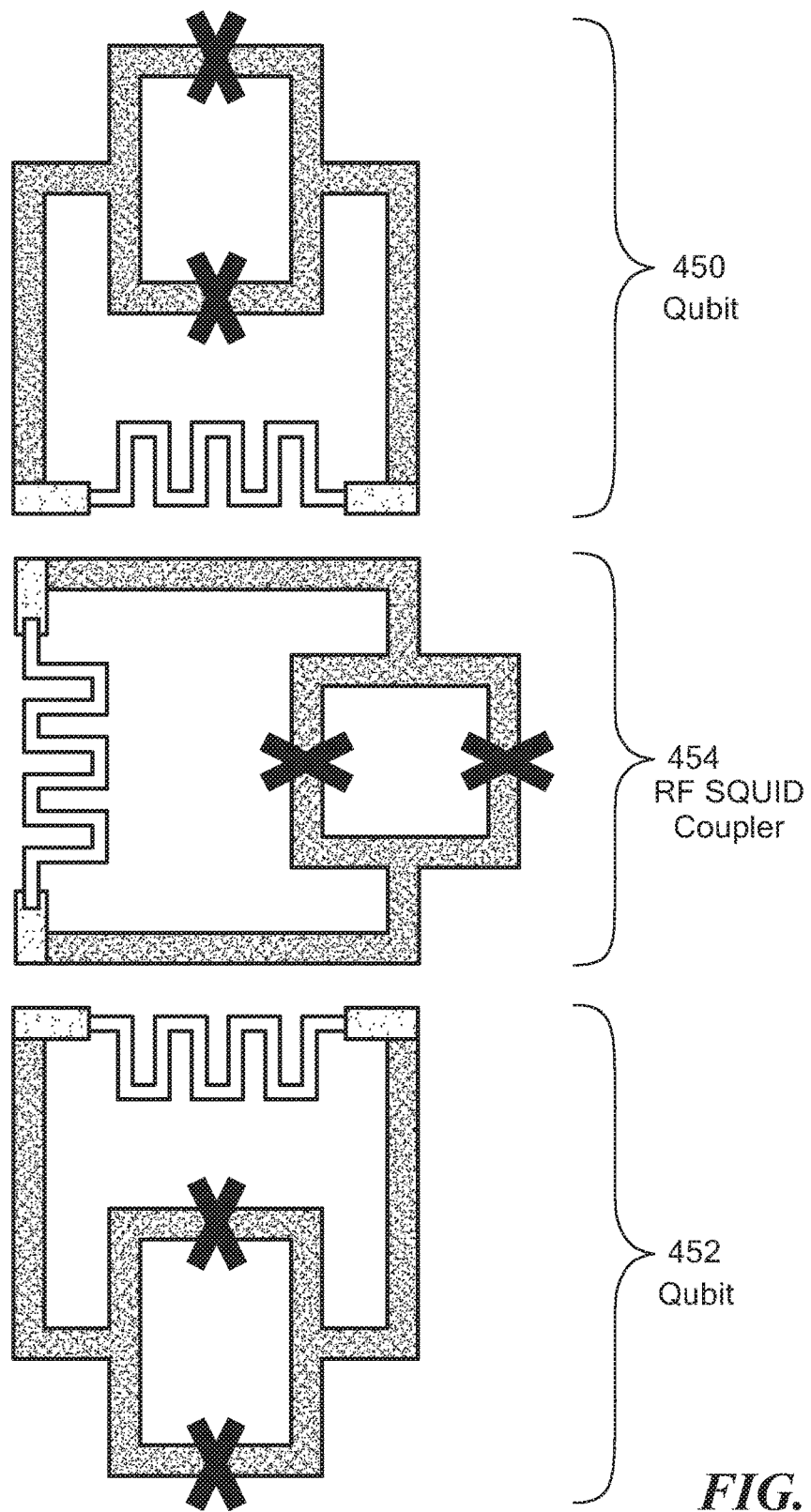
FIG. 28 is a plan view of a pair of quantum bit circuits coupled through a radio frequency (RF) superconducting quantum interference device (SQUID) coupler.

Referring now to FIG. 28, in which like elements of FIGS. 1-27 are provided having like reference designations, a pair of quantum bit circuits 450, 454 are coupled through an RF superconducting quantum interference device (SQUID) coupler.

The Z-loop of qubit circuit 450 and the Z-loop qubit circuit 452 are each coupled inductively to the RF SQUID coupler 454. The RF SQUID coupler mediates a flux-tunable Z-Z interaction between the two qubits. In one example, qubit 450 can be a part of one chip (e.g., qubit 268a of chip 256a of FIG. 13), qubit 452 can be a part of second chip (e.g., qubit 268b of chip 256b of FIG. 13), RF coupler 454 can be part of third chip (e.g., qubit 270 of chip 241 of FIG. 13) and Qubit 450 can be coupled to qubit 452 using RF coupler 454.

Figure 29:
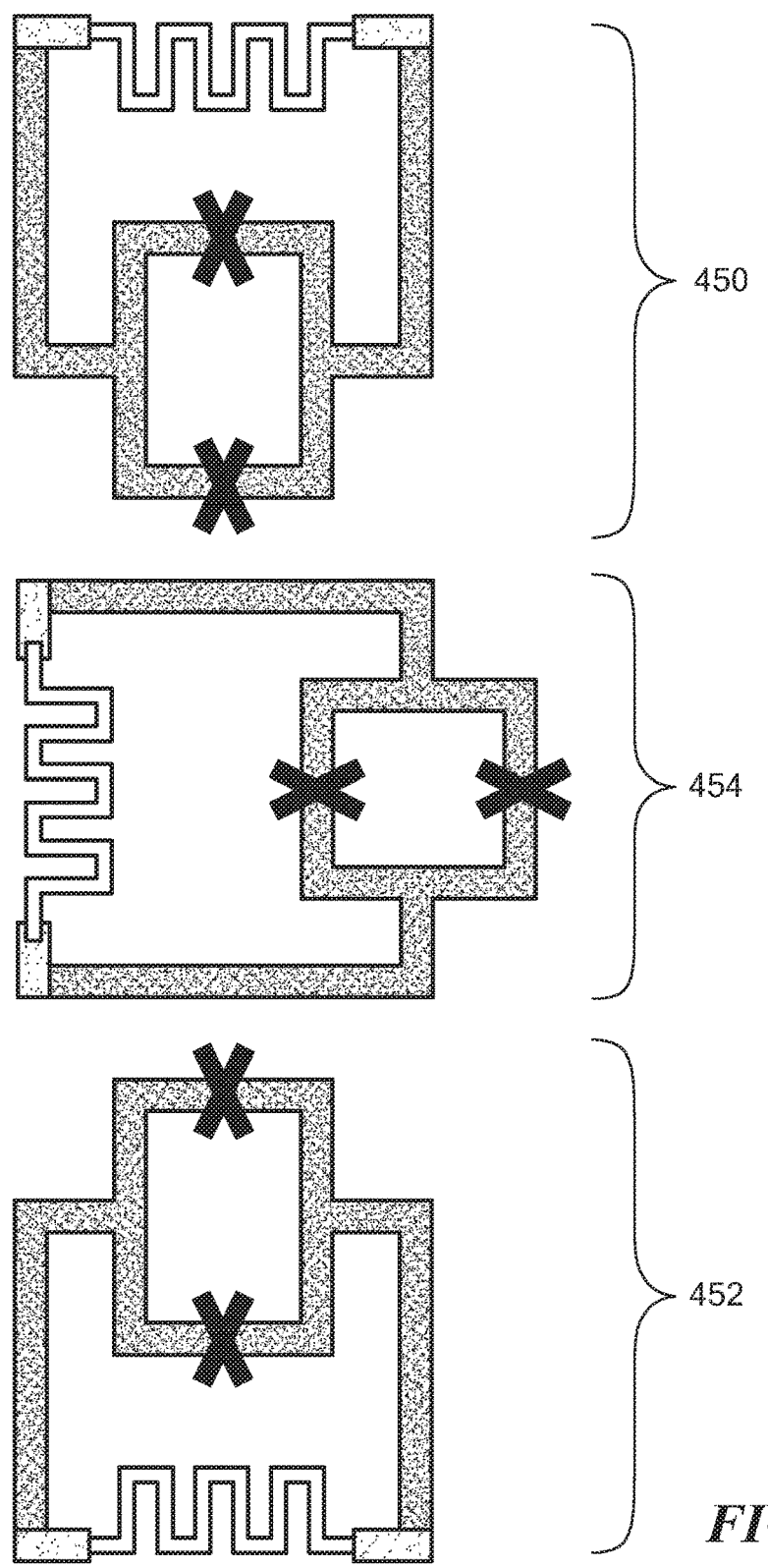
FIG. 29 is a plan view of an alternate embodiment of a pair of quantum bit circuits coupled through an RF SQUID coupler.

Referring now to FIG. 29 in which like elements of FIGS. 1-26 are provided having like reference designations, an alternate embodiment of a pair of quantum bit circuits 450, 452 coupled through an RF SQUID coupler is shown. The X-loop of qubit circuit 450 and the X-loop of qubit circuit 452 are each coupled inductively to the RF SQUID coupler 454. The RF SQUID coupler mediates a flux-tunable X-X interaction between the two qubits.

Figure 30:
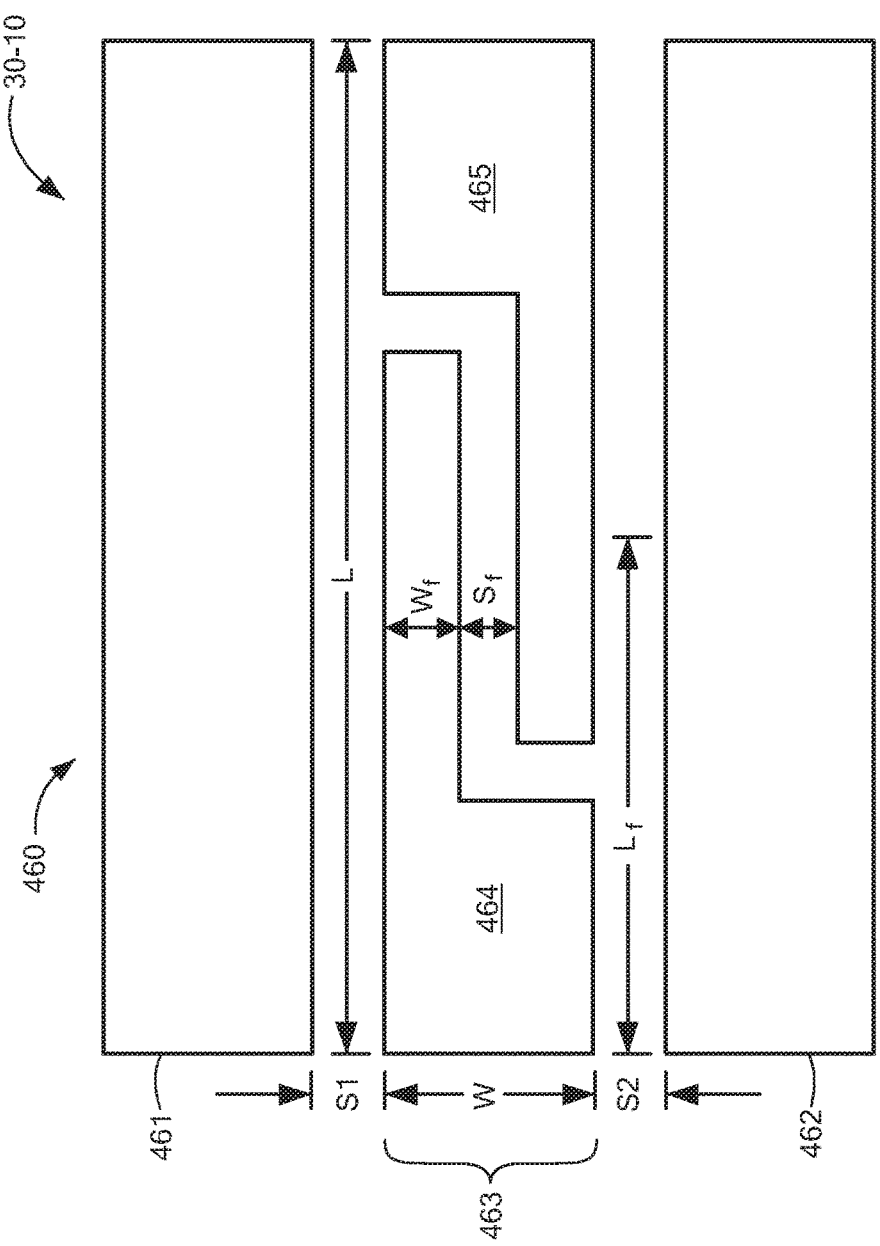
FIG. 30 is a plan view of an alternate embodiment of a superconducting coplanar waveguide (CPW) resonator.

Referring now to FIG. 30 in which like elements of FIGS. 1-6 are provided having like reference designations, a superconducting coplanar waveguide (CPW) 460 (e.g., a capacitively coupled CPW resonator) includes a first portion 461 corresponding to a first ground plane and a second portion 462 corresponding to a second ground plane. CPW resonator 460 also includes a conductor 463 (here, a substantially center conductor) having an associated width W and a length L. Conductor 463 is spaced apart (or separated) from the first ground plane 461 (e.g., a first lateral ground plane) by a gap having a width 51. Additionally, conductor 463 is spaced apart from the second ground plane 462 (e.g., a second lateral ground plane) by a gap having a width S2. S2 is the same as or similar as S1 in some embodiments. In other embodiments, S2 may be substantially different from S1. The conductor 463 may be provided from a high Q metal such as titanium nitride (TiN) and may form a resonator-to-feed-line portion of the CPW resonator 460.

In one embodiment, length L of conductor 463 is selected to achieve a predetermined frequency (e.g., a fundamental frequency). The predetermined frequency may, for example, be in the gigahertz (GHz) range, ranging from about one GHz to about ten GHz in some embodiments.

Conductor 463 comprises and/or is coupled to input and output transmission lines via so-called "finger capacitors" 464, 465 in the illustrated embodiment. To achieve lager or increased coupling (e.g., increased capacitive coupling) in CPW resonator 460, for example, finger capacitors 464, 465 formed from single or multiple pairs of fingers with appropriate length $L_f$, width $w_f$, and separation $S_f$ may be used. It is further possible that the conductor 463 comprises and/or is coupled to the input and output transmission lines via gap capacitors, as will be described further in connection with FIG. 31, for example.

Figure 31:
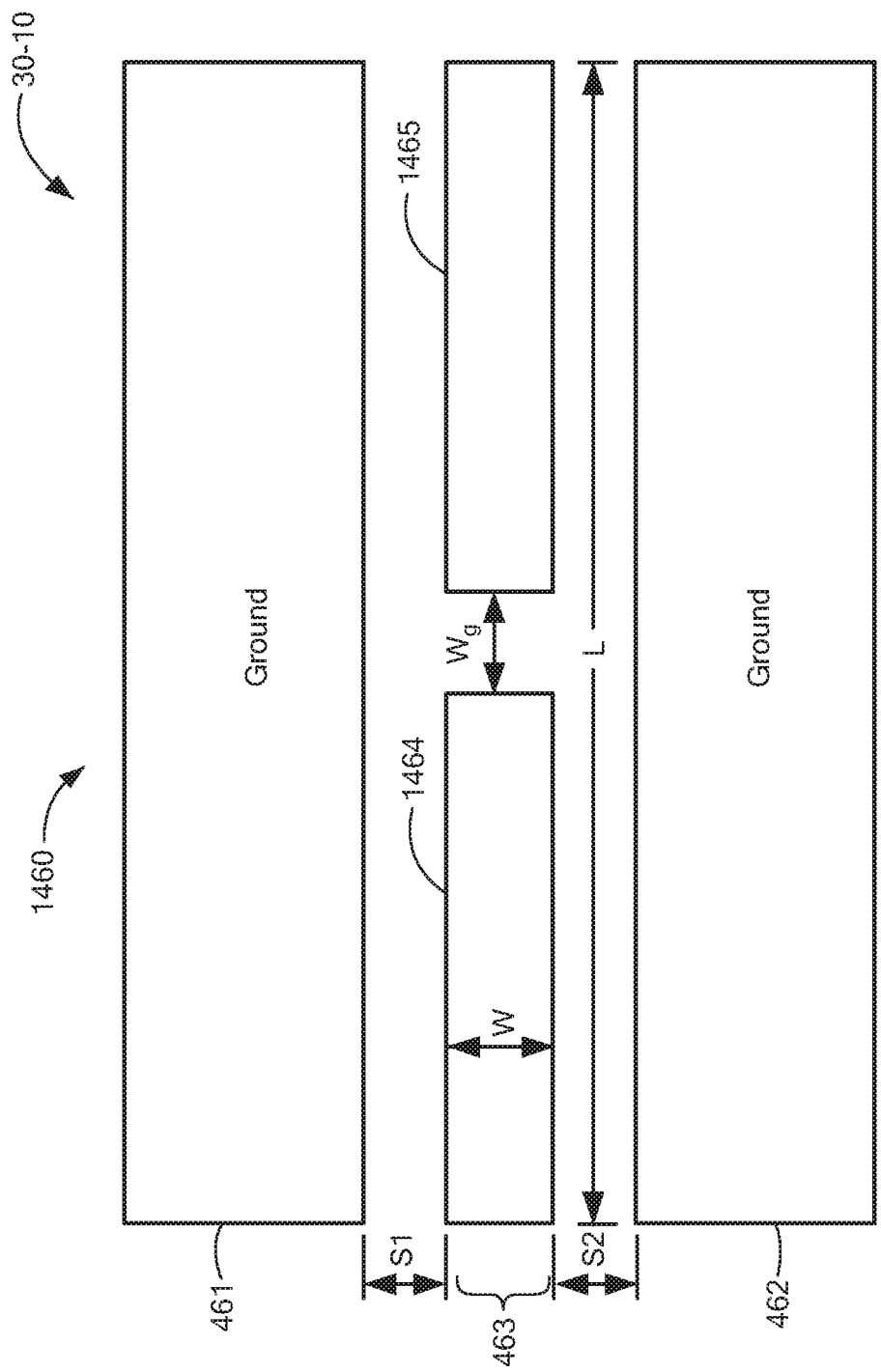
FIG. 31 is a plan view of an alternate embodiment of a superconducting CPW resonator.

Referring now to FIG. 31 in which like elements of FIGS. 1-6 and 30 are provided having like reference designations, an alternate embodiment of a superconducting coplanar waveguide (CPW) resonator 1460 (e.g., a capacitively coupled CPW resonator) includes a first portion 461 corresponding to a first ground plane and a second portion 462 corresponding to a second ground plane.

CPW resonator 1460 also includes a conductor 1463 (here, a substantially center conductor) having an associated width W and a length L. Conductor 1463 is spaced apart (or separated) from the first ground plane 461 (e.g., a first lateral ground plane) by a gap having a width S1. Additionally, conductor 1463 is spaced apart from the second ground plane 462 (e.g., a second lateral ground plane) by a gap having a width S2. S2 is the same as or similar as S1 in some embodiments. In other embodiments, S2 may be substantially different from S1. The conductor 1463 may be provided from a high Q metal such as titanium nitride (TiN) and may form a resonator-to-feed-line portion of the CPW resonator 1460.

Similar to conductor 463 shown in FIG. 30, length L of conductor 1463 may be selected to achieve a predetermined frequency (e.g., a fundamental frequency). The predetermined frequency may, for example, be in the gigahertz (GHz) range, ranging from about one GHz to about ten GHz in some embodiments.

Conductor 1463 comprises and/or is coupled to input and output transmission lines via so-called "gap capacitors" 1464, 1465 in the illustrated embodiment. To achieve smaller or reduced coupling (e.g., reduced capacitive coupling) in CPW resonator 1460, for example, gap capacitors 1464, 1465 having an appropriate width Wg or spacing there between may be used.

It should, of course, be appreciated that the CPW resonators described in connection with FIGS. 30 and 31 are merely two example CPW resonators and that other resonator structures may be used.

It should be appreciated that in some embodiments, conductive via 154 provided in SMCM 152 may be provided as a superconducting and/or nearly superconducting via which may be the same as or similar to via 166. Thus, both intermediate substrate 162 and SMCM 152 may be provided having one or a plurality of vias containing a superconducting layer (e.g. a low stress titanium nitride (TiN) superconducting layer). Alternatively, the intermediate and SMCM vias may be provided having non-superconducting layers.

As described above and will be appreciated by one of skill in the art, embodiments of the disclosure herein may be configured as a system, method, or combination thereof. Accordingly, embodiments of the present disclosure may be comprised of various means including hardware, software, firmware or any combination thereof. Furthermore, embodiments of the present disclosure may take the form of a computer program product on a computer-readable storage medium having computer readable program instructions (e.g., computer software) embodied in the storage medium. Any suitable non-transitory computer-readable storage medium may be utilized.

It is to be appreciated that the concepts, systems, circuits and techniques sought to be protected herein are not limited to use in a particular application. In contrast, the concepts, systems, circuits and techniques sought to be protected herein may be found useful in substantially any application where a semiconductor manufacturer desires to fabricate superconducting circuits.

Having described preferred embodiments, which serve to illustrate various concepts, structures and techniques, which are the subject of this patent, it will now become apparent to those of ordinary skill in the art that other embodiments incorporating these concepts, structures and techniques may be used. Additionally, elements of different embodiments described herein may be combined to form other embodiments not specifically set forth above.

A circuit quantum electrodynamics (circuit QED) may be used to address and measure a superconducting qubit. Circuit QED and superconducting qubits may be coupled to the electric field in a planar transmission line resonator. For a cavity QED, an atom in the cavity interacts with the trapped photons, and a measurement of the photons leaking out of the cavity allows one to probe the state of the atom.

In Circuit QED, the cavity is replaced by a $\lambda/2$ transmission line resonator that interacts with the outside world via two capacitors, Cin and Cout. A superconducting qubit sits at a voltage anti-node in the resonator, where the capacitance between the qubit and the resonator sets the interaction strength. Measurements may determine a maximum number of photons leaking out of the resonator (RFout) when the impinging signal (RFin) is on resonance with the resonator-qubit system.

For example, superconducting quantum interference device (SQUID) may be provided from a superconducting loop interrupted by two Josephson junctions. The net critical current of the SQUID can be tuned by threading a magnetic flux through the loop. SQUID is a tunable Josephson junction, and this feature is used to make "tunable" superconducting qubits, i.e., qubits with a parameter related to the junction Ic that is tunable by the magnetic field that threads the SQUID loop.

Accordingly, it is submitted that that scope of the patent should not be limited to the described embodiments but rather should be limited only by the spirit and scope of the following claims.

What is claimed is:

1. A cryogenic quantum bit package comprising:
   (a) one or more quantum bit (qubit) integrated circuits, each of said one or more qubit integrated circuits comprising at least two qubit circuits;
   (b) a quantum bit bias control line;
   (c) a coupler circuit disposed to couple signals between said at least two qubit circuits;
   (d) a superconducting multi-chip module (MCM); and
   (e) one or more superconducting and/or nearly superconducting interconnects, each of said one or more superconducting interconnects disposed between and electrically coupled to said one or more quantum bit integrated circuits and said superconducting MCM such that a signal path is provided between said one or more qubit integrated circuits and said MCM.

2. The cryogenic quantum bit package of claim 1 wherein said coupler circuit comprises at least one of:
   a Josephson junction;
   a capacitive coupling circuit;
   an inductive coupling circuit;
   a resonator;
   a qubit loop; and
   a coupler loop.

3. The cryogenic quantum bit package of claim 1 wherein at least a portion of said at least two qubit circuits is disposed in said superconducting multi-chip module.

4. The cryogenic quantum bit package of claim 1 wherein at least a portion of said coupler circuit is disposed in said superconducting multi-chip module.

5. The cryogenic quantum bit package of claim 1 wherein at least a portion of said at least two qubit circuit and at least a portion of said coupler circuit are disposed in said superconducting multi-chip module.

6. The cryogenic quantum bit package of claim 1 wherein at least a portion of said quantum bit bias control line is disposed in said qubit integrated circuit.

7. The cryogenic quantum bit package of claim 1 wherein at least a portion of said quantum bit bias control line is disposed in said superconducting multi-chip module.

8. The cryogenic quantum bit package of claim 1 wherein at least one of said qubit integrated circuits and said superconducting MCM further comprises a bias control system configured to apply a local effective bias to a corresponding quantum device.

9. The cryogenic quantum bit package of claim 1 wherein said coupler circuit is disposed so as to provide coupling to a nearest-neighbor qubit circuit.

10. The cryogenic quantum bit package of claim 1 further comprising a plurality of couplers, each of said plurality of couplers disposed to couple to next nearest-neighbor qubit circuits.

11. The cryogenic quantum bit package of claim 10 wherein each of said qubit integrated circuits further comprises a coupling control system configured to tune the coupling value of a corresponding coupling device in the plurality of coupling devices to a desired coupling value.

12. A cryogenic quantum bit package comprising:
a first quantum bit (qubit) integrated circuit;
a second quantum bit integrated circuit;
a superconducting multi-chip-module (MCM);
an interposer disposed between said first and second quantum bit integrated circuits and said superconducting MCM, said interposer comprising a TSV substrate and disposed to electrically interconnect said first and second quantum bit integrated circuits to said superconducting MCM.

13. The cryogenic quantum bit package of claim 12 wherein said TSV interposer substrate having an opening provided therein and wherein the cryogenic quantum bit package further comprises at least one electrical component disposed in the opening of said TSV interposer substrate with said at least one electrical component electrically and mechanically coupled to said MCM.

14. The cryogenic quantum bit package of claim 12 wherein said MCM comprises one of: a CMOS chip, a qubit chip, or an SFQ chip.

15. The cryogenic quantum bit package of claim 14 further comprising a third qubit chip disposed on an upper surface of said TSV substrate with the first and second qubit chips disposed in a first plane and said third qubit chip disposed in a second different plane and wherein said third qubit chip is disposed to couple signals between at least one of the first and second qubit integrated circuits disposed in the first plane.

16. The cryogenic quantum bit package of claim 15 wherein said first, second and third qubit chips are disposed to inductively couple signals therebetween.

17. The cryogenic quantum bit package of claim 16 wherein at least one of said qubit chips comprises a quantum bit circuit comprising:
a substrate having first and second opposing surfaces;
a conductive layer having first and second opposing surfaces, wherein the first surface of the conductive layer is disposed over the second surface of the substrate, and the conductive layer includes at least one conductive material, the at least one conductive material including a substantially low stress polycrystalline titanium nitride (TiN) material having an internal stress below about two hundred fifty megapascal (MPa).

18. The cryogenic quantum bit package of claim 17 wherein the TiN material is a (200)-oriented polycrystalline.

19. The cryogenic quantum bit package of claim 18 wherein the TiN material is provided as a (200) oriented single crystal material having a 4-fold symmetry and in-plane rotational alignment.

20. The cryogenic quantum bit package of claim 17 wherein the substrate is provided from at least one of: silicon; deposited silicon; silicon having at least one surface with a resistivity of at least 3 kilo ohm-cm; oxide coated silicon; oxide etched silicon; oxide etched annealed silicon; glass; aluminum oxide; sapphire; germanium; gallium arsenide; an alloy of silicon and germanium; and indium phosphide.

21. The cryogenic quantum bit package of claim 20 wherein:
the substrate is at least one of a superconducting substrate or a partially superconducting substrate; and
the conductive layer comprises a superconducting bump and/or a partially superconducting bump disposed to electrically couple at least two qubit chips.

* * * * *